US008495122B2

(12) United States Patent
Simkins et al.

(10) Patent No.: US 8,495,122 B2
(45) Date of Patent: *Jul. 23, 2013

(54) PROGRAMMABLE DEVICE WITH DYNAMIC DSP ARCHITECTURE

(75) Inventors: James M. Simkins, Park City, UT (US); Steven P. Young, Boulder, CO (US); Jennifer Wong, Fremont, CA (US); Bernard J. New, Carmel Valley, CA (US); Alvin Y. Ching, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 1509 days.

This patent is subject to a terminal disclaimer.

(21) Appl. No.: 11/019,735

(22) Filed: Dec. 21, 2004

(65) Prior Publication Data

US 2005/0144210 A1 Jun. 30, 2005

Related U.S. Application Data

(60) Provisional application No. 60/533,181, filed on Dec. 29, 2003.

(51) Int. Cl.
*G06F 7/38* (2006.01)
(52) U.S. Cl.
USPC .......................................... 708/523; 708/230
(58) Field of Classification Search
USPC ................................ 708/130, 232; 326/39, 41
See application file for complete search history.

(56) References Cited

U.S. PATENT DOCUMENTS

| 4,639,888 | A | 1/1987 | Nussbaecher |
|---|---|---|---|
| 4,680,628 | A | 7/1987 | Wojcik et al. |
| 4,780,842 | A | 10/1988 | Morton et al. |
| 5,095,523 | A | 3/1992 | Delaruelle et al. |
| 5,165,034 | A | 11/1992 | Kanuma |
| 5,241,492 | A | 8/1993 | Girardeau, Jr. |
| 5,258,939 | A | 11/1993 | Johnstone et al. |
| 5,317,530 | A | 5/1994 | Toriumi |
| 5,339,264 | A | 8/1994 | Said et al. |
| 5,349,250 | A | 9/1994 | New |
| 5,388,062 | A | 2/1995 | Knutson |

(Continued)

FOREIGN PATENT DOCUMENTS

| GB | 2 365 636 A | 2/2002 |
|---|---|---|
| GB | 2 373 883 A | 10/2002 |

(Continued)

OTHER PUBLICATIONS

Leitung: Prof. Dr. Miroslaw Malek; Humbolt-Universitat Zu Berlin, Institut for Informatik; Lecture 12; "ALU (3)—Division Algorithms"; Sommersemester 2002; available from www.informatik.hu-berlin.ed/tok/ca; pp. 1-15.

(Continued)

*Primary Examiner* — Chuong D Ngo
(74) *Attorney, Agent, or Firm* — Arthur J. Behiel; Robert M. Brush; John J. King

(57) ABSTRACT

Described is a programmable logic device (PLD) with columns of DSP slices that can be cascaded to create DSP circuits of varying size and complexity. Each slice includes a mode port that receives mode control signals for dynamically altering the function and connectivity of related slices. Such alterations can occur with or without reconfiguring the PLD.

16 Claims, 58 Drawing Sheets

U.S. PATENT DOCUMENTS

| | | | |
|---|---|---|---|
| 5,450,339 A | 9/1995 | Chester et al. |
| 5,455,525 A | 10/1995 | Ho et al. |
| 5,506,799 A | 4/1996 | Nakao |
| 5,572,207 A | 11/1996 | Harding et al. |
| 5,581,357 A | 12/1996 | Sasaki et al. |
| 5,600,265 A | 2/1997 | El Gamal et al. |
| 5,642,382 A | 6/1997 | Juan |
| 5,724,276 A | 3/1998 | Rose et al. |
| 5,732,004 A | 3/1998 | Brown |
| 5,754,459 A | 5/1998 | Telikepalli |
| 5,809,292 A | 9/1998 | Wilkinson et al. |
| 5,828,229 A | 10/1998 | Ahanin et al. |
| 5,838,165 A | 11/1998 | Chatter |
| 5,883,525 A | 3/1999 | Tavana et al. |
| 5,914,616 A | 6/1999 | Young et al. |
| 5,933,023 A | 8/1999 | Young |
| 6,000,835 A | 12/1999 | Pan et al. |
| 6,014,684 A | 1/2000 | Hoffman |
| 6,065,034 A | 5/2000 | Mahurin |
| 6,069,490 A | 5/2000 | Ochotta et al. |
| 6,100,715 A | 8/2000 | Agrawal et al. |
| 6,108,343 A | 8/2000 | Cruickshank et al. |
| 6,131,105 A | 10/2000 | Pajarre et al. |
| 6,134,574 A | 10/2000 | Oberman et al. |
| 6,154,049 A | 11/2000 | New |
| 6,204,689 B1 | 3/2001 | Percey et al. |
| 6,223,198 B1 | 4/2001 | Oberman et al. |
| 6,243,808 B1 | 6/2001 | Wang |
| 6,249,144 B1 | 6/2001 | Agrawal et al. |
| 6,260,053 B1 | 7/2001 | Maulik et al. |
| 6,269,384 B1 | 7/2001 | Oberman |
| 6,282,627 B1 | 8/2001 | Wong et al. |
| 6,282,631 B1 | 8/2001 | Arbel |
| 6,288,566 B1 | 9/2001 | Hanrahan et al. |
| 6,298,366 B1 | 10/2001 | Gatherer et al. |
| 6,298,472 B1 | 10/2001 | Phillips et al. |
| 6,311,200 B1 | 10/2001 | Hanrahan et al. |
| 6,323,680 B1 | 11/2001 | Pedersen et al. |
| 6,341,318 B1 | 1/2002 | Dakhil |
| 6,347,346 B1 | 2/2002 | Taylor |
| 6,349,346 B1 | 2/2002 | Hanrahan et al. |
| 6,362,650 B1 | 3/2002 | New et al. |
| 6,366,943 B1 | 4/2002 | Clinton |
| 6,370,596 B1 | 4/2002 | Dakhil |
| 6,374,312 B1 | 4/2002 | Pearce et al. |
| 6,385,751 B1 | 5/2002 | Wolf |
| 6,389,579 B1 | 5/2002 | Phillips et al. |
| 6,392,912 B1 | 5/2002 | Hanrahan et al. |
| 6,397,238 B2 | 5/2002 | Oberman et al. |
| 6,434,584 B1 * | 8/2002 | Henderson et al. ............ 708/490 |
| 6,438,570 B1 | 8/2002 | Miller |
| 6,448,808 B2 | 9/2002 | Young et al. |
| 6,449,708 B2 | 9/2002 | Dewhurst et al. |
| 6,457,116 B1 | 9/2002 | Mirsky et al. |
| 6,483,343 B1 | 11/2002 | Faith et al. |
| 6,496,918 B1 | 12/2002 | DeHon et al. |
| 6,519,674 B1 | 2/2003 | Lam et al. |
| 6,526,430 B1 | 2/2003 | Hung et al. |
| 6,526,557 B1 | 2/2003 | Young et al. |
| 6,530,010 B1 | 3/2003 | Hung et al. |
| 6,538,470 B1 | 3/2003 | Langhammer et al. |
| 6,539,477 B1 | 3/2003 | Seawright |
| 6,556,044 B2 | 4/2003 | Langhammer et al. |
| 6,573,749 B2 | 6/2003 | New et al. |
| 6,693,455 B2 | 2/2004 | Langhammer et al. |
| 6,728,744 B2 | 4/2004 | Amer |
| 6,731,706 B1 | 5/2004 | Acharya et al. |
| 6,820,102 B2 | 11/2004 | Aldrich et al. |
| 6,864,714 B2 | 3/2005 | Digari et al. |
| 6,873,182 B2 | 3/2005 | Mohan et al. |
| 6,904,446 B2 | 6/2005 | Dibrino |
| 6,920,627 B2 | 7/2005 | Blodget et al. |
| 6,925,480 B2 | 8/2005 | Duborgel |
| 6,947,916 B2 | 9/2005 | Luo et al. |
| 7,129,762 B1 | 10/2006 | Vadi |
| 7,142,010 B2 | 11/2006 | Langhammer et al. |
| 7,174,432 B2 | 2/2007 | Howard et al. |
| 7,178,130 B2 | 2/2007 | Chuang et al. |
| 7,193,433 B1 | 3/2007 | Young |
| 7,194,598 B2 | 3/2007 | Jacob |
| 7,197,686 B2 | 3/2007 | Box et al. |
| 7,472,155 B2 | 12/2008 | Simkins et al. |
| 2001/0004741 A1 * | 6/2001 | Sogo ............................ 708/490 |
| 2002/0138538 A1 | 9/2002 | Talwar et al. |
| 2002/0138716 A1 | 9/2002 | Master et al. |
| 2003/0041082 A1 | 2/2003 | Dibrino |
| 2003/0055861 A1 | 3/2003 | Lai et al. |
| 2003/0105949 A1 | 6/2003 | Master et al. |
| 2003/0140071 A1 | 7/2003 | Zaboronski et al. |
| 2003/0154357 A1 | 8/2003 | Master et al. |
| 2004/0010645 A1 | 1/2004 | Scheuermann |
| 2004/0030736 A1 | 2/2004 | Scheuermann |
| 2004/0078403 A1 | 4/2004 | Scheuermann et al. |
| 2004/0093465 A1 | 5/2004 | Ramchandran |
| 2004/0093479 A1 | 5/2004 | Ramchandran |
| 2004/0143724 A1 | 7/2004 | Jacob et al. |
| 2004/0168044 A1 | 8/2004 | Ramchandran |
| 2004/0181614 A1 | 9/2004 | Furtek et al. |
| 2005/0038984 A1 | 2/2005 | Heidari-Bateni et al. |
| 2005/0039185 A1 | 2/2005 | Heidari-Bateni et al. |
| 2005/0144210 A1 | 6/2005 | Simkins et al. |
| 2005/0144211 A1 | 6/2005 | Simkins et al. |
| 2005/0144212 A1 | 6/2005 | Simkins et al. |
| 2005/0144213 A1 | 6/2005 | Simkins et al. |
| 2005/0144216 A1 | 6/2005 | Simkins et al. |
| 2005/0187998 A1 | 8/2005 | Zheng et al. |
| 2006/0015701 A1 | 1/2006 | Hogenauer |
| 2006/0190516 A1 | 8/2006 | Simkins et al. |
| 2006/0190518 A1 | 8/2006 | Ekner et al. |
| 2006/0195496 A1 | 8/2006 | Vadi et al. |
| 2006/0206557 A1 | 9/2006 | Wong et al. |
| 2006/0212499 A1 | 9/2006 | New et al. |
| 2006/0230092 A1 | 10/2006 | Ching et al. |
| 2006/0230093 A1 | 10/2006 | New et al. |
| 2006/0230094 A1 | 10/2006 | Simkins et al. |
| 2006/0230095 A1 | 10/2006 | Simkins et al. |
| 2006/0230096 A1 | 10/2006 | Thendean et al. |
| 2006/0288069 A1 | 12/2006 | Simkins et al. |
| 2006/0288070 A1 | 12/2006 | Vadi et al. |
| 2009/0019416 A1 | 1/2009 | Chugh et al. |

FOREIGN PATENT DOCUMENTS

| | | |
|---|---|---|
| GB | 2 383 435 A | 6/2003 |
| WO | WO 01/89091 A3 | 11/2001 |
| WO | WO 2005/066832 A3 | 7/2005 |
| WO | WO 2005/010049 | 11/2005 |
| WO | WO 2005/110049 A1 | 11/2005 |

OTHER PUBLICATIONS

Jennifer Eyre et al..; "The Evolution of DSP Processors"; a BDTi Whtie Paper; Copyright 2000 Berkeley Design Technology, Inc.; pp. 1-9.

Rafael Fried; "Algorithms for Power Consumption Reduction and Speed Enhancement in High-Performance Parallel Multipliers"; PATMOS-97; Seventh International Workshop Program; downloaded from http://www.dice.uci.ac.be/'anmarie/patmos/papers/S2/2_1.html on Nov. 10, 2003; pp. 1-11.

Drew Wilson; "Chameleon Takes on FPGAs, ASICs"; Electronic News; Oct. 29, 2004; downloaded from http://www.reed-electronics.com/electronicnews/article/CA50551?pubdate=10%2F16%2 . . . on Oct. 29, 2004; pp. 1-6.

Jim Simkins et al.; "A Reconfigurable VME Spread-Spectrum LPI Low Probability of Intercept) Datalink Receiver/Transmitter Implemented via Reconfigurable DSP Hardware" ; IEEE Transactions on Acoustics, Speech, and Signal Processing, vol. ASSP-29, No. 2; Apr. 1981; pp. 1-14.

Stephen J. Bradshaw; "Building a Better DSP Mousetrap: FPGAs, DSP Processors, or a combination of both?"; Copyright 2001 Traquair Data Systems, Inc.; rev. 1.1; Nov. 1, 2001; available from www.traquair.com.; pp. 1-6.

David, Raphael et al., "DART: A Dynamically Reconfigurable Architecture Dealing with Future Mobile Telecommunications Constraints"; Parallel and Distributed Processing Symposium; Proceedings International, IPDPS 2002; Copyright 2002 IEEE; Apr. 15-19, 2002; pp. 156-163.

Mirsky, E., Dehon, A., "MATRIX: A Reconfigurable Computing Device with Configurable Instruction Distribution (Extended Abstract)", In Proc. IEEE Workshop on FPGAs for Custom Computing Machines, 1996, pp. 1-3.

Mirsky, E., Dehon, A.,"Matrix: A Reconfigurable Computing Architecture with Configurable Instruction Distribution and Deployable Resources", In Proc. IEEE Workshop on FPGAs for Custom Computing Machines, Apr. 17-19, 1996, pp. 1-10.

Palacharla, S., Jouppi N, P., Smith, J. E. "Complexity-effective superscalar processors ", In Proc. The 24th Annual Int. Symp. Computer Architecture, Denver, Co, Jun. 1997, pp. 206-218.

U.S. Appl. No. 11/019,518 , filed Dec. 21, 2004, Simkins, James M. et al., Applications of Cascading DSP Slices, Xilinx, Inc. 2100 Logic Drive, San Jose, California 95124.

Fijioka, Y. et al., "Design of a Reconfigurable Parallel Processor for Digital control Using FPGAs", IEICE Transactions on Electronics, Institute of Electronics Information and communications; vol. E77-C, No. 7; Jul. 1994; pp. 1123-1129.

Xilinx, Inc., "The Programmable Logic Data Book 1999," pp. 1-62, available from Xilinx, Inc., 2100 Logic Drive, San Jose, California 95124.

Xilinx, Inc., "Virtex4 FPGA Handbook" Ch. 10 ExtremeDSP Design Considerations, Aug. 2, 2004, pp. 461-508, available from Xilinx, Inc., 2100 Logic Drive, San Jose, California 95124.

Gary Harmon; "Silicon Arithmetic with a 40% Advantage"; White Paper; AutoPD; Mar. 19, 2003, pp. 1-3.

Hema Dhanesha et al.; "Array-of-arrays Architecture for Parallel Floating Point Multiplication"; Center for Integrated Systems, Stanford University,1995 Conference on Advanced Research in VLSI, Chapel Hill, NC. Advanced Research in VLSI, Proceedings., Sixteenth Conference on Volume , Issue , Mar. 27-29, 1995 pp. 150-157.

Zhijun Huang et al.; "Low Power Array Multiplier Design by Topology Optimization"; Proceedings—SPIE the International Society for Engineering, Dec. 6, 2002, ISSU, Proceeding vol. 4791, pp. 424-435.

Robert McIlhenny et al.; "On the Implementation of a Three-Operand Multiplier"; pp. 1-5. 31st Asilomar Conference on Signals, Systems, and Computers, Pacific Grove, CA , Nov. 2-5, 1997.

BDTi, Berkeley Design Technology, Inc.; "Choosing a DSP Processor" ; 1996-2000 Berkeley Design Technology, Inc.; pp. 1-8.

U.S. Appl. No. 12/360,836, filed Jan. 27, 2009, Simkins, James M., Xilinx, Inc. 2100 Logic Drive, San Jose, CA, USA.

U.S. Appl. No. 12/418,979, filed Apr. 6, 2009, Wendling, Xavier and Simkins, James M., Xilinx, Inc. 2100 Logic Drive, San Jose, CA, USA.

Mar, M.F., et al., "Digital filter design for compact on-chip oversampling A/D conversion", IEEE 1993 Custom Integrated Circuits Conference, Proceedings of the IEEE 1993 San Diego, CA, USA, May 9-12, 1993, pp. 15.2.1-15.2.4, XP010222127.

Masud et al., "Reusable Silicon IP Cores for Discrete Wavelet Transform Applications", IEEE Transactions on Circuits and Systems, Part I: Regular Papers IEEE Service Center, NY, NY, vol. 51, No. 6, Jun. 1, 2004, pp. 1114-1124, XP011113915.

Parhami, B., "Computer Arithmetic, Algorithms and Hardware Designs", Jan. 2000, pp. 432-443, Oxford University Press, Inc., NY, NY, USA.

Xilinx, Inc., "Xtreme DSP DSP48A for Spartan-3A DSP FPGAs", User Guide, UG431 (v1.3), Jul. 15, 2008, available from Xilinx, Inc., of San Jose, CA USA.

Xilinx, Inc., ISE 10.1 In-Depth Tutorial, 168 pages, May 30, 2008, available at www.xilinx.com, Xilinx, Inc. 2100 Logic Drive, San Jose, CA USA.

Altera; "Using PLDs for High-Performance DSP Applications"; White Paper, WP-STXDSP-1.0; Feb. 2002, Ver. 1.0; Preliminary Information; pp. 1-6.

Leitun: Prof. Dr. Miroslaw Malek; Humbolt-Universitat Zu Berlin, Institut for Informatik; Lecture 12; "ALU (3)—Division Algorithms"; Sommersemester 2002; available from www.informatik.hu-berlin.ed/tok/ca; pp. 1-15.

Xilinx, Inc.; "FPGAs and DSP"; available from Xilinx, Inc., 2100 Logic Drive, San Jose, CA 95124, Nov. 1996, pp. 1-8.

Gary Harmon; "Silicon Arithmetic with a 40% Advantage"; White Paper; AutoPD; Mar. 19, 2003, pp. 1-3.

Hema Dhanesha et al.; "Array-of-arrays Architecture for Parallel Floating Point Multiplication"; Center for Integrated Systems, Stanford University, 1995 Conference on Advanced Research in VLSI, Chapel Hill, NC. Advanced Research in VLSI, Proceedings., Sixteenth Conference on Volume, Issue, Mar. 27-29, 1995 pp. 150-157.

Yong Chgin Lim; "An Efficient Bit-Serial FIR Filter Architecture"; supported by Office of Naval Research under Grant N00014-89-J1327, NSF Grant ECS87-13598, by an At&T Bell Laboratories Graduate Fellowship and by University of Kansas General Research Allocation 3775-20-0038; Presented at ICASSp-90 in Albuquerque, New Mexico; pp. 1-13.

Alliance Core; "ARC 32-Bit Configurable RISC/DSP Processor"; Jul. 3, 2000; Product Specification; ARC International; AR House, United Kingdom; pp. 1-7.

Satish Mohanakrishnan et al.; "Automatic Implementation of FIR Filters on Field Programmable Gate Arrays"; Oct. 7, 1993; supported by Kansas Technology Enterprise Corp; pp. 1-12.

Zhijun Huang et al.; "Low Power Array Multiplier Design by Topology Optimization", Proceedings-SPIE the International Society for Engineering, Dec. 6, 2002, ISSU, Proceeding vol. 4791, pp. 424-435.

Robert McIlhenny et al.; "On the Implementation of a Three-Operand Multiplier"; pp. 1-5. 31st Asilomar Conference on Signals, Systems, and Computers, Pacific Grove, CA , Nov. 2-5, 1997.

M. Nicolaidis et al.; "Design of Fault-Secure Parity-Prediction Booth Multipliers"; Design, Automation and Test in Europe, 1998., Proceedings, Volume, Issue, Feb. 23-26, 1998, pp. 7-14.

BDTi, Berkeley Design Technology, Inc.; "Choosing a DSP Processor"; 1996-2000 Berkeley Design Technology, Inc.; pp. 1-8.

Joseph B. Evans; "Efficient FIR Filter Architectures Suitable for FPGA Implementation"; presented at ISCAS '93 in Chicago, Illinois; pp. 1-6.

BDTi; "Evaluating FPGAs for Communication Infrastructure Applications"; 2002 Berkeley Design Technology, Inc.; SDR Forum; Nov. 2002 Conference; pp. 1-6.

Jennifer Eyre et al..; "The Evolution of DSP Processors"; a BDTi Whtie Paper; Copyright 2000 Berkeley Design Technology, Inc.; pp-1-9.

Arithmatica; "A+ Fast Carry-Propagate for Adders"; downloaded from http://www.arithmatica.com/aplus.html on Nov. 10, 2003; pp. 1-2.

Arithmatica; "Contact Arithmatica"; downloaded from http://www.arithmatica.com/aplus.html on Nov. 10, 2003; pp. 1.

Rafael Fried; "Algorithms for Power Consumption Reduction and Speed Enhancement in High-Performance Parallel Multipliers"; PATMOS-97; Seventh International Workshop Program; downloaded from http://www.dice.uci.ac.be/'anmarie/patmos/papers/S2/2_1.html on Nov. 10, 2003; pp. 1-11.

Drew Wilson; "Chameleon Takes on FPGAs, ASICs"; Electronic News; Oct. 29, 2004; downloaded from http://www.reed-electronics.com/electronicnews/article/CA50551?pubdate=10%2F16%2 . . . on Oct. 29, 2004; pp. 1-6.

Jim Simkins et al.; "A Reconfigurable VME Spread-Spectrum LPI (Low Probability of Intercept) Datalink Receiver/Transmitter Implemented via Reconfigurable DSP Hardware"; IEEE Transactions on Acoustics, Speech, and Signal Processing, vol. ASSP-29, No. 2; Apr. 1981; pp. 1-14.

Chi-Jui Chou et al.; "FPGA Implementation of Digital Filters"; Fourth International Conference on Signal Processing Applications and Technology. ICSPAT '93, Sep. 28-Oct. 1, 1993, Santa Clara, CA, USA, pp. 1-9.

Gregory Ray Goslin; "A Guide to Using Field Programmable Gate Arrays (FPGAs) for Application-Specific Digital Signal Processing Performance"; 1995 Xilinx, Inc.; V.1.0; pp. 1-11.

Stephen J. Bradshaw; "Building a Better DSP Mousetrap: FPGAs, DSP Processors, or a combination of both?", Copyright 2001 Traquair Data Systems, Inc.; rev. 1.1; Nov. 1, 2001; available from www.traquair.com.; pp. 1-6.

Hyeong Seok Yu et al.; "Low Area CMOS Multiplication Using Booth Algorithm for IEEE 754 Floating Point Standard"; 6th Korean Semiconductor Conference, D-48, Feb. 9, 1999, pp. 1-5 Seoul, Korea.

Robert D. Turney et al.; "Modeling and Implementation of DSP FPGA Solutions"; 1999 International Conference on Signal Processing Applications and Technology ICSPAT, Nov. 3, 1999, pp. 1-16.

University of Patras—DCT-Hellas; "ESD Best Practice: Pilot Action for Low Power Design—SOFLOPO Low Power Software Development for Embedded Applications"; May 1998; pp. 1-100.

Behrooz Parhami et al.; "Parallel Architectures and Adaptation Algorithms for Programmable FIR Digital Filters with Fully Pipelined Data and Control Flows"; Journal of Information Science and Engineering 19, 59-74 (2003); Received Sep. 28, 2001; accepted Apr. 15, 2002; pp. 59-74.

Edward A. Lee; "Programmable DSP Architectures: Part II"; IEEE ASSP Magazine; Jan. 1989; pp. 4-14.

Keith Reeves et al.; "Reconfigurable Hardware Accelerator for Embedded DSP"; High-Speed Computing, Digital Signal Processing, and Filtering Using Reconfigurable Logic, Proc. SPIE, vol. 2914, 332, Nov. 20, 1996, Boston, MA, pp. 929-933.

Guy Even et al.; "A Comparison of Three Rounding Algorithms for IEEE Floating-Point Multiplication"; Aug. 29, 1998; pp. 1-28.

Gordana Jovanovic-Dolecek et al.; "Design of FIR Lowpass Filters Using Stepped Triangular Approximation"; 5th Nordic Signal Processing Symposium, NORSIG 2002, Oct. 4-7, 2002, from Tromso to Trondheim, Norway, pp. 1-4.

Naji S. Ghazal et al.; "Retargetable Estimation for DSP Architecture Selection"; Tampere Technology Seminar—Nov. 1999; available from http://www-cad.eecs.berkeley.edu/~naji/Research/; pp. 1-33.

Altera; "FPGAs Provide Reconfigurable DSP Solutions"; White Paper; WP-FPGA/DSP-1.0; Aug. 2002, ver. 1.0; pp. 1-6.

Russell J. Peterson; "An Assessment of the Suitability of Reconfigurable Systems for Digital Signal Processing"; A Thesis Submitted to the Department of Electrical and Computer Engineering Brigham Young University; Sep. 27, 1995; pp. 1-138.

Steven K. Knapp; "Using Programmable Logic to Accelerate DSP Functions"; Copyright 1995 by Xilinx, Inc.; available from http://www.xilinx.com; pp. 1-8.

Bill Allaire et al.; "Block Adaptive Filter"; Application Note; XAPP 055; Jan. 9, 1997 (Version 1.1); pp. 1-10.

Advanced Micro Devices; "The Am29500 Family"; Bipolar Microprocessor Logic and Interface Data Book; Copyright 1985 Advanced Micro Devices, Inc.; pp. 7-1 through 7-96.

* cited by examiner

| N=CLK | OUT0 | OUT1 | OUT2 | OUT3 = Y3(N-3) |
|---|---|---|---|---|
| 0 | 0 | 0 | 0 | 0 |
| 1 | 0 | 0 | 0 | 0 |
| 2 | X(0)H3 | X(0)H2 | X(0)H1 | X(0)H0 |
| 3 | X(1)H3 | X(1)H2+X(0)H3 | X(1)H1+X(0)H2 | X(1)H0+X(0)H1 |
| 4 | X(2)H3 | X(2)H2+X(1)H3 | X(2)H1+X(1)H2+X(0)H3 | X(2)H0+X(1)H1+X(0)H2 |
| 5 | X(3)H3 | X(3)H2+X(2)H3 | X(3)H1+X(2)H2+X(1)H3 | X(3)H0+X(2)H1+X(1)H2+X(0)H3 |
| 6 | X(4)H3 | X(4)H2+X(3)H3 | X(4)H1+X(3)H2+X(2)H3 | X(4)H0+X(3)H1+X(2)H2+X(1)H3 |
| 7 | X(5)H3 | X(5)H2+X(4)H3 | X(5)H1+X(4)H2+X(3)H3 | X(5)H0+X(4)H1+X(3)H2+X(2)H3 |
| 8 | X(6)H3 | X(6)H2+X(5)H3 | X(6)H1+X(5)H2+X(4)H3 | X(6)H0+X(5)H1+X(4)H2+X(3)H3 |
| 9 | X(7)H3 | X(7)H2+X(6)H3 | X(7)H1+X(6)H2+X(5)H3 | X(7)H0+X(6)H1+X(5)H2+X(4)H3 |
| 10 | X(8)H3 | X(8)H2+X(7)H3 | X(8)H1+X(7)H2+X(6)H3 | X(8)H0+X(7)H1+X(6)H2+X(5)H3 |

|  | | DSPT0 | | DSPT1 | |
|---|---|---|---|---|---|
| N=CLK | | DSPS0 | DSPS1 | DSPS0 | DSPS1 |
| 0 | 710 | X(0) | 0 | 0 | 0 |
|   | 715 | H0 | H1 | 0 | 0 |
|   | 418 | 0 | 0 | 0 | 0 |
|   | 1205 | n/a | 0 | n/a | 0 |
| 1 | 710 | X(1) | X(0) | 0 | 0 |
|   | 715 | H0 | H1 | H2 | H3 |
|   | 418 | X(0)H0 | 0 | 0 | 0 |
|   | 1205 | n/a | 0 | n/a | 0 |
| 2 | 710 | X(2) | X(1) | 0 | 0 |
|   | 715 | H0 | H1 | H2 | H3 |
|   | 418 | X(1)H0 | X(0)H1 | 0 | 0 |
|   | 1205 | n/a | X(0)H0 | n/a | 0 |
| 3 | 710 | X(3) | X(2) | X(0) | 0 |
|   | 715 | H0 | H1 | H2 | H3 |
|   | 418 | X(2)H0 | X(1)H1 | 0 | 0 |
|   | 1205 | n/a | X(1)H0+X(0)H1 | n/a | X(0)H0 |
| 4 | 710 | X(4) | X(3) | X(1) | X(0) |
|   | 715 | H0 | H1 | H2 | H3 |
|   | 418 | X(3)H0 | X(2)H1 | X(0)H2 | 0 |
|   | 1205 | n/a | X(2)H0+X(1)H1 | n/a | X(1)H0+X(0)H1 |
| 5 | 710 | X(5) | X(4) | X(2) | X(1) |
|   | 715 | H0 | H1 | H2 | H3 |
|   | 418 | X(4)H0 | X(3)H1 | X(1)H2 | X(0)H3 |
|   | 1205 | n/a | X(3)H0+X(2)H1 | n/a | X(2)H0+X(1)H1+X(0)H2 |
| 6 | 710 | X(6) | X(5) | X(3) | X(2) |
|   | 715 | H0 | H1 | H2 | H3 |
|   | 418 | X(5)H0 | X(4)H1 | X(2)H2 | X(1)H3 |
|   | 1205 | n/a | X(4)H0+X(3)H1 | n/a | X(3)H0+X(2)H1+X(1)H2+X(0)H3 |
| 7 | 710 | X(7) | X(6) | X(4) | X(3) |
|   | 715 | H0 | H1 | H2 | H3 |
|   | 418 | X(6)H0 | X(5)H1 | X(3)H2 | X(2)H3 |
|   | 1205 | n/a | X(5)H0+X(4)H1 | n/a | X(4)H0+X(3)H1+X(2)H2+X(1)H3 |

FIG. 12B

|  |  | DSPT0 | | DSPT1 | |
|---|---|---|---|---|---|
| N=CLK | | DSPS0 | DSPS1 | DSPS0 | DSPS1 |
| 0 | 710 | X(0) | 0 | 0 | 0 |
|   | 715 | H0 | 0 | 0 | 0 |
|   | 418 | 0 | 0 | 0 | 0 |
|   | 1205 | 0 | 0 | 0 | 0 |
| 1 | 710 | X(1) | 0 | 0 | 0 |
|   | 715 | H0 | H1 | 0 | 0 |
|   | 418 | X(0)H0 | 0 | 0 | 0 |
|   | 1205 | 0 | 0 | 0 | 0 |
| 2 | 710 | X(2) | X(0) | 0 | 0 |
|   | 715 | H0 | H1 | H2 | 0 |
|   | 418 | X(1)H0 | 0 | 0 | 0 |
|   | 1205 | X(0)H0 | 0 | 0 | 0 |
| 3 | 710 | X(3) | X(1) | 0 | 0 |
|   | 715 | H0 | H1 | H2 | H3 |
|   | 418 | X(2)H0 | X(0)H1 | 0 | 0 |
|   | 1205 | X(1)H0 | X(0)H0 | 0 | 0 |
| 4 | 710 | X(4) | X(2) | X(0) | 0 |
|   | 715 | H0 | H1 | H2 | H3 |
|   | 418 | X(3)H0 | X(1)H1 | 0 | 0 |
|   | 1205 | X(2)H0 | X(1)H0+X(0)H1 | X(0)H0 | 0 |
| 5 | 710 | X(5) | X(3) | X(1) | 0 |
|   | 715 | H0 | H1 | H2 | H3 |
|   | 418 | X(4)H0 | X(2)H1 | X(0)H2 | 0 |
|   | 1205 | X(3)H0 | X(2)H0+X(1)H1 | X(1)H0+X(0)H1 | X(0)H0 |
| 6 | 710 | X(6) | X(4) | X(2) | X(0) |
|   | 715 | H0 | H1 | H2 | H3 |
|   | 418 | X(5)H0 | X(3)H1 | X(1)H2 | 0 |
|   | 1205 | X(4)H0 | X(3)H0+X(2)H1 | X(2)H0+X(1)H1+X(0)H2 | X(1)H0+X(0)H1 |
| 7 | 710 | X(7) | X(5) | X(3) | X(1) |
|   | 715 | H0 | H1 | H2 | H3 |
|   | 418 | X(6)H0 | X(4)H1 | X(2)H2 | X(0)H3 |
|   | 1205 | X(5)H0 | X(4)H0+X(3)H1 | X(3)H0+X(2)H1+X(1)H2 | X(2)H0+X(1)H1+X(0)H2 |
| 8 | 710 | X(8) | X(6) | X(4) | X(2) |
|   | 715 | H0 | H1 | H2 | H3 |
|   | 418 | X(7)H0 | X(5)H1 | X(3)H2 | X(1)H3 |
|   | 1205 | X(6)H0 | X(5)H0+X(4)H1 | X(4)H0+X(3)H1+X(2)H2 | X(3)H0+X(2)H1+X(1)H2+X(0)H3 |

FIG. 13B

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 |
|---|---|---|---|---|---|---|---|---|---|---|---|---|---|---|---|---|---|---|---|---|---|---|---|---|---|---|---|---|---|---|---|---|---|---|---|---|
| 0 | p0 | p0 | p0 | p0 | p0 | p0 | p0 | p0 | p0 | p0 | p0 | p0 | p0 | p0 | p0 | p0 | p0 | p0 | p0 | | | | | | | | | | | | | | | | | |
| 1 | s0 | p1 | p1 | p1 | p1 | p1 | p1 | p1 | p1 | p1 | p1 | p1 | p1 | p1 | p1 | p1 | p1 | p1 | p1 | p1 | p1 | | | | | | | | | | | | | | | |
| 2 | | | s1 | p2 | p2 | p2 | p2 | p2 | p2 | p2 | p2 | p2 | p2 | p2 | p2 | p2 | p2 | p2 | p2 | p2 | p2 | p2 | p2 | | | | | | | | | | | | | |
| 3 | | | | | s2 | p3 | p3 | p3 | p3 | p3 | p3 | p3 | p3 | p3 | p3 | p3 | p3 | p3 | p3 | p3 | p3 | p3 | p3 | p3 | p3 | | | | | | | | | | | |
| 4 | | | | | | | s3 | p4 | p4 | p4 | p4 | p4 | p4 | p4 | p4 | p4 | p4 | p4 | p4 | p4 | p4 | p4 | p4 | p4 | p4 | p4 | p4 | | | | | | | | | |
| 5 | | | | | | | | | s4 | p5 | p5 | p5 | p5 | p5 | p5 | p5 | p5 | p5 | p5 | p5 | p5 | p5 | p5 | p5 | p5 | p5 | p5 | p5 | p5 | | | | | | | |
| 6 | | | | | | | | | | | s5 | p6 | p6 | p6 | p6 | p6 | p6 | p6 | p6 | p6 | p6 | p6 | p6 | p6 | p6 | p6 | p6 | p6 | p6 | p6 | p6 | | | | | |
| 7 | | | | | | | | | | | | | s6 | p7 | p7 | p7 | p7 | p7 | p7 | p7 | p7 | p7 | p7 | p7 | p7 | p7 | p7 | p7 | p7 | p7 | p7 | p7 | p7 | | | |
| 8 | | | | | | | | | | | | | | | s7 | p8 | p8 | p8 | p8 | p8 | p8 | p8 | p8 | p8 | p8 | p8 | p8 | p8 | p8 | p8 | p8 | p8 | p8 | p8 | p8 | |
| 9 | | | | | | | | | | | | | | | | | s8 | | | | | | | | | | | | | | | | | | | |

FIG. 29

PROGRAMMABLE DEVICE WITH DYNAMIC DSP ARCHITECTURE

CROSS REFERENCE

This patent application claims priority to and incorporates by reference the U.S. provisional application Ser. No. 60/533,181, entitled "Programmable Logic Device with Cascading DSP Slices", by James M. Simkins, et al., filed Dec. 29, 2003.

BACKGROUND

Programmable logic devices, or PLDs, are general-purpose circuits that can be programmed by an end user to perform one or more selected functions. Complex PLDs typically include a number of programmable logic elements and some programmable routing resources. Programmable logic elements have many forms and many names, such as CLBs, logic blocks, logic array blocks, logic cell arrays, macrocells, logic cells, and functional blocks. Programmable routing resources also have many forms and many names.

FIG. 1A (prior art) is a block diagram of a field-programmable gate array (FPGA) 100, a popular type of PLD. FPGA 100 includes an array of identical CLB tiles 101 surrounded by edge tiles 103-106 and corner tiles 113-116. Columns of random-access-memory (RAM) tiles 102 are positioned between two columns of CLB tiles 101. Edge tiles 103-106 and corner tiles 113-116 provide programmable interconnections between tiles 101-102 and input/output (I/O) pins (not shown). FPGA 100 may include any number of CLB tile columns, and each tile column may include any number of CLB tiles 101. Although only two columns of RAM tiles 102 are shown here, more or fewer RAM tiles might also be used. The contents of configuration memory 120 defines the functionality of the various programmable resources.

FPGA resources can be programmed to implement many digital signal-processing (DSP) functions, from simple multipliers to complex microprocessors. For example, U.S. Pat. No. 5,754,459, issued May 19, 1998, to Telikepalli, and incorporated by reference herein, teaches implementing a multiplier using general-purpose FPGA resources (e.g., CLBs and programmable interconnect). Unfortunately, DSP circuits may not make efficient use of FPGA resources, and may consequently consume more power and FPGA real estate than is desirable. For example, in the Virtex family of FPGAs available from Xilinx, Inc., implementing a 16×16 multiplier requires at least 60 CLBs and a good deal of valuable interconnect resources.

FIG. 1B (prior art) depicts an FPGA 150 adapted to support DSP functions in a manner that frees up general-purpose logic and resources. FPGA 150 is similar to FPGA 100 of FIG. 1A, like-numbered elements being the same or similar. CLB tiles 101 are shown in slightly more detail to illustrate the two main components of each CLB tile, namely a switch matrix 120 and a CLB 122. CLB 122 is a well-known, individually programmable CLB such as described in the 2002 Xilinx Data Book. Each switch matrix 120 may be a programmable routing matrix of the type disclosed by Tavana et al. in U.S. Pat. No. 5,883,525, or by Young et al. in U.S. Pat. No. 5,914,616 and provides programmable interconnections to other tiles 101 and 102 in a well-known manner via signal lines 125. Each switch matrix 120 includes an interface 140 to provide programmable interconnections to a corresponding CLB 122 via a signal bus 145. In some embodiments, CLBs 122 may include direct, high-speed connections to adjacent CLBs, for instance, as described in U.S. Pat. No. 5,883,525. Other well-known elements of FPGA 100 are omitted from FIG. 1B for brevity.

In place of RAM blocks 102 of FIG. 1A, FPGA 150 includes one or more columns of multi-function tiles 155, each of which extends over four rows of CLB tiles. Each multi-function tile includes a block of dual-ported RAM 160 and a signed multiplier 165, both of which are programmably connected to the programmable interconnect via respective input and output busses 170 and 175 and a corresponding switch matrix 180. FPGA 150 is detailed in U.S. Pat. No. 6,362,650 to New et al. entitled "Method and apparatus for incorporating a multiplier into an FPGA," which is incorporated herein by reference.

FPGA 150 does an excellent job of supporting DSP functionality. Complex functions must make use of general-purpose routing and logic, however, and these resources are not optimized for signal processing. Complex DSP functions may therefore be slower and more area intensive than is desirable. There is therefore a need for DSP circuitry that addresses consumer demand for ever faster speed performance without sacrificing the flexibility afforded by programmable logic.

SUMMARY

The present invention is directed to systems and methods that address the need for fast, flexible, low-power DSP circuitry. The following discussion is divided into five sections, each detailing specific methods and systems for providing improved DSP performance.

Embodiments of the present invention include the combination of modular DSP circuitry to perform one or more mathematical functions. A plurality of substantially identical DSP sub-modules are substantially directly connected together to form a DSP module, where each sub-modules has dedicated circuitry with at least a switch, for example, a multiplexer, connected to an adder. The DSP module may be further expanded by substantially directly connecting additional DSP sub-modules. Thus a larger or smaller DSP module may be constructed by adding or removing DSP sub-modules. The DSP sub-modules have substantially dedicated communication lines interconnecting the DSP sub-modules.

In an exemplary embodiment of the present invention, an integrated circuit (IC) includes a plurality of substantially directly connected or cascaded modules. One embodiment provides that the control input to the switch connected to an adder in the DSP sub-module may be modified at the operating speed of other circuitry in the IC, hence changing the inputs to the adder over time. In another embodiment a multiplier output and a data input bypassing the multiplier are connected to the switch, thus the function performed by the DSP sub-module may change over time.

A programmable logic device (PLD) in accordance with an embodiment includes DSP slices, where "slices" are logically similar circuits that can be cascaded as desired to create DSP circuits of varying size and complexity. Each DSP slice includes a plurality of operand input ports and a slice output port, all of which are programmably connected to general routing and logic resources. The operand ports receive operands for processing, and a slice output port conveys processed results. Each slice may additionally include a feedback port connected to the respective slice output port, to support accumulate functions in this embodiment, and a cascade input port connected to the output port of an upstream slice to facilitate cascading.

One type of cascade-connected DSP slice includes an arithmetic circuit having a product generator feeding an adder. The product generator has a multiplier port connected to a first of the operand input ports, a multiplicand port connected to a second of the operand input ports, and a pair of partial-product ports. The adder has first and second addend ports connected to respective ones of the partial-product ports, a third addend port connected to the cascade input port, and a sum port. The adder can therefore add the partial products, to complete a multiply, or add the partial products to the output from an upstream slice. The cascade and accumulate connections are substantially direct (i.e., they do not traverse the general purpose interconnect) to maximize speed performance, reduce demand on the general purpose interconnect, and reduce power.

One embodiment of the present invention includes an integrated circuit including: a plurality of digital signal processing (DSP) elements, including a first DSP element and a second DSP element, where each DSP element has substantially identical structure and each DSP element has a switch connected to a hardwired adder; and a dedicated signal line connecting the first DSP element to the second DSP element. Additionally, the switch includes a multiplexer that selects the inputs into the hardwired adder.

Another embodiment of the present invention includes an integrated circuit including: a plurality of configurable function blocks; programmable interconnect resources connecting some of the plurality of configurable function blocks; a plurality of digital signal processing (DSP) elements, including a first DSP element and a second DSP element, where each DSP element has substantially identical structure and includes a switch connected to a hardwired adder; and a dedicated signal line connecting the first DSP element to the second DSP element, where the dedicated signal line does not include any of the programmable interconnect resources.

Yet another embodiment of the present invention has integrated circuit having: a plurality of digital signal processing (DSP) elements, including a first DSP element and a second DSP element, each DSP element having substantially identical structure and each DSP element including a hardwired multiplier; and a dedicated signal line connecting the first DSP element to the second DSP element.

A further embodiment of the present invention includes a DSP element in an integrated circuit having: a first switch; a multiplier circuit connected to the first switch; a second switch, the second switch connected to the multiplier circuit; and an adder circuit connected to the second switch.

In one embodiment of the present invention the contents of the one or more mode registers can be altered during device operation to change DSP functionality. The mode registers connect to the general interconnect, i.e., the programmable routing resources in a PLD, and hence can receive control signals that alter the contents of the mode registers, and therefore the DSP functionality, without needing to change the contents of the configuration memory of the device. In one embodiment, the mode registers may be connected to a control circuit in the programmable logic, and change may take on the order of nanoseconds or less, while reloading of the configuration memory may take on the order of microseconds or even milliseconds depending upon the number of bits being changed. In another embodiment the one or more mode registers are connected to one or more embedded processors such as in the Virtex II Pro from Xilinx Inc. of San Jose, Calif., and hence, the contents of the mode registers can be changed at substantially the clock speed of the embedded processor(s).

Changing DSP resources to perform different DSP algorithms without writing to configuration memory is referred to herein as "dynamic" control to distinguish programmable logic that can be reconfigured to perform different DSP functionality by altering the contents of the configuration memory. Dynamic control is preferred, in many cases, because altering the contents of the configuration memory can be unduly time consuming. Some DSP applications do not require dynamic control, in which case DSP functionality can be defined during loading (or reloading) of the configuration memory.

In other embodiments the FPGA configuration memory can be reconfigured in conjunction with dynamic control, to change the DSP functionality. In one embodiment, the difference between dynamic control of the mode register, to change DSP functionality and reloading the FPGA configuration memory to change DSP functionality, is the speed of change, where reloading the configuration memory takes more time than dynamic control. In an alternative embodiment, with the conventional configuration memory cell replaced with a separately addressable read/write memory cell, there may be little difference and either or both dynamic control or reconfiguration may be done at substantially the same speed.

An embodiment of the present invention includes an integrated circuit having a DSP circuit. The DSP circuit includes: an input data port for receiving data at an input data rate; a multiplier coupled to the input port; an adder coupled to the multiplier by first programmable routing logic; and a register coupled to the first programmable routing logic, where the register is capable of configuring different routes in the first programmable routing logic on at least a same order of magnitude as the input data rate.

Another embodiment of the present invention includes a method for configuring a DSP logic circuit on an integrated circuit where the DSP logic circuit has a multiplier connected to a switch and an adder connected to the switch. The method includes the steps of: a) receiving input data at an input data rate by the multiplier; b) routing the output result from the multiplier to the switch; c) the switch selecting an adder input from a set of adder inputs, where the set of adder inputs includes the output result, where the selecting is responsive to contents of a control register, and where the control register has a clock rate that is a function of the input data rate; and d) receiving the adder input by the adder.

A programmable logic device in accordance with one embodiment includes a number of conventional PLD components, including a plurality of configurable logic blocks and some configurable interconnect resources, and some dynamic DSP resources. The dynamic DSP resources are, in one embodiment, a plurality of DSP slices, including at least a DSP slice and at least one upstream DSP slice or at least one downstream DSP slice. A configuration memory stores configuration data defining a circuit configuration of the logic blocks, interconnect resources, and DSP slices.

In one embodiment, each DSP slice includes a product generator followed by an adder. In support of dynamic functionality, each DSP slice additionally includes multiplexing circuitry that controls the inputs to the adder based upon the contents of a mode register. Depending upon the contents of the mode register, and consequent connectivity of the multiplexing circuitry, the adder can add various combinations of addends. The selected addends in a given slice can then be altered dynamically by issuing different sets of mode control signals to the respective mode register.

The ability to alter DSP functionality dynamically supports complex, sequential DSP functionality in which two or more portions of a DSP algorithm are executed at different times by the same DSP resources. In some embodiments, a state machine instantiated in programmable logic issues the mode control signals that control the dynamic functionality of the DSP resources. Some PLDs include embedded microprocessor or microcontrollers and emulated microprocessors (such as MicroBlaze™ from Xilinx Inc. of San Jose, Calif.), and these too can issue mode control signals in place of or in addition to the state machine.

DSP slices in accordance with some embodiments include programmable operand input registers that can be configured to introduce different amounts of delay, from zero to two clock cycles, for example. In one such embodiment, each DSP slice includes a product generator having a multiplier port, a multiplicand port, and one or more product ports. The multiplier and multiplicand ports connect to the operand input ports via respective first and second operand input registers, each of which is capable of introducing from zero to two clock cycles of delay. In one embodiment, the output of at least one operand input register connects to the input of an operand input register of a downstream DSP slice so that operands can be cascaded among a number of slices.

Many DSP circuits and configurations multiply numbers with many digits or bits to create products with significantly more digits or bits. Manipulating large, unnecessarily precise products is cumbersome and resource intensive, so such products are often rounded to some desired number of bits. Some embodiments employ a fast, flexible rounding scheme that requires few additional resources and that can be adjusted dynamically to change the number of bits involved in the rounding.

DSP slices adapted to provide dynamic rounding in accordance with one embodiment include an additional operand input port receiving a rounding constant and a correction circuit that develops a correction factor based upon the sign of the number to be rounded. An adder then adds the number to be rounded to the correction factor and the rounding constant to produce the rounded result. In one embodiment, the correction circuit calculates the correction factor from the signs of a multiplier and a multiplicand so the correction factor is ready in advance of the product of the multiplier and multiplicand.

In a rounding method, for rounding to the nearest integer, carried out by a DSP slice adapted in accordance with one embodiment, the DSP slice stores a rounding constant selected from the group of binary numbers $2^{(N-1)}$ and $2^{(N-1)}-1$, calculates a correction factor from a multiplier sign bit and a multiplicand sign bit, and sums the rounding constant, the correction factor, and the product to obtain N-the rounded product (where N is a positive number). The N least significant bits of the rounded product are then dropped.

DSP slices described herein conventionally include a product generator, which produces a pair of partial products, followed by an adder that sums the partial products. In accordance with one embodiment, the flexibility of the DSP slices are improved by providing multiplexer circuitry between the product generator and the adder. The multiplexer circuitry can provide the partial products to the adder, as is conventional, and can select from a number of additional addend inputs. The additional addends include inputs and outputs cascaded from upstream slices and the output of the corresponding DSP slice. In some embodiments, a mode register controls the multiplexing circuitry, allowing the selected addends to be switched dynamically.

This summary does not limit the invention, which is instead defined by the claims.

BRIEF DESCRIPTION OF THE FIGURES

FIG. 5B is a table illustrating the function of the FIR filter of FIG. 5A.

FIG. 12B is a table illustrating the function of FIR filter of FIG. 12A.

FIG. 13B is a table illustrating the function of FIR filter of FIG. 13A.

FIG. 29 shows the partial product array produced from the Booth encoder/mux;

Figure 25:
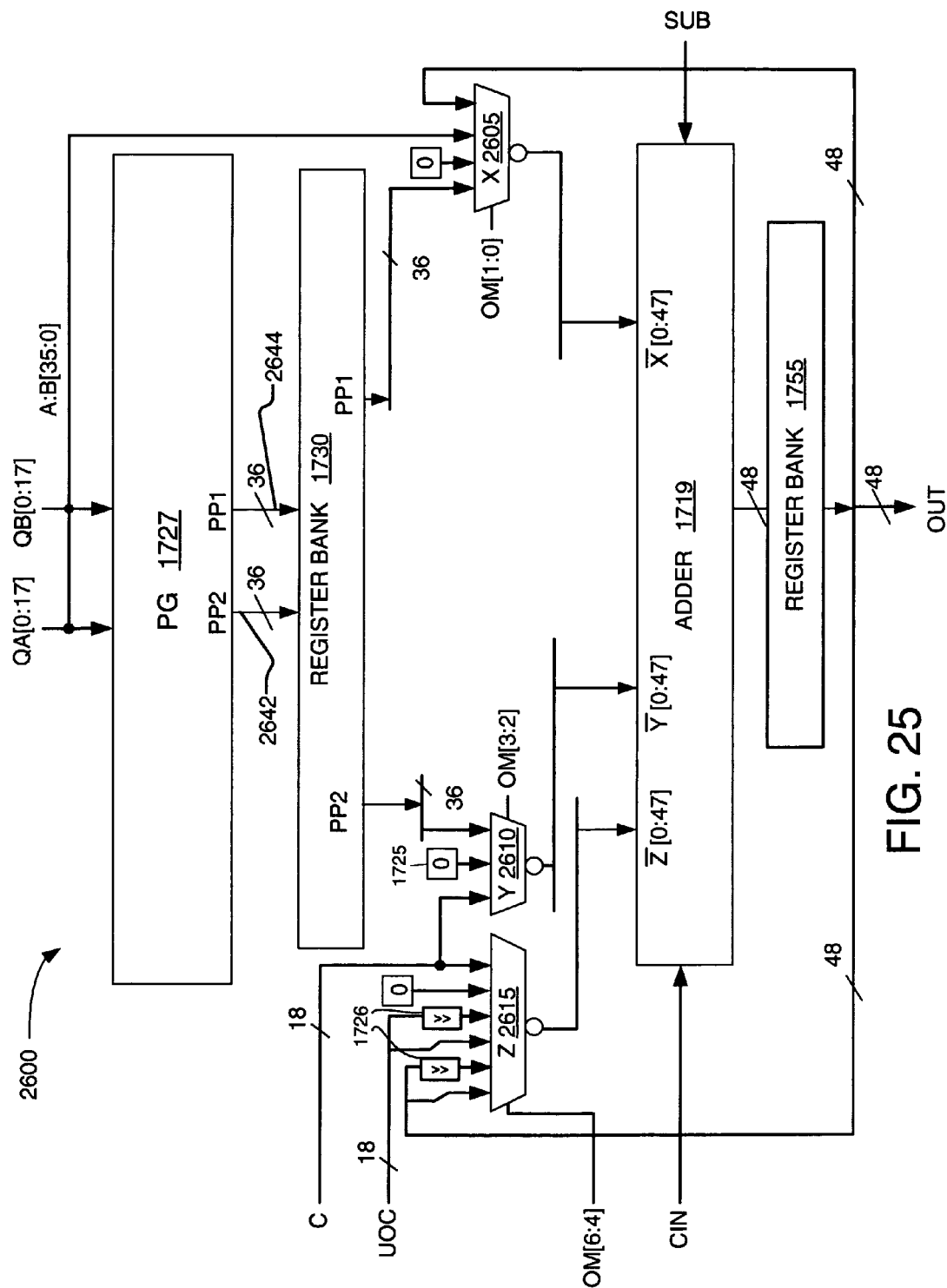
FIG. 25 depicts an arithmetic circuit n accordance with one embodiment.
Figure 30:
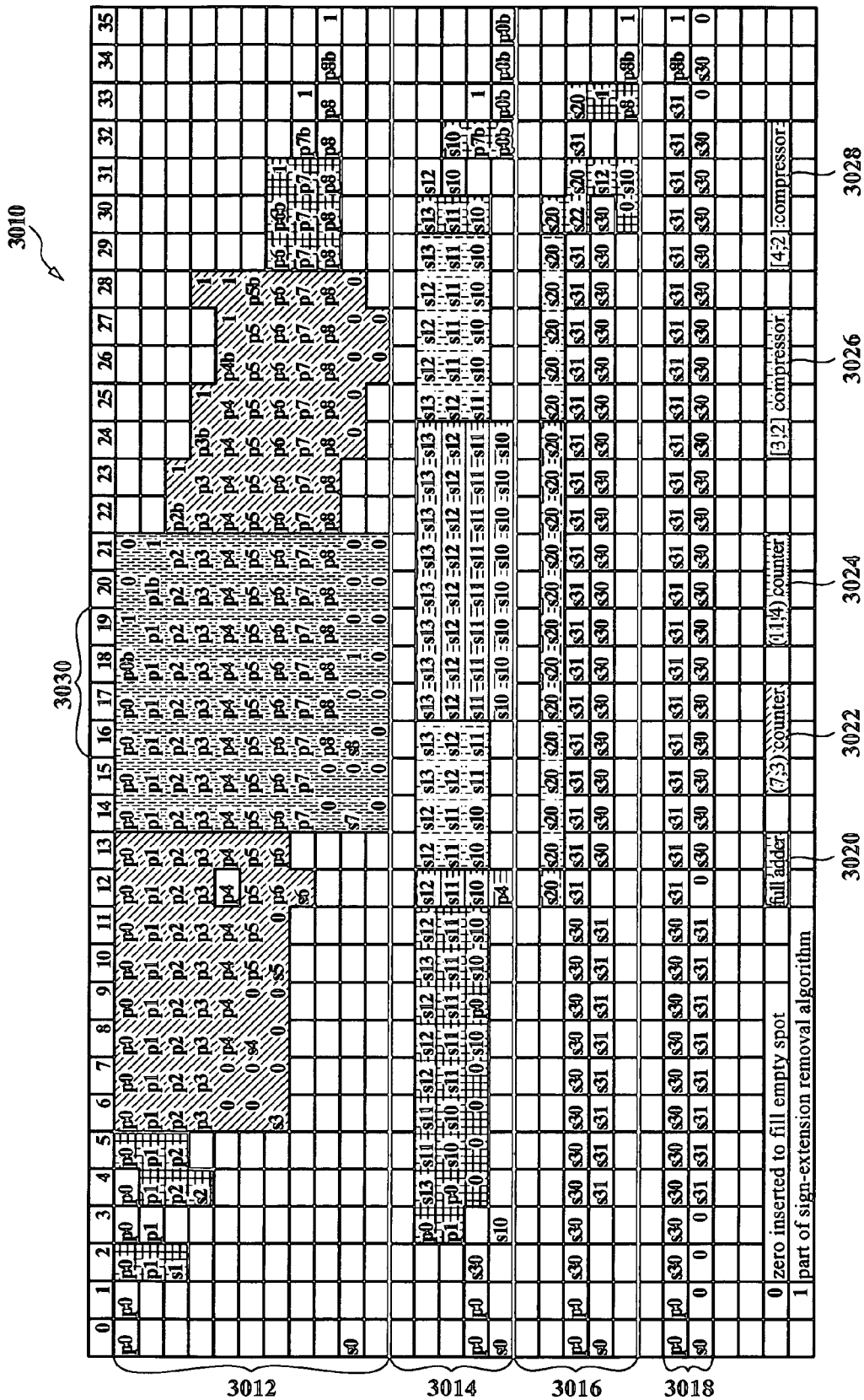
FIG. 30 shows the array reduction of the partial products in stages.
Figure 33A:
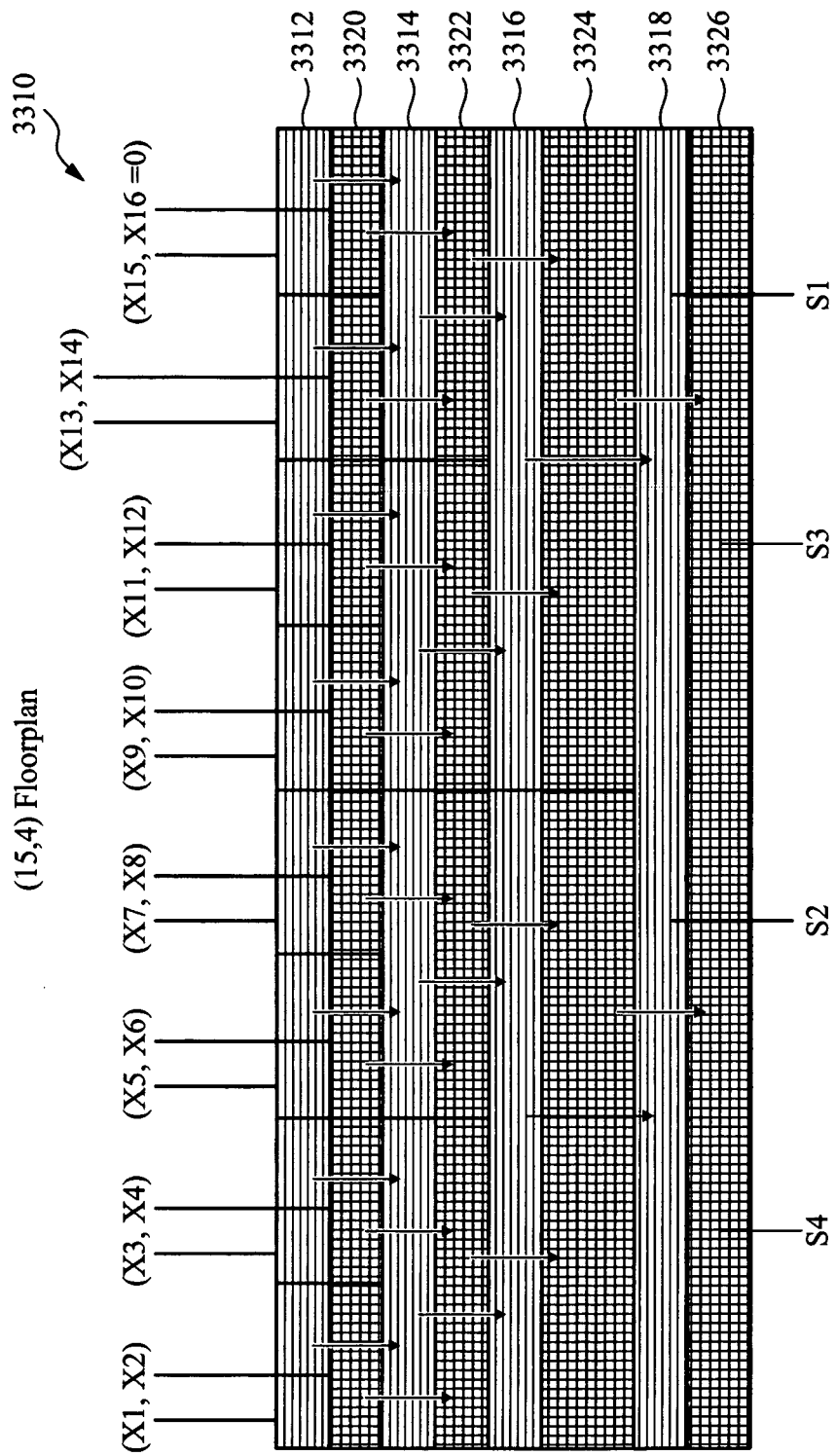
Figure 34:
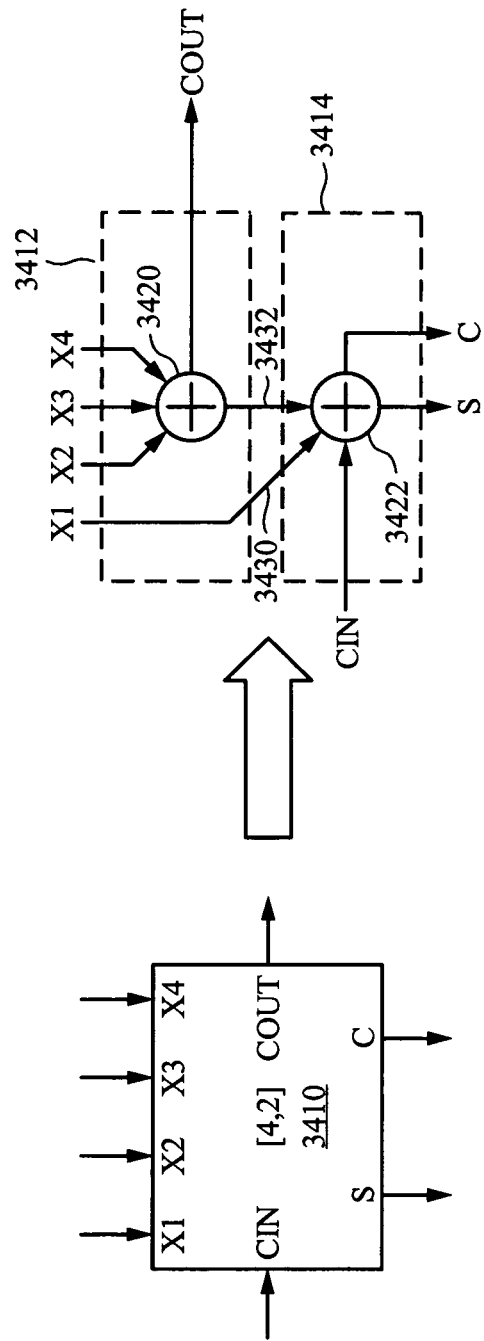
Figure 35A:
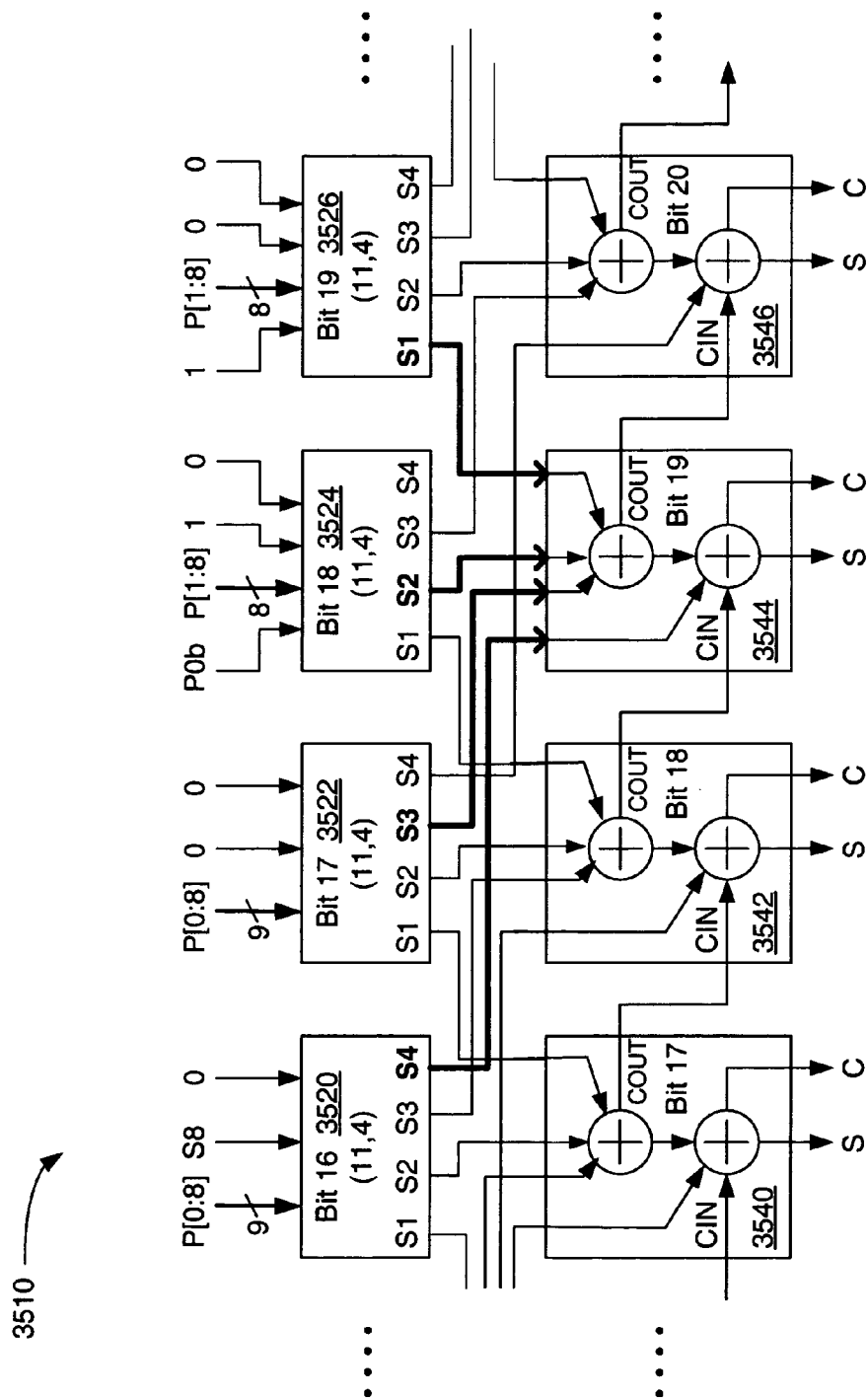
Figure 35B:
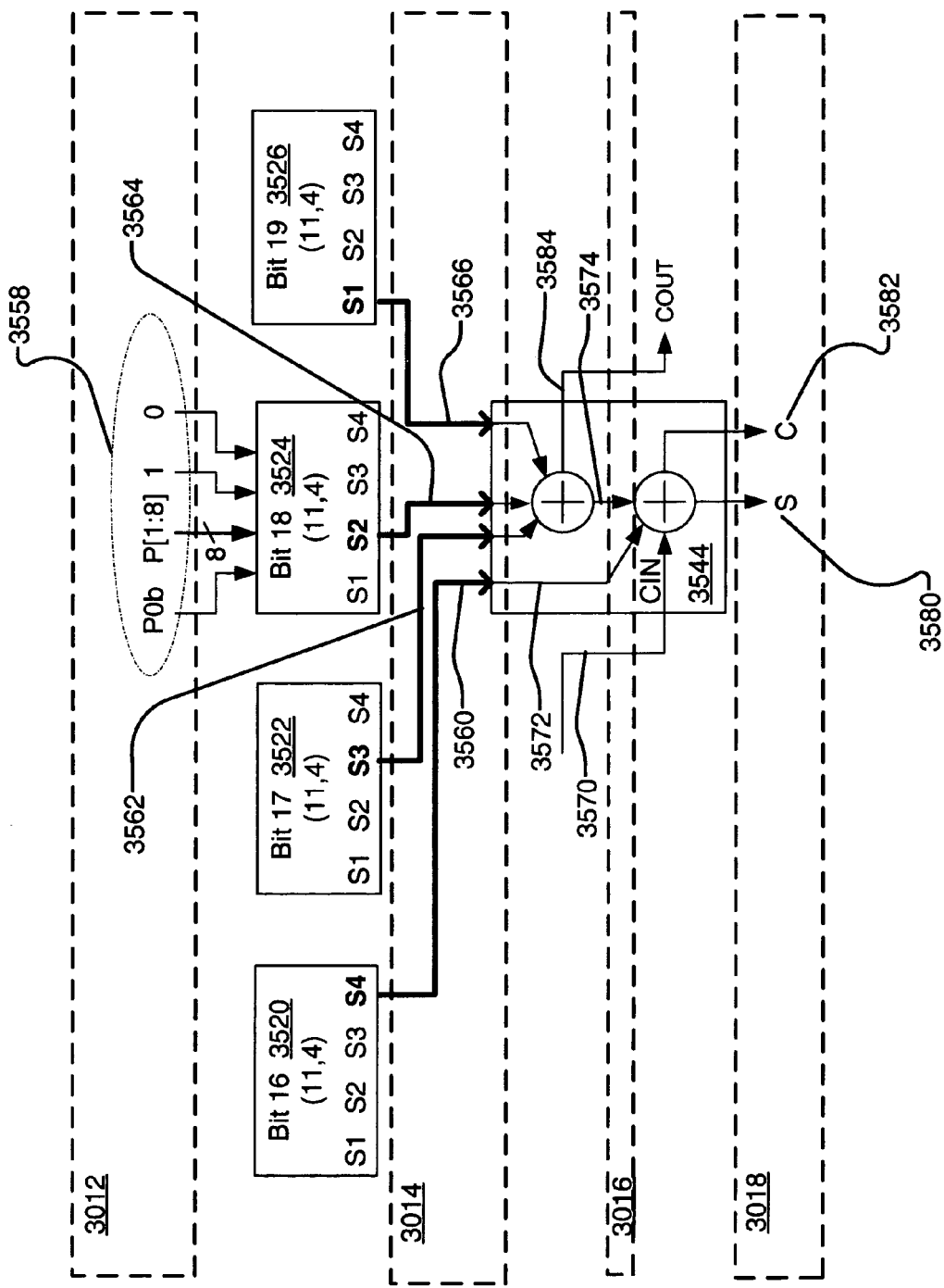
Figure 36:
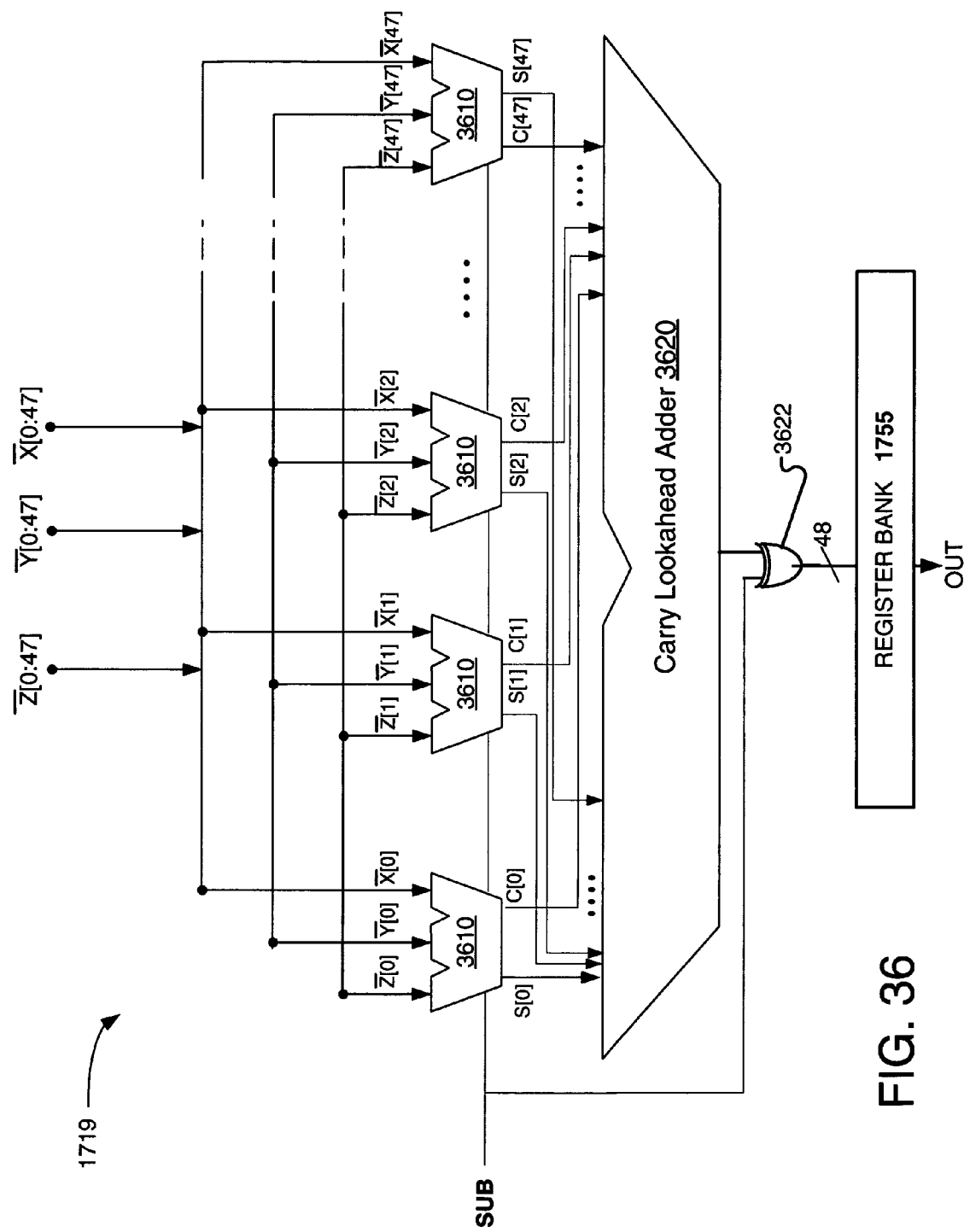
Figure 37:
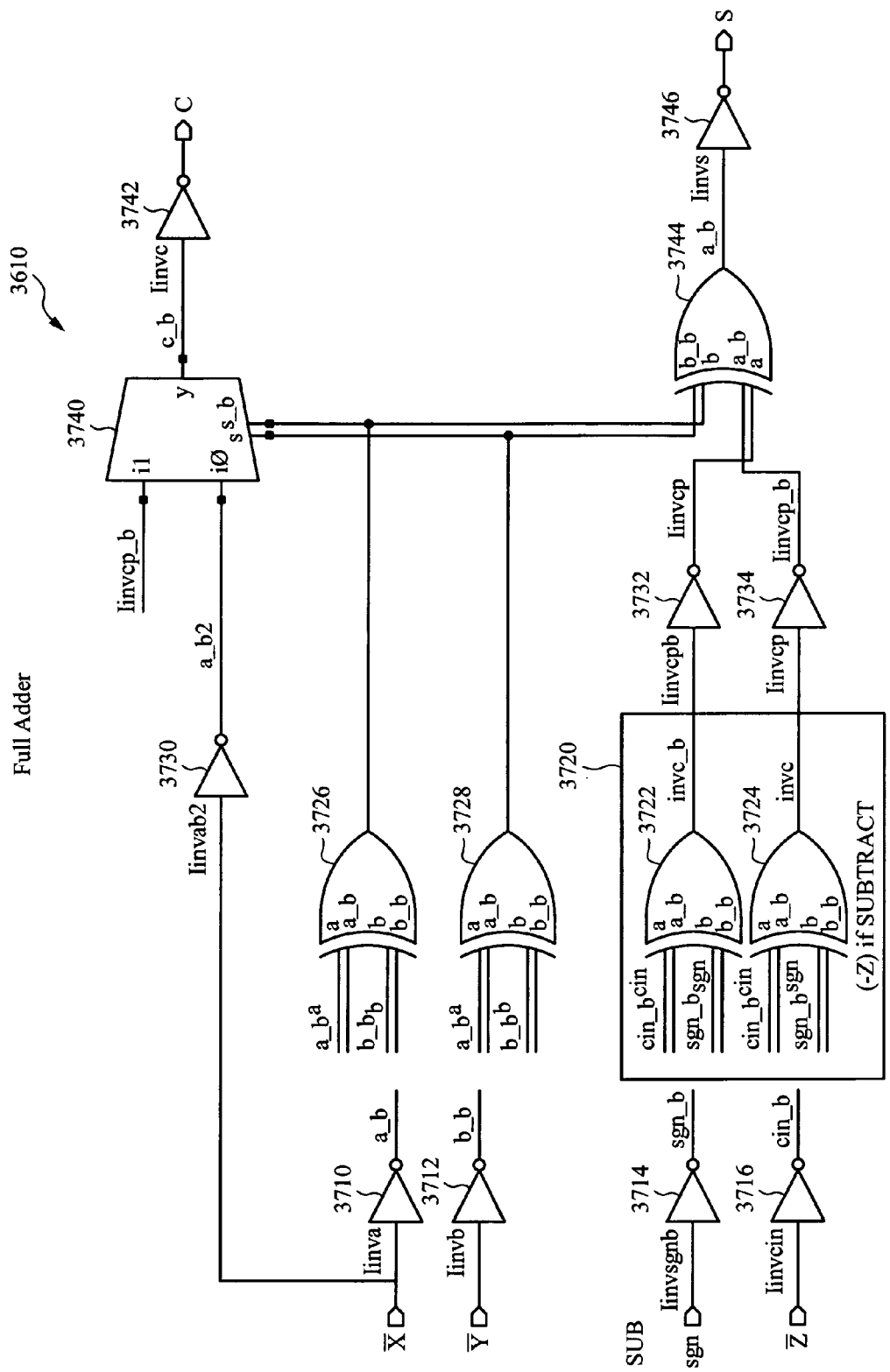
Figure 38:
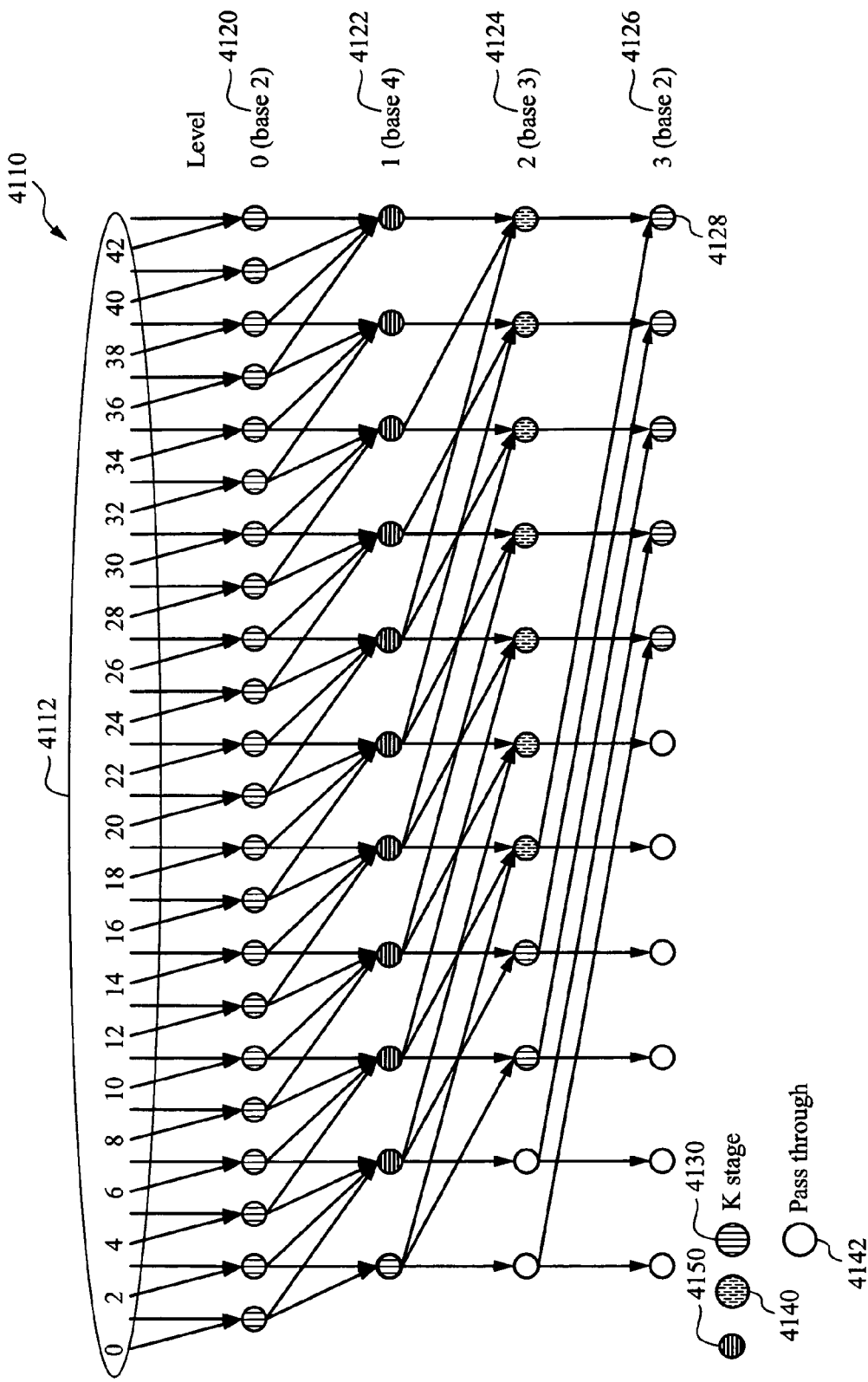
Figure 39:
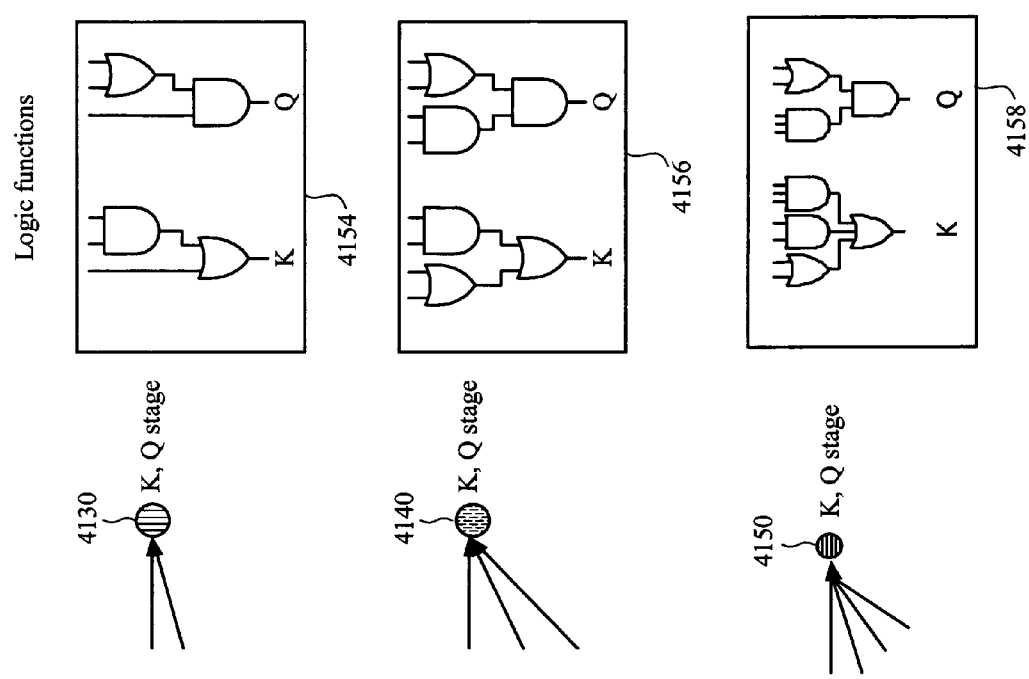
Figure 40:
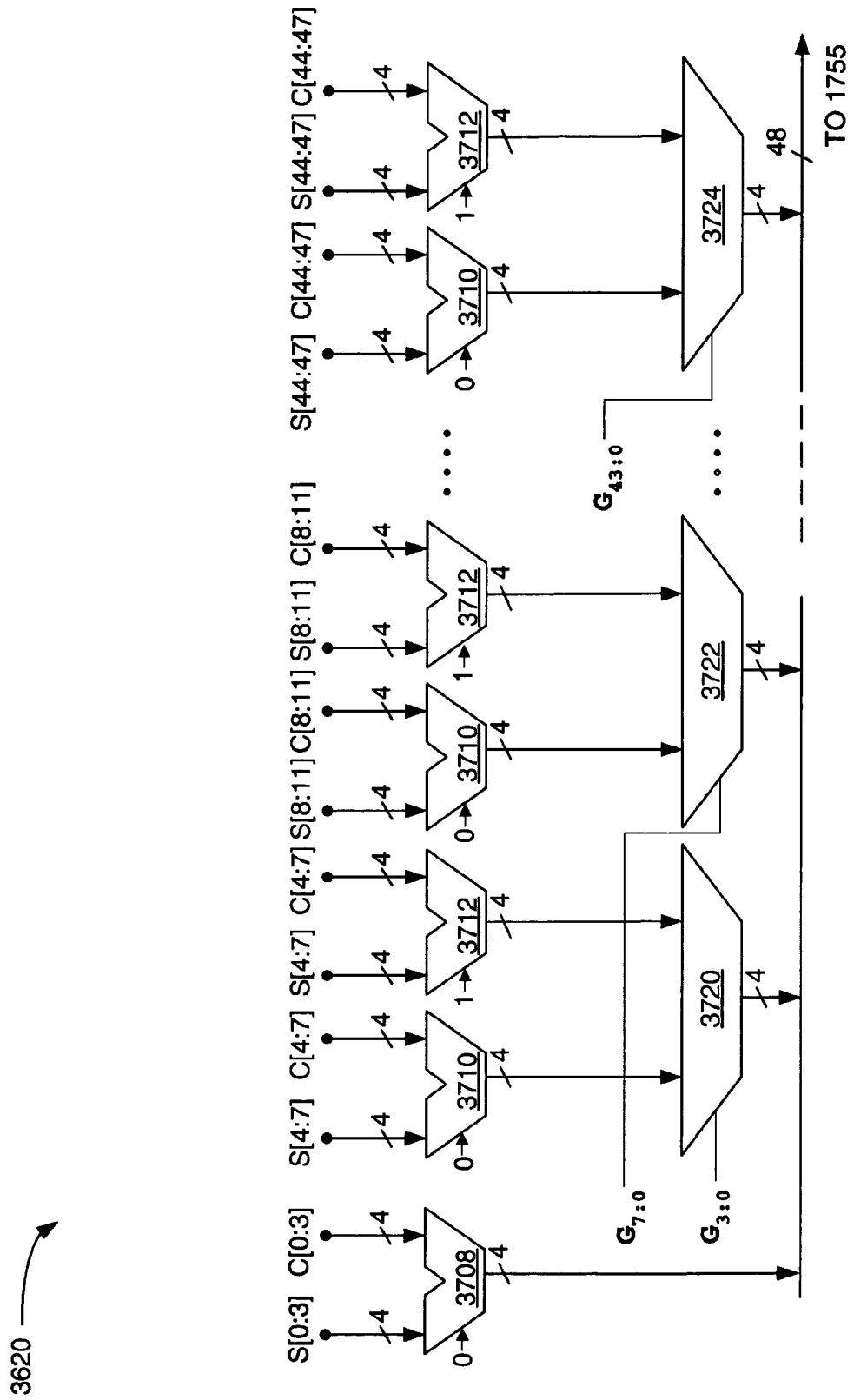
Figure 41:
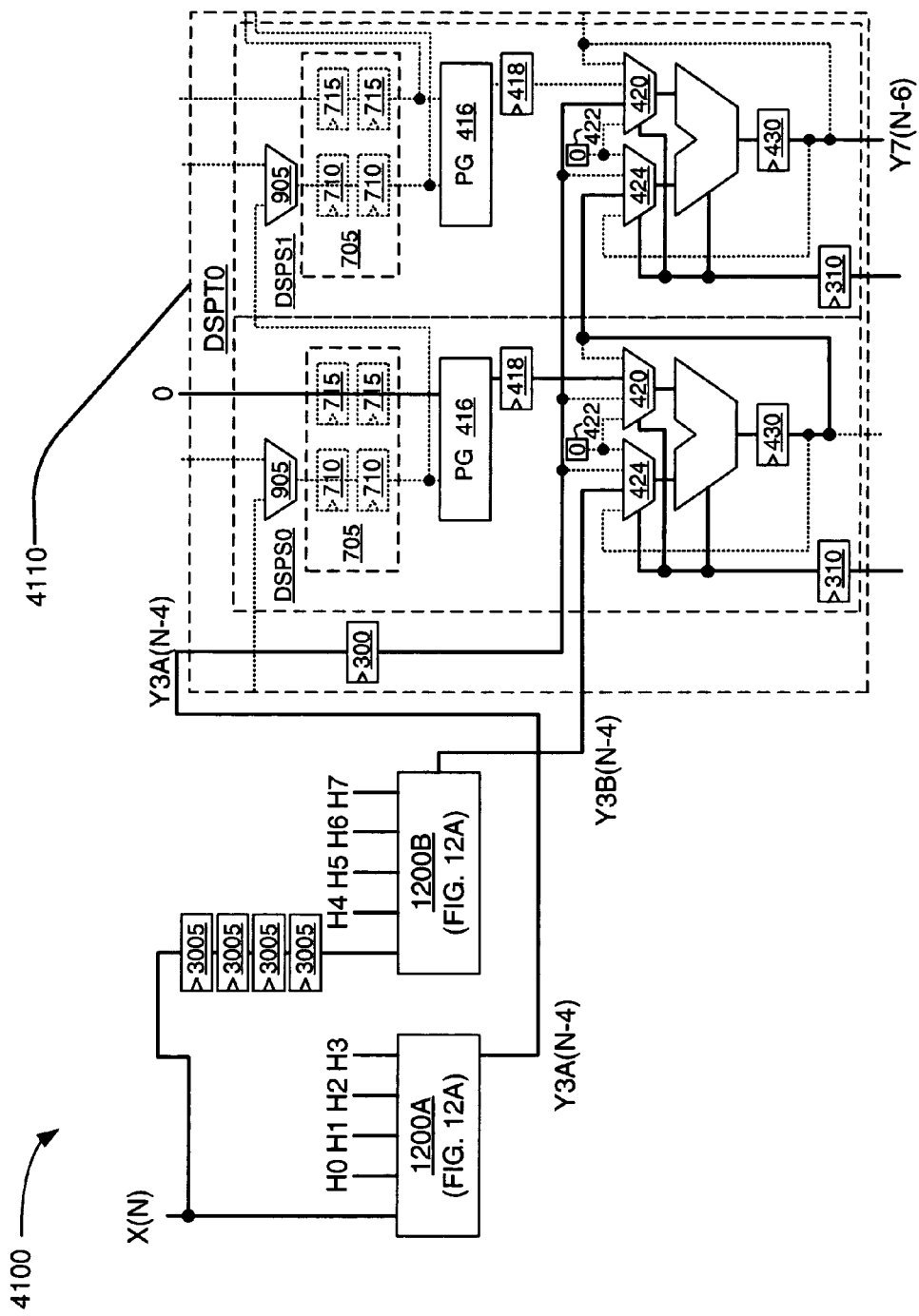

The FIG. 33A shows the floor plan for the (15,4) counter;

FIGS. 33B-33E shows the circuit diagrams for the LSBs;

FIG. 34 is a schematic of a (4,2) compressor;

FIG. 35A shows four columns of FIG. 30 and how the outputs of some of the counters of stage 1 map to some of the compressors of stages 2 and 3;

FIG. 35B is a schematic that focuses on the [4,2] compressor of bit 19 of FIG. 35A;

FIG. 36 is a schematic of an expanded view of the adder of FIG. 25;

FIG. 37 is a schematic of the 1-bit full adder of FIG. 36;

FIG. 38 is the structure for generation of K for every 4 bits;

FIG. 39 shows the logic function associated with each type of K (and Q) stage;

FIG. 40 is an expanded view of an example of the CLA of FIG. 36;

FIG. 41 depicts a pipelined, eight-tap FIR filter to illustrate the ease with which DSP slices and tiles disclosed herein scale to create more complex filter organizations.

DETAILED DESCRIPTION

The following discussion is divided into five sections, each detailing methods and systems for providing improved DSP performance and lower power dissipation. These embodiments are described in connection with a field-programmable gate array (FPGA) architecture, but the methods and circuits described herein are not limited to FPGAs; in general, any integrated circuit (IC) including an application specific integrated circuit (ASIC) and/or an IC which includes a plurality of programmable function elements and/or a plurality of programmable routing resources and/or an IC having a microprocessor or micro controller, is also within the scope of the present invention. Examples of programmable function elements are CLBs, logic blocks, logic array blocks, macrocells, logic cells, logic cell arrays, multi-gigabit transceivers (MGTs), application specific circuits, and functional blocks. Examples of programmable routing resources include programmable interconnection points. Furthermore, embodiments of the invention may be incorporated into integrated circuits not typically referred to as programmable logic, such as integrated circuits dedicated for use in signal processing, so-called "systems-on-a-chip," etc.

For illustration purposes, specific bus sizes are given, for example 18 bit input buses and 48 bit output buses, and example sizes of registers are given such as 7 bits for the Opmode register, however, it should be clear to one of ordinary skill in the arts that many other bus and register sizes may be used and still be within the scope of the present invention.

DSP Architecture with Cascadina DSP Slices

Figure 1A:
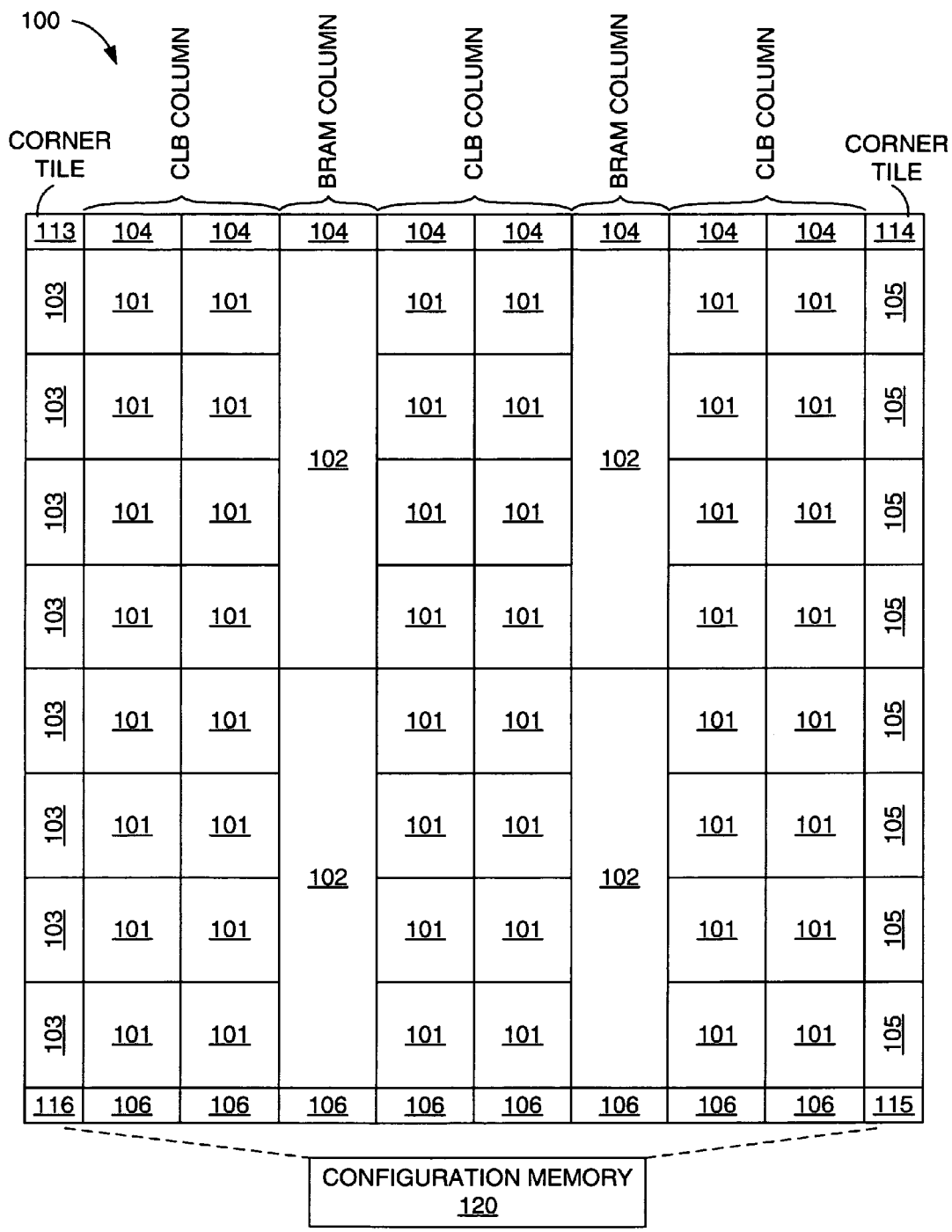
FIG. 1A (prior art) is a block diagram of a field-programmable gate array (FPGA) 100, a popular type of PLD.
Figure 1B:
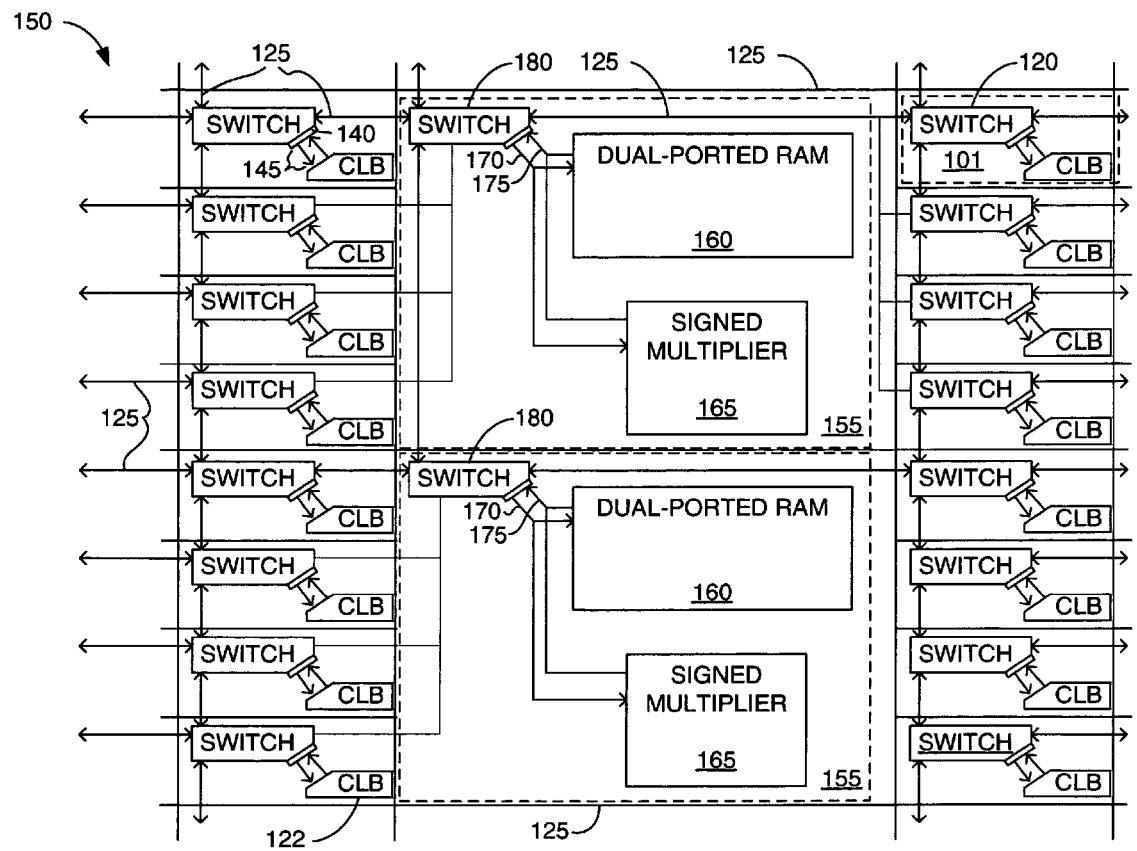
FIG. 1B (prior art) depicts an FPGA adapted to support DSP functions in a manner that frees up general-purpose logic and resources.
Figure 1C:
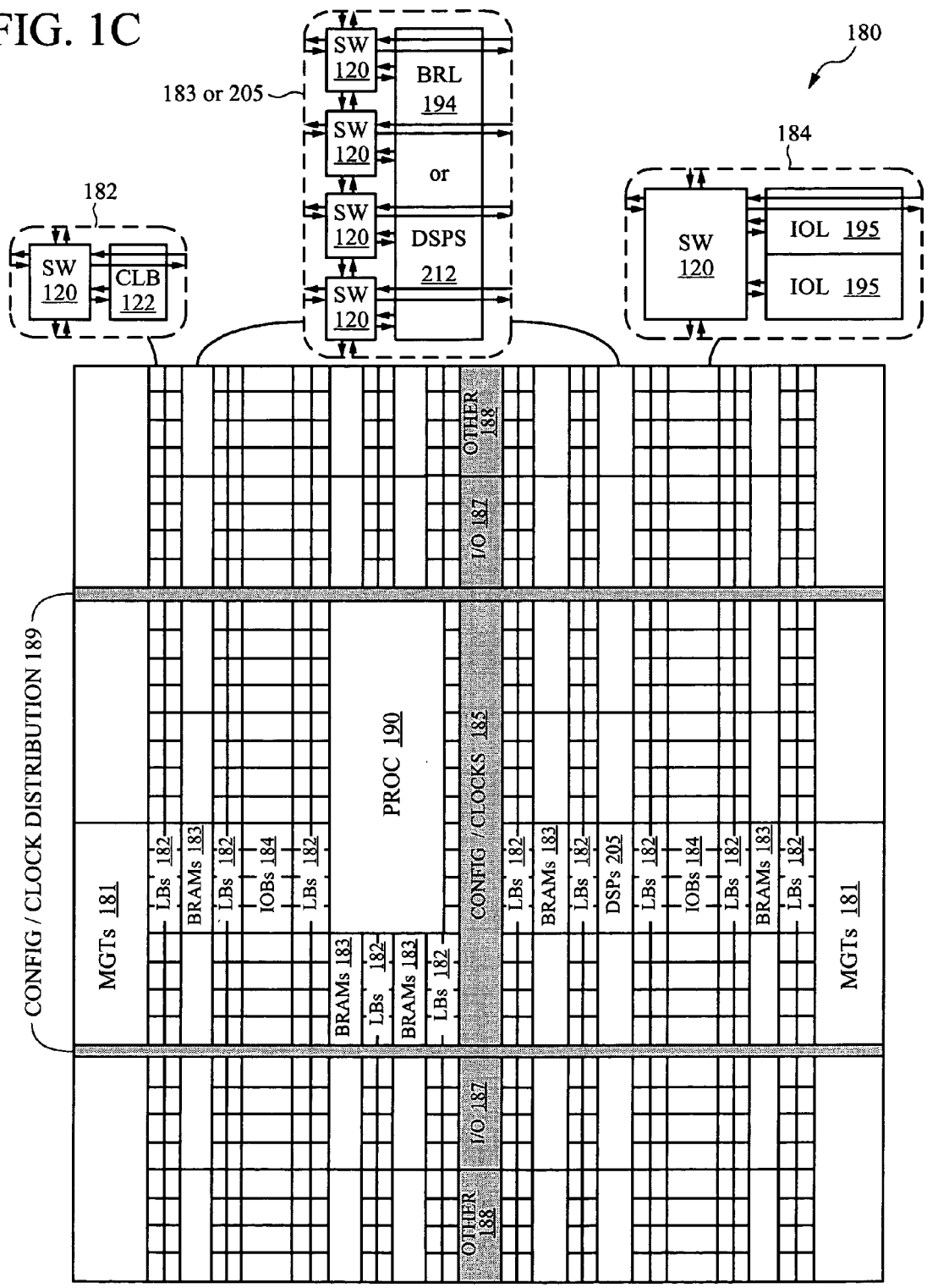
FIG. 1C is a simplified schematic of an FPGA of an embodiment of the present invention.

FIG. 1C is a simplified schematic of an FPGA of an embodiment of the present invention. FIG. 1C illustrates an FPGA architecture 180 that includes a large number of different programmable tiles including multi-gigabit transceivers (MGTs 181), programmable logic blocks (LBs 182), random access memory blocks (BRAMs 183), input/output blocks (IOBs 184), configuration and clocking logic (CONFIG/CLOCKS 185), digital signal processing blocks (DSPs 205), specialized input/output blocks (I/O 187) (e.g., configuration ports and clock ports), and other programmable functions 188 such as digital clock managers, analog-to-digital converters, system monitoring logic, and so forth. Some FPGAs also include dedicated processor blocks (PROC 190).

In some FPGAs, each programmable tile includes programmable interconnect elements, i.e., switch (SW) 120 having standardized connections to and from a corresponding switch in each adjacent tile. Therefore, the switches 120 taken together implement the programmable interconnect structure for the illustrated FPGA. As shown by the example of a LB tile 182 at the top of FIG. 1C, a LB 182 can include a CLB 112 connected to a switch 120.

A BRAM 182 can include a BRAM logic element (BRL 194) in addition to one or more switches. Typically, the number of switches 120 included in a tile depends on the height of the tile. In the pictured embodiment, a BRAM tile has the same height as four CLBs, but other numbers (e.g., five) can also be used. A DSP tile 205 can include, for example, two DSP slices (DSPS 212) in addition to an appropriate number of switches (in this example, four switches 120). An IOB 184 can include, for example, two instances of an input/output logic element (IOL 195) in addition to one instance of the switch 120. As will be clear to those of skill in the art, the actual I/O pads connected, for example, to the I/O logic element 184 are manufactured using metal layered above the various illustrated logic blocks, and typically are not confined to the area of the input/output logic element 184.

In the pictured embodiment, a columnar area near the center of the die (shown shaded in FIG. 1C) is used for configuration, clock, and other control logic. Horizontal areas 189 extending from this column are used to distribute the clocks and configuration signals across the breadth of the FPGA.

Some FPGAs utilizing the architecture illustrated in FIG. 1C include additional functional blocks that disrupt the regular columnar structure making up a large part of the FPGA. The additional functional blocks can be programmable blocks and/or dedicated logic. For example, the processor block PROC 190 shown in FIG. 1C spans several columns of CLBs and BRAMs.

Note that FIG. 1C is intended to illustrate only an exemplary FPGA architecture. The numbers of functional blocks in a column, the relative widths of the columns, the number and order of columns, the types of functional blocks included in the columns, the relative sizes of the functional blocks, and the interconnect/logic implementations included at the top of FIG. 1C are purely exemplary. For example, in an actual FPGA more than one adjacent column of CLBs is typically included wherever the CLBs appear, to facilitate the efficient implementation of user logic. It should be noted that the term "column" encompasses a column or a row or any other collection of functional blocks and/or tiles, and is used for illustration purposes only.

Figure 2A:
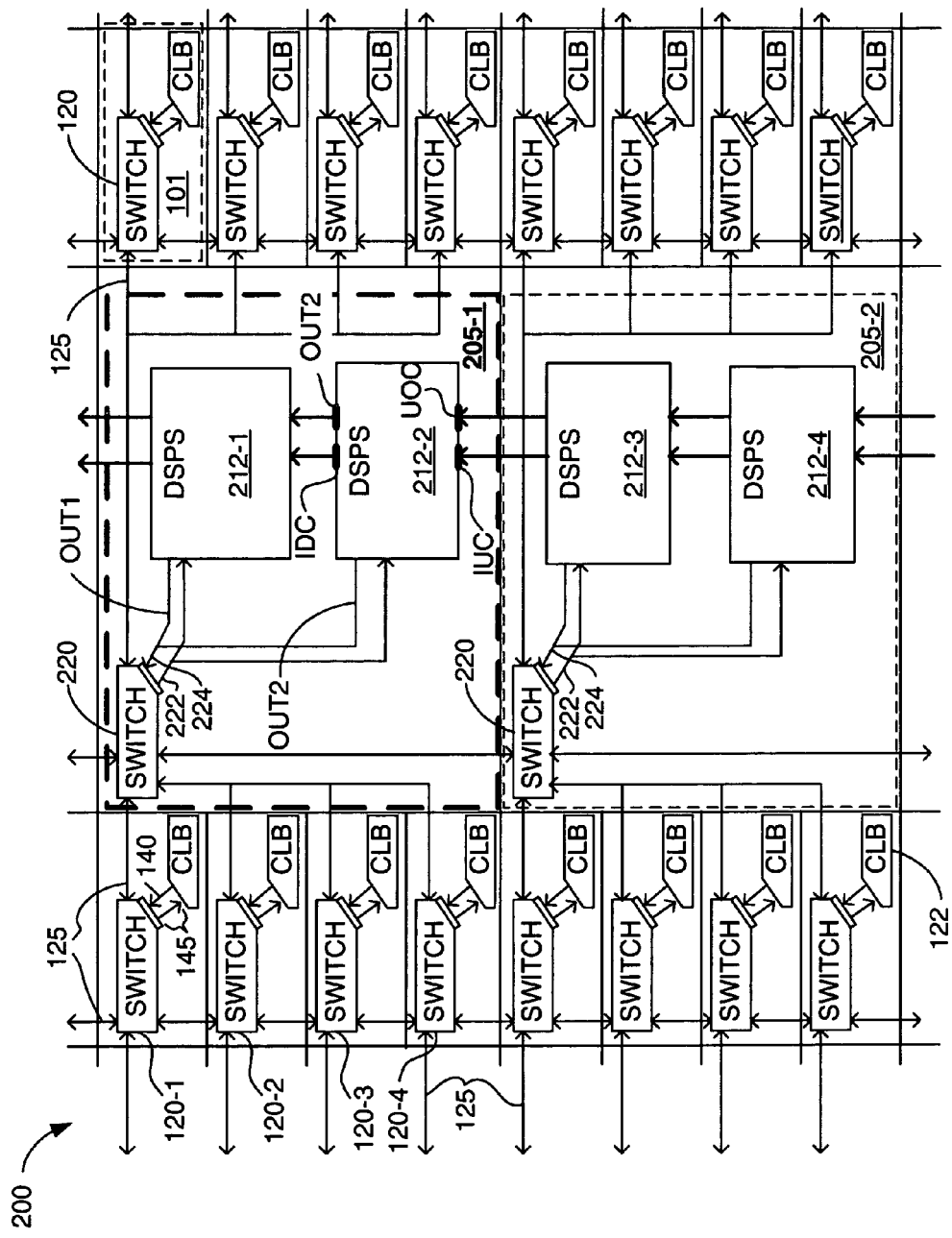
FIG. 2A depicts an FPGA in accordance with an embodiment that supports cascading of DSP resources to create complex DSP circuits of varying size and complexity.

FIG. 2A depicts an FPGA 200 in accordance with an embodiment that supports cascading of DSP resources to create complex DSP circuits of varying size and complexity. Cascading advantageously causes the amount of resources required to implement DSP circuits to expand fairly linearly with circuit complexity. The part of the circuitry of FPGA 200 shown in FIG. 2A can be part of FPGA 100 of FIGS. 1A, and 1B in one embodiment, and part of FPGA 180 of FIG. 1C in another embodiment, with like-numbered elements being the same or similar. FPGA 200 differs from FPGA 100 in that FPGA 200 includes one or more columns of DSP tiles 205 (e.g., tiles 205-1 and 205-2, which are referred to collectively as DSP tiles 205) that support substantially direct, high-speed, cascade connections for reduced power consumption and improved speed performance. Each DSP tile 205 includes two DSP slices 212 (for example, DSP tile 205-1 has slices 212-1 and 212-2 and DSP tile 205-2 has slices 212-3 and 212-4) and each DSP slice connects to general interconnect lines 125 via switch matrices 220.

For tile 205-1 incoming signals arrive at slices 212-1 and 212-2 on input bus 222. Outgoing signals from OUT_1 and OUT_2 ports are connected to the general interconnect resources via output bus 224.

Respective input and output buses 222 and 224 and the related general interconnect may be too slow, area intensive, or power hungry for some applications. Each DSP slice 212, e.g., 212-1, 212-2, 212-3, and 212-4 (collectively, referred to as DSP slice 212), therefore includes two high-speed DSP-slice output ports input-downstream cascade (IDC) port and OUT port connected to an input-upstream cascade (IUC) port and an upstream-output-cascade (UOC) port, respectively, of an adjacent DSP slice. (As with other designations herein, IDC, accumulate feedback (ACC), IUC, and UOC refer both to signals and their corresponding physical nodes, ports, lines, or terminals; whether a given designation refers to a signal or a physical structure will be clear from the context.).

In the example of FIG. 2A, output port OUT connects directly from a selected DSP slice (e.g., slice 212-2) to port UOC of a downstream DSP slice (e.g., slice 212-1). In addition, the output port OUT from an upstream DSP slice (e.g., slice 212-3) connects directly to the port UOC of the selected DSP slice, e.g., 212-2. For ease of illustration, the terms "upstream" and "downstream" refer to the direction of data flow in the cascaded DSP slices, i.e., data flow is from upstream to downstream, unless explicitly stated otherwise. However, alternative embodiments include when data flow is from downstream to upstream or any combination of upstream to downstream or downstream to upstream. Output port OUT of each DSP slice 212 is also internally connected to an input port, e.g., accumulate feedback (ACC), of the same DSP slice (not shown). In some embodiments, a connection between adjacent DSP slices is a direct connection if the connection does not traverse the general interconnect, where general interconnect includes the programmable routing resources typically used to connect, for example, the CLBs. Direct connections can include intervening elements, such as delay circuits, inverters, or synchronous elements, that preserve a version of the data stream from the adjacent slice. In an alternative embodiment the connection between adjacent DSP slices may be indirect and/or may traverse the general interconnect.

Figure 2B:
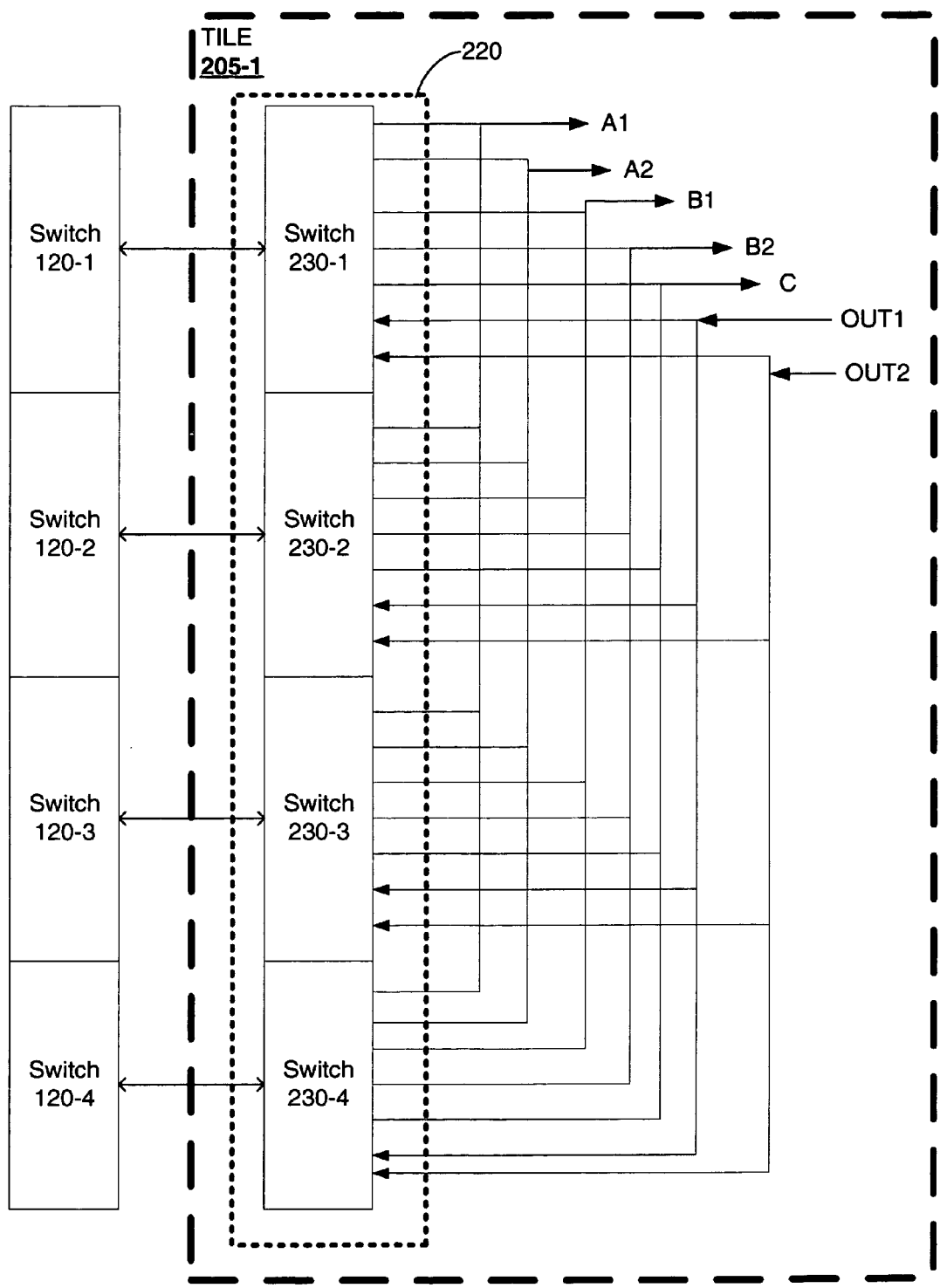
FIG. 2B is block diagram of an expanded view of a DSP tile switch of FIG. 2A.
Figure 3A:
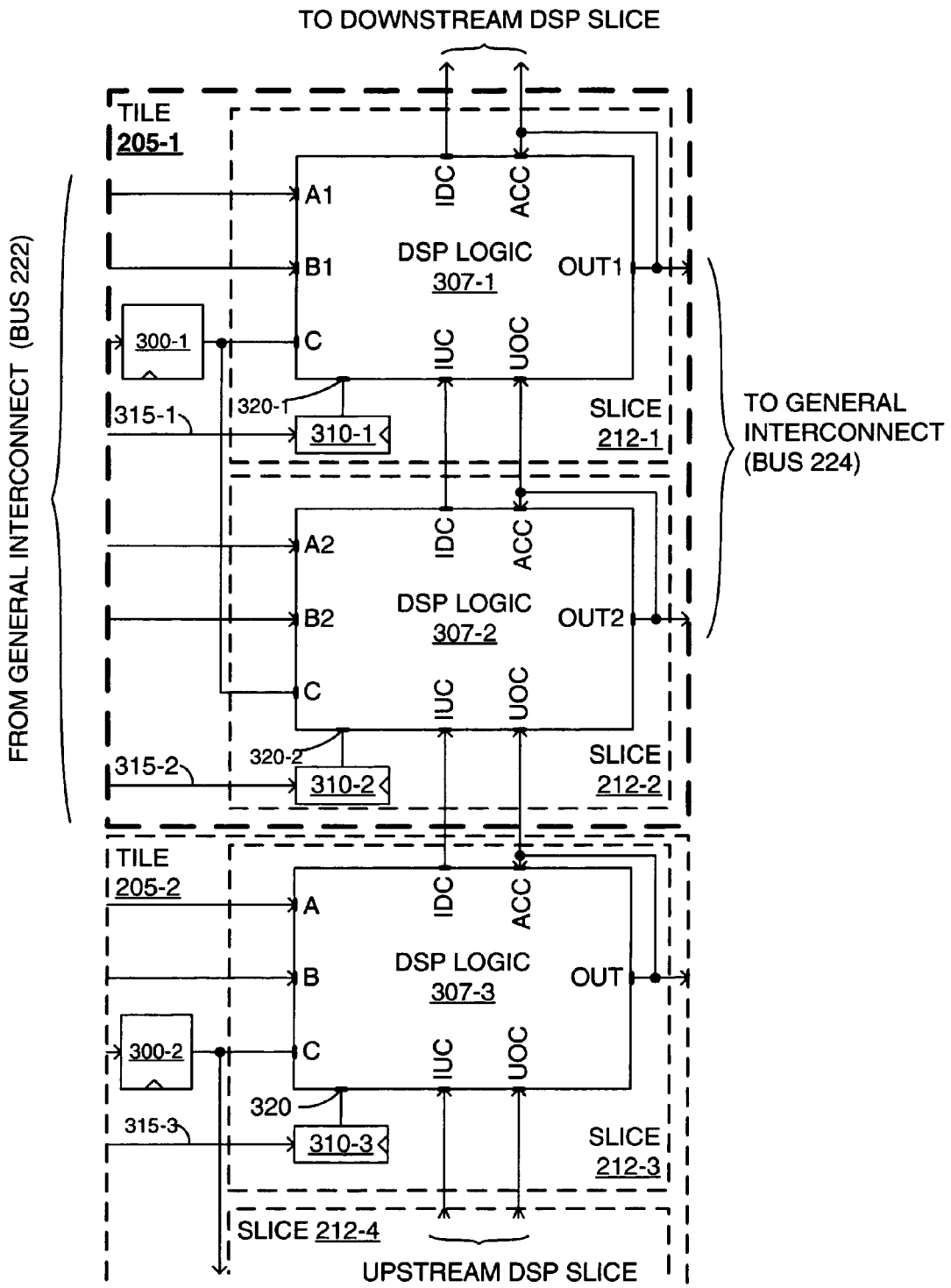
FIG. 3A details a pair of DSP tiles in accordance with one embodiment of FPGA of FIG. 2.

FIG. 2B is block diagram of an expanded view of switch 220 of FIG. 2A of tile 205-1. Tile 205-1 in one embodiment is four CLB tiles in length. Four switches in the four adjacent CLB tiles are shown in FIGS. 2A and B by switches 120-1, 120-2, 120-3, and 120-4. Switch 220 includes four switches 230-1, 230-2, 230-3, and 230-4 which are connected respectively to switches 120-1, 120-2, 120-3, and 120-4. The outputs of switch 220 is on bus 222 and is shown with reference to FIG. 3A as A1, A2, B1, B2 and C. A1 and A2 are each 18-bit inputs into A1 of DSP logic 307-1 and A2 of DSP Logic 307-2, respectively (FIG. 3A). B1 and B2 are each 18-bit inputs into B1 of DSP logic 307-1 and B2 of DSP Logic 307-2, respectively. The 48-bit output C in FIG. 2B is connected to register 300-1 in FIG. 3A. In one embodiment the output bits for A1, A2, B1, B2 and C are received in bits groups from switches 230-1 to 230-4. For example, the bit pitch, i.e., bits in a group, may be set at four in order to match a CLB bit pitch of four. OUT1 and OUT2 are received from DSP logic 307-1 and 307-2, respectively, in FIG. 3A and are striped across switches 230-1 to 230-4 in FIG. 2B.

FIG. 3A details a pair of DSP tiles 205-1 and 205-2 in accordance with one embodiment of FPGA 200 of FIG. 2. As in FIG. 2A, each DSP tile (called collectively tiles 205), e.g., 205-1, includes a pair of DSP slices (called collectively slices 212), e.g., 212-1 and 212-2. For purposes of illustration slice 212-2 has an upstream slice 212-3 and a downstream slice 212-1. Each slice, e.g., 212-2, in turn, includes some DSP logic, e.g., 307-2 (called collectively DSP logic 307) and a mode register, e.g., 310-2. Each mode register (called collectively mode registers 310), e.g., 310-2, applies control signals to a control port, e.g., 320-2, (called collectively control ports 320) of associated DSP logic, e.g., 307-2. The mode registers individually define the function of respective slices, and collectively define the function and connectivity of groups of slices. Each mode register is connected to the general interconnect via a mode bus 315 (which collectively represents mode buses 315-1, 315-2 and 315-3), and can consequently receive control signals from circuits external to slices 212.

On the input side, DSP logic 307 includes three operand input ports A, B, and C, each of which programmably connects to the general interconnect via a dedicated operand bus. Operand input ports C for both slices 212, e.g., slices 212-1 and 212-2, of a given DSP tile 205, e.g., tile 205-1, share an operand bus and an associated operand register 300, e.g., register 300-1 (i.e., the C register). On the output side, DSP logic 307, e.g., 307-1, and 307-2, has an output port OUT, e.g., OUT1 and OUT2, programmably connected to the general interconnect via bus 175.

Each DSP slice 212 includes the following direct connections that facilitate high-speed DSP operations:

Output port OUT, e.g., OUT2 of slice 212-2, connects directly to an input accumulate feedback port ACC and to an upstream-output-cascade port (UOC) of a downstream slice, e.g., 212-1.

An input-downstream cascade port (IDC) connects directly to an input-upstream cascade port IUC of a downstream slice, e.g., 212-1. Corresponding ports IDC and IUC from adjacent slices allow upstream slices to pass operands to downstream slices. Operation cascading (and transfer of operand data from one slice to another) is described below in connection with a number of figures, including FIG. 9.

Using FIG. 3A for illustration purposes, in another embodiment of the present invention, slices 212-1 and 212-3, are sub-modules or DSP elements, where structurally each sub-module is substantially identical. In an alternative embodiment, the two sub-modules may be substantially identical functionally. The two sub-modules have dedicated internal signal lines that connect the two sub-modules 212-1, and 212-2 together, for example the IDC to IUC and OUT to UOC signal lines. The two sub-modules form a module which has input and output ports. For example, input ports of the module are A, B, C, of each sub-module, 315-1 and 315-2 and output ports of the module are the OUT ports of sub-modules 212-1 and 212-2. The input and output ports of the module connect to signal lines external to the module and connect the module to other circuitry on the integrated circuit. In the case of a PLD, e.g., FPGA, the connection is to the general interconnect, i.e., the programmable interconnection resources that interconnect the other circuitry. In the case of an IC that is not a PLD, for example, an ASIC, this other circuitry may or may not include programmable functions and/or programmable interconnect resources. In yet another embodiment the module may include three or more sub-modules, e.g., 212-1, 212-2, and 212-3.

Figure 3B:
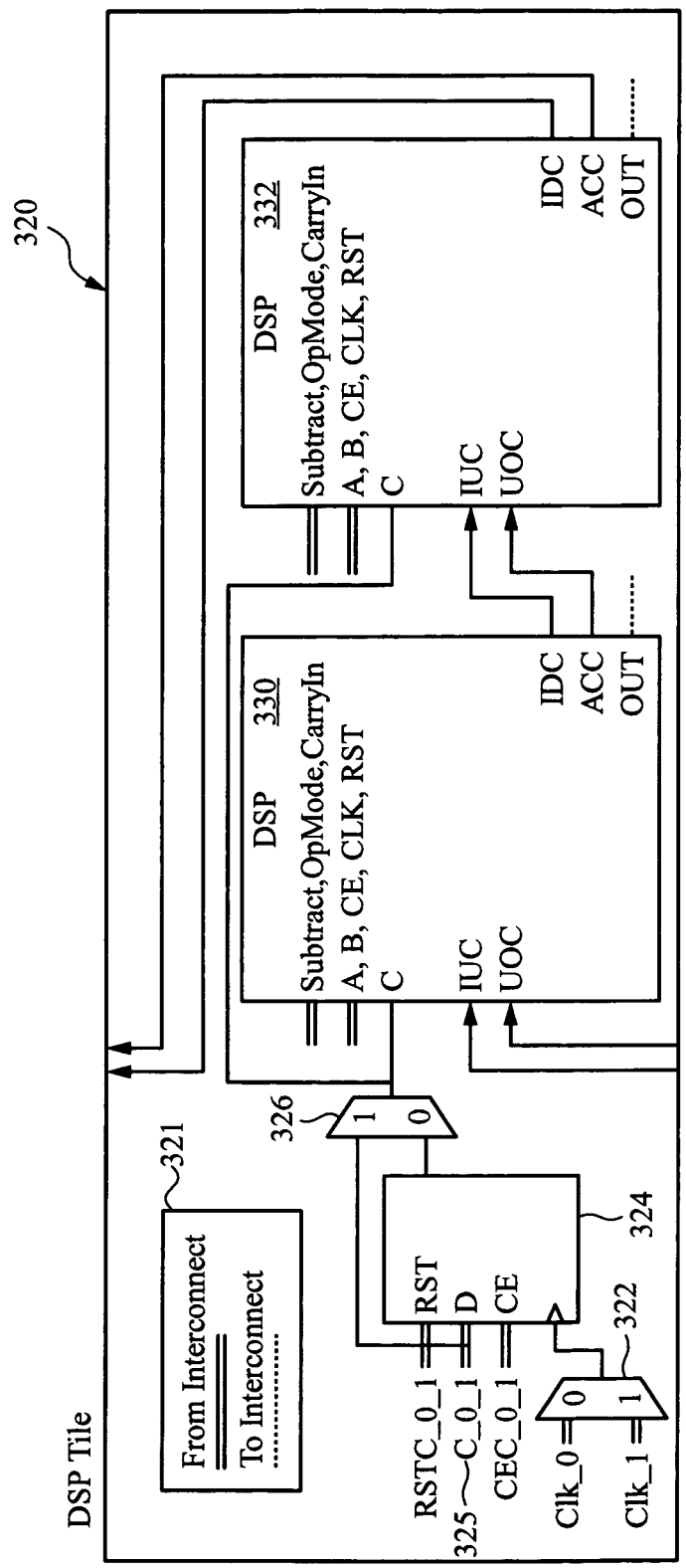
FIG. 3B is a block diagram of a DSP tile of another embodiment of the present invention.

FIG. 3B is a block diagram of a DSP tile 320 of another embodiment of the present invention. DSP tile 320 is an example of DSP tile 205 given in FIGS. 2 and 3. DSP tile 320 has a multiplexer 322 which selects from two clock inputs clk_0 and clk_1. The clock output of multiplexer 322 is input into the clock input of C register 324. C register 324 receives a C_0_1 data input 325. A second multiplexer 326 sends either the C data stored in C register 324 or the C_0_1 data input 325 to the C input of DSP slice 330 and DSP slice DSP 332. DSP slice 330 and DSP slice 332 have inputs A for A data, B for B data, subtract and carry-in control signals, and OpMode data (control data to dynamically control the functions of the slice). These inputs come from the general interconnect. The output data from DSP slice 330 and DSP slice 332 are output via an OUT port which drives the general interconnect. An embodiment of the FPGA programmable interconnect fabric is found in U.S. Pat. No. 5,914,616, issued Jun. 22, 1999 titled "FPGA programmable interconnect fabric," by Steve P. Young et. al., and U.S. Pat. No. 6,448,808 B2, issued Sep. 10, 2002," by Steve P. Young et. al., both patents of which are herein incorporated by reference.

DSP slice 330 receives data from an upstream DSP tile via the IUC and UOC input ports. DSP slice's 330 IDC and OUT output ports are connected to DSP slice's 332 IUC and UOC input ports, respectively. DSP slice 332 sends data to a downstream DSP tile via the IDC and OUT output ports.

Figure 3C:
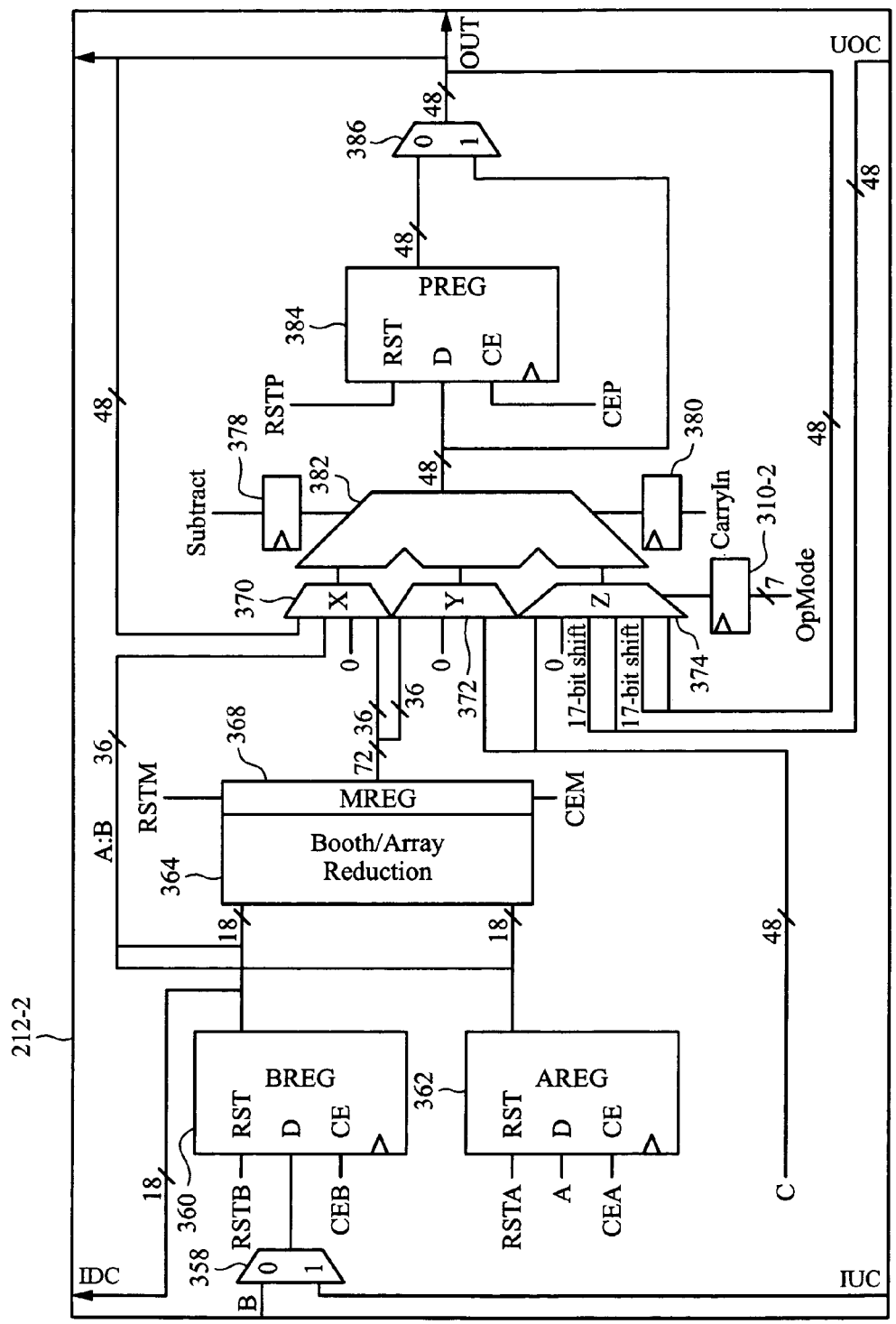
FIG. 3C is a schematic of a DSP element or a DSP slice of FIG. 3A of one embodiment of the present invention.

FIG. 3C is a schematic of a DSP element or a DSP slice 212-2 of FIG. 3A of one embodiment of the present invention. For ease of reference like labels are used in FIGS. 3B and 3C to represent like items. A multiplexer 358 selects 18-bit B input data or 18-bit IUC data from an upstream BREG (B register). The output of multiplexer 358 is stored in a BREG 360, i.e., a cascade of zero, one or more registers. The output of BREG 360 may be sent to a downstream slice via IDC or used as a first input into Booth/Array reduction unit 364 or both. 18-bit A input data is received by AREG (A register) 362, i.e., a cascade of zero, one or more registers, and the output of AREG 362 may be concatenated with the output of BREG 360 (A:B) to be sent to an X multiplexer (XMUX) 370 or used as a second input into Booth/Array reduction unit 364 or both. Booth/Array reduction unit 364 takes a 18-bit multiplicand and a 18-bit multiplier input and produces two 36-bit partial product outputs which are stored in MREG 368, i.e., one or more registers. The first 36-bit partial product output of the two partial product outputs is sent to the X multiplexer (XMUX) 370 and the second 36-bit partial product output of the two partial product output is sent to a Y multiplexer (YMUX) 372. These two 36-bit partial product outputs are added together in adder/subtractor 382 to produce the product of the 18-bit multiplicand and 18-bit multiplier values stored in AREG 362 and BREG 360. In an alternative embodiment the Booth/Array reduction unit 364 is replaced with a multiplier that receives two 18-bit inputs and produces a single 36-bit product, that is sent to either the XMUX 370 or the YMUX 372.

In FIG. 3C there are three multiplexers, XMUX 370, YMUX 372, and ZMUX 374, which have select control inputs from OpMode register 310-2. OpMode register 310-2 is typically written to at the clock speed of the programmable fabric in full operation. The XMUX 370 selects at least part of the output of MREG 368 or a constant "0" or 36-bit A:B or the 48-bit feedback ACC from the output OUT of multiplexer 386. The YMUX 372 selects at least another part of the output of MREG 368, a constant "0", or a 48-bit input of C data. The ZMUX 374 selects the 48-bit input of C data, or a constant "0", or 48-bit UOC data from an upstream slice (17-bit right shifted or un-shifted) or the 48-bit feedback from the output OUT of multiplexer 386 (17-bit right shifted or un-shifted). The right shift is an arithmetic shift toward the LSB with sign extension. Multiplexers XMUX 370, YMUX 372, and ZMUX 374 each send a 48-bit output to adder/subtractor 382, which includes a carry propagate adder. Carry-in register 380 gives a carry-in input to adder/subtractor 382 and subtract register 378 indicates when adder/subtractor 382 should perform addition or subtraction. The 48-bit output of adder/subtractor 382 is stored in PREG 384 or sent directly to multiplexer 386. The output of PREG 384 is connected to multiplexer 386. The output of multiplexer 386 goes to output OUT which is both the output of slice 212-2 and the output to a downstream slice. Also OUT is fed back to XMUX 370 and to ZMUX 374 (i.e., there are two ACC feedback paths). In one embodiment, selection ports of multiplexers 358 and 386 are each connected to one or more configuration memory cells which are set or updated when the configuration memory for the FPGA is configured or reconfigured. Thus the selections in multiplexers 358 and 386 are controlled by logic values stored in the configuration memory. In an alternative embodiment, multiplexers 358 and 386 selection ports are connected to the general interconnect and may be dynamically modified.

Figure 3D:
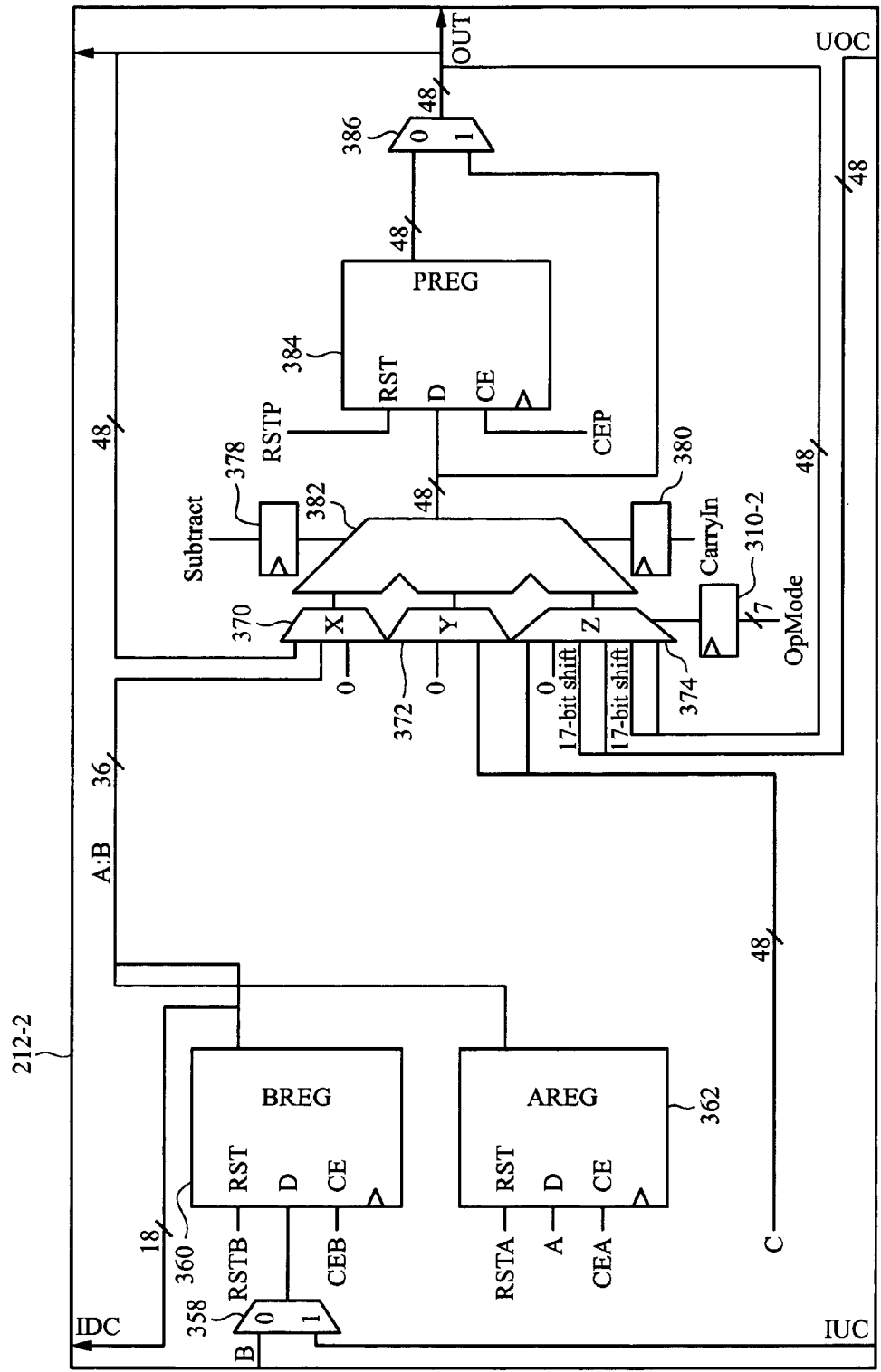
FIG. 3D is a schematic of a DSP slice of FIG. 3A of another embodiment of the present invention.

FIG. 3D is a schematic of a DSP slice 212-2 of FIG. 3A of another embodiment of the present invention. FIG. 3D is similar to FIG. 3C except that the Booth/Array Reduction 364 and MREG 368 are omitted. Hence FIG. 3D shows an embodiment of a slice without a multiplier.

Figure 3E:
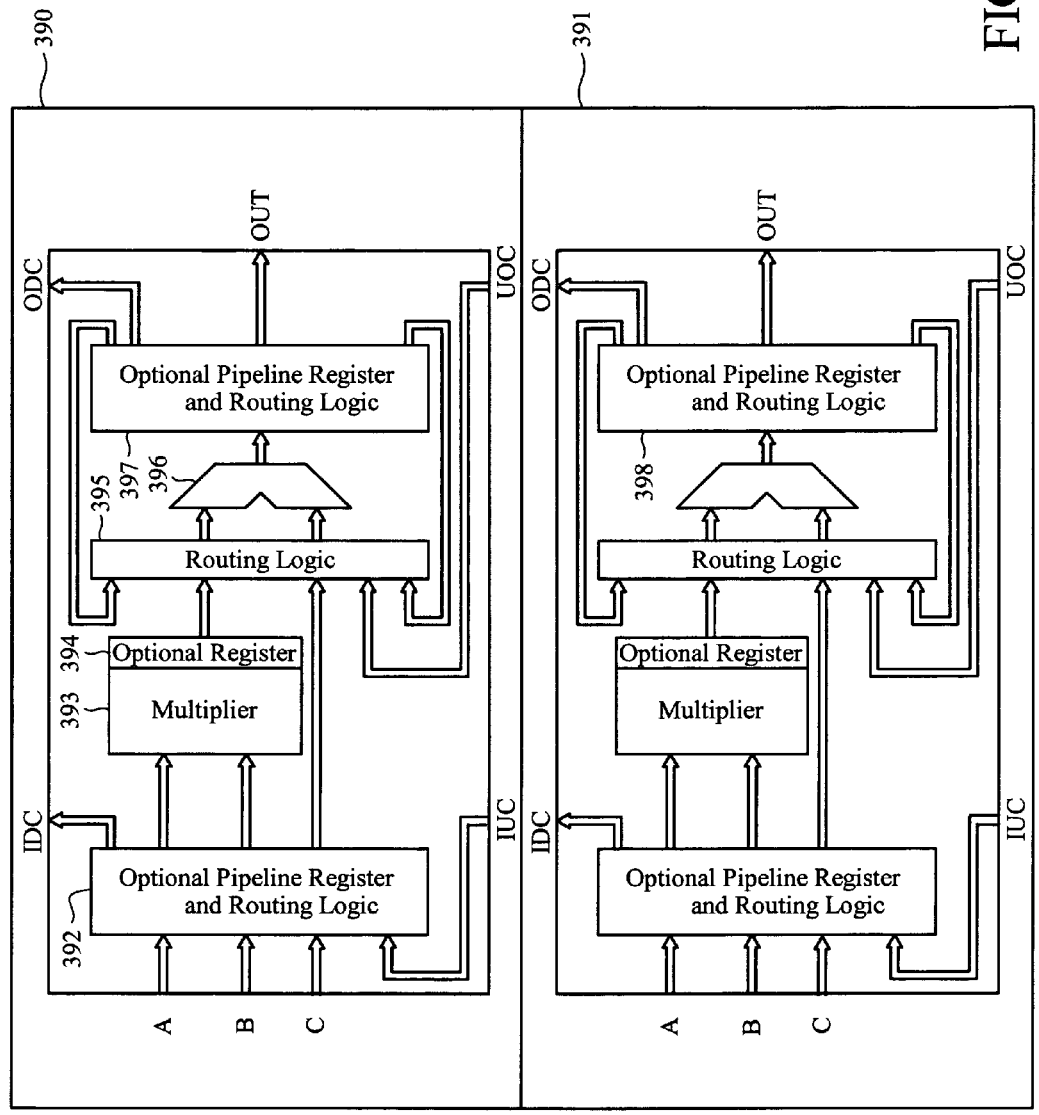
FIG. 3E is a block diagram of a DSP tile of yet another embodiment of the present invention.

FIG. 3E is a block diagram of a DSP tile of yet another embodiment of the present invention. DSP tile 205 has two elements or slices 390 and 391. In alternative embodiments a DSP tile may have one, two, or more slices per tile. Hence the number two (2) has been picked for only some embodiments of the present invention, other embodiments may have one, two or more slices per tile. Since DSP slice 391 is substantially the same or similar to DSP slice 390, only the structure of DSP slice 390 is described herein. DSP slice 390 includes optional pipeline registers and routing logic 392 which receives three data inputs A, B, and C from other circuitry on the IC, and one IUC data input from the IDC of DSP slice 391. Optional pipeline registers and routing logic 392 sends an IDC signal to another downstream slice (not shown), a multiplier and a multiplicand output signal to multiplier 393, and a direct output to routing logic 395. The routing logic 392 determines which input (A, B, C) goes to which output. The multiplier 393 may store the multiplier product in optional register 394, which in turn sends an output to routing logic 395. In this embodiment, the multiplier outputs a completed product and not two partial products.

Routing logic 395 receives inputs from optional register 394, UOC (this is connected to output-downstream cascade (ODC) port of optional pipeline register and routing logic 398 from slice 391), from optional pipeline register and routing logic 392 and feedback from optional pipeline register and routing logic 397. Two outputs from routing logic 395 are input into adder 396 for addition or subtraction. In another embodiment adder 396 may be replaced by an arithmetic logic unit (ALU) to perform logic and/or arithmetic operations. The output of adder 396 is sent to an optional pipeline register and routing logic 397. The output of optional pipeline register and routing logic 397 is OUT which goes to other circuitry on the IC, to routing logic 395 and to ODC which is connected to a downstream slice (not shown).

In an alternative embodiment the OUT of slice 390 can be directly connected to the C input (or A or B input) of an adjacent horizontal slice (not shown). Both slices have substantially the same structure. Hence in various embodiments of the present invention slices may be cascaded vertically or horizontally or both.

Figure 3F:
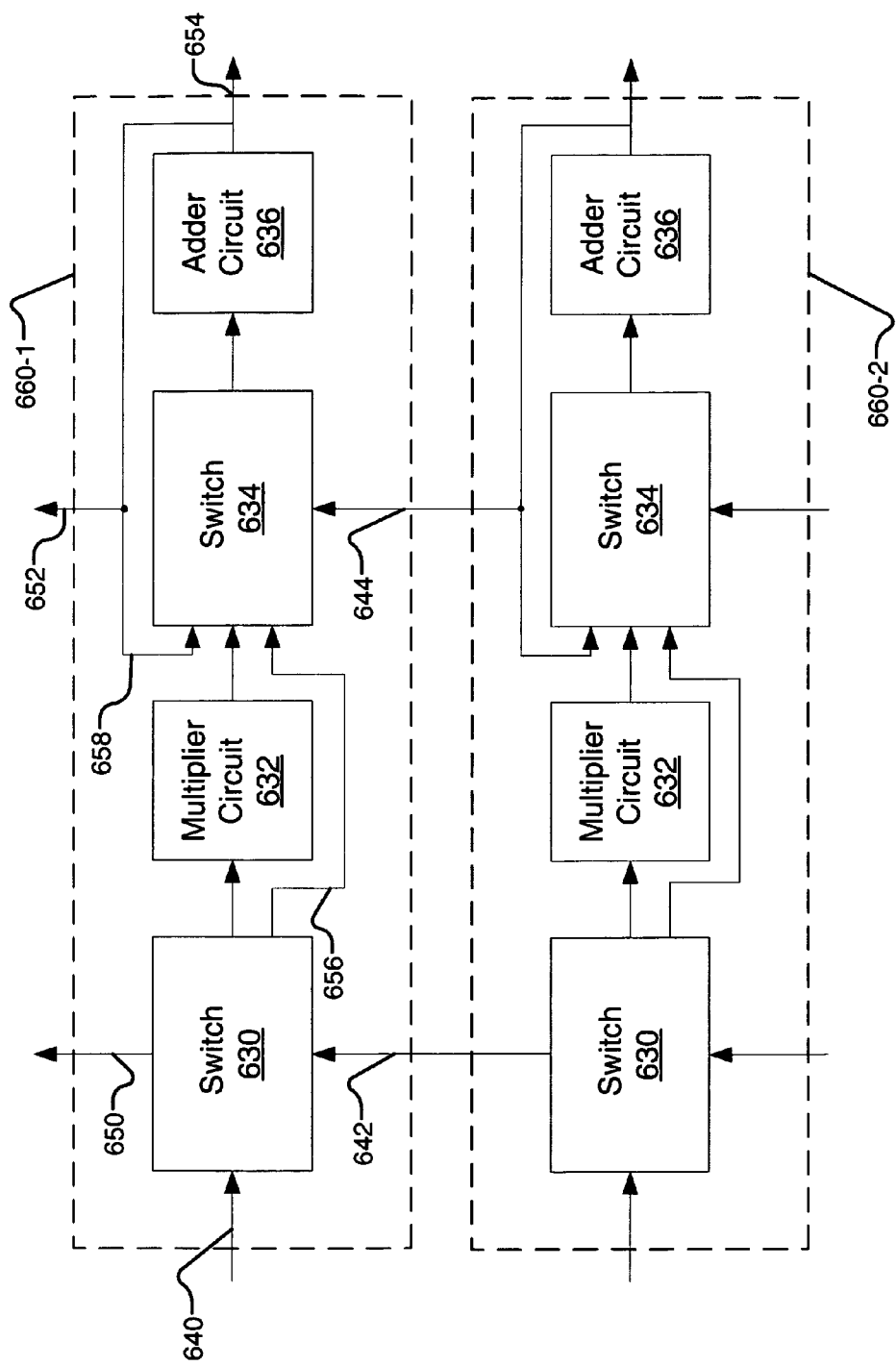
FIG. 3F shows two DSP elements of an embodiment of the present invention that have substantially identical structure.

FIG. 3F shows a plurality of DSP elements according to another embodiment of the present invention. FIG. 3F shows two DSP elements 660-1 and 660-2 that have substantially identical structure. Signal lines 642 and 644 interconnect the two DSP elements over dedicated signal lines. DSP element 660-1 includes a first switch 630 connected to a multiplier circuit 632 and a second switch 634 connected to an adder circuit 636, where the multiplier circuit 632 is connected to the second switch 634. The switches 630 and 634 are programmable by using, for example, a register, RAM, or configuration memory. Input data at an input data rate is received by DSP element 660-1 on input line 640 and the output data of DSP element 660-1 is sent on output line 654 at an output data rate. Input data from the DSP element 660-2 is received by DSP element 660-1 on signal lines 642 and 644 and output data from DSP element 660-1 to a third DSP element (not shown) above DSP element 660-1 is sent via dedicated signal lines 650 and 652. DSP element 660-1 also has an optional signal line 656 which may bypass multiplier circuit 632 and optional feedback signal line 658 which feeds the output 654 back into the second switch 634.

The first switch 632 and the second switch 634 in one embodiment include multiplexers having select lines connected to one or more registers. The registers' contents may be changed, if needed, on the order of magnitude of the input data rate (or output data rate). In another embodiment, the first switch 632 has one or more multiplexers whose select lines are connected to configuration memory cells and may only be changed by changing the contents of the configuration memory. A further explanation on reconfiguration is disclosed in U.S. patent application Ser. No. 10/377,857, entitled "Reconfiguration of a Programmable Logic Device Using Internal Control" by Brandon J. Blodget, et. al, and filed Feb. 28, 2003, which is herein incorporated by reference. Like in the previous embodiment, the second switch 634 has its select lines connected to a register (e.g., one or more flip-flops). In yet another embodiment, the first switch 632 and the second switch 634 select lines are connected to configuration memory cells. And in yet still another embodiment, the first switch 632 select lines are connected to a register and the second switch 634 select lines are connected to configuration memory cells.

The switches 630 and 634 may include input and/or output queues such as FIFOs (first-in-first-out queues), pipeline registers, and/or buffers. The multiplier circuit 632 and adder circuit 636 may include one or more output registers or pipeline registers or queues. In one embodiment the first switch 630 and multiplier circuit 632 are absent and the DSP element 660-1 has second switch 634 which receives input line 640 and is connected to adder circuit 636. In yet another embodiment multiplier circuit 632 and/or adder circuit 636 are replaced by arithmetic circuits, that may perform one or more mathematical functions.

Figure 3G:
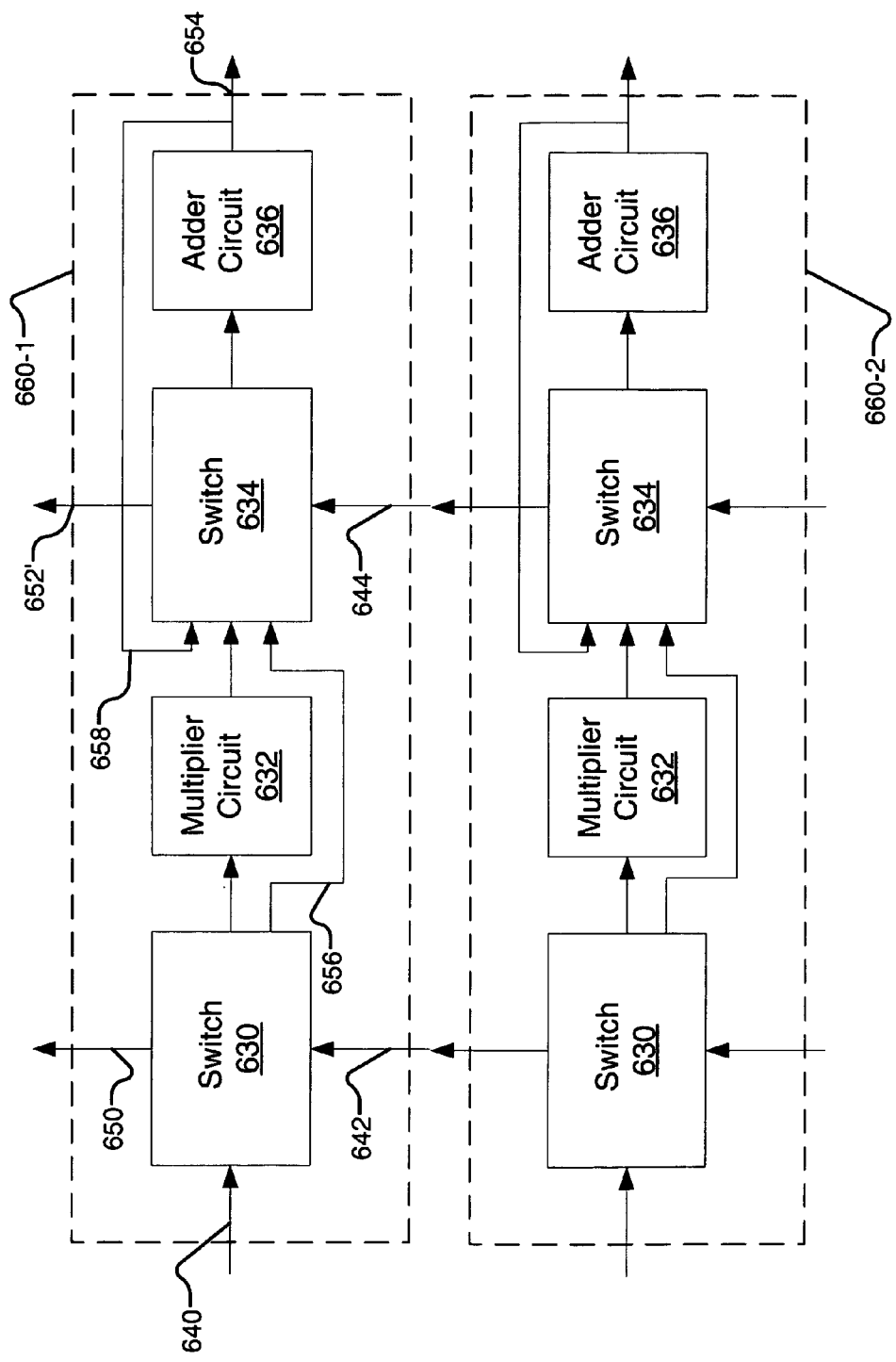
FIG. 3G shows a plurality of DSP elements according to yet another embodiment of the present invention.

FIG. 3G shows a plurality of DSP elements according to yet another embodiment of the present invention. FIG. 3G is similar to FIG. 3F, except that in FIG. 3F feedback signal 658 is connected to 652, while in FIG. 3G feedback signal 658 is not connected to 652'.

As stated earlier embodiments of the present invention are not limited to PLDs or FPGAs, but also include ASICs. In one embodiment, the slice design such as those shown in FIGS. 3A-3F, for example slice 212-2 in FIG. 3D and/or the tile design having one or more slices, may be stored in a hardware description language or other computer language in a library for use as a cell library component in a standard-cell ASIC design or as library module in a structured ASIC. In another embodiment, the DSP slice and/or tile may be part of a mixed IC design, which has both mask-programmed standard-cell logic and field-programmable gate array logic on a single silicon die.

Figure 4:
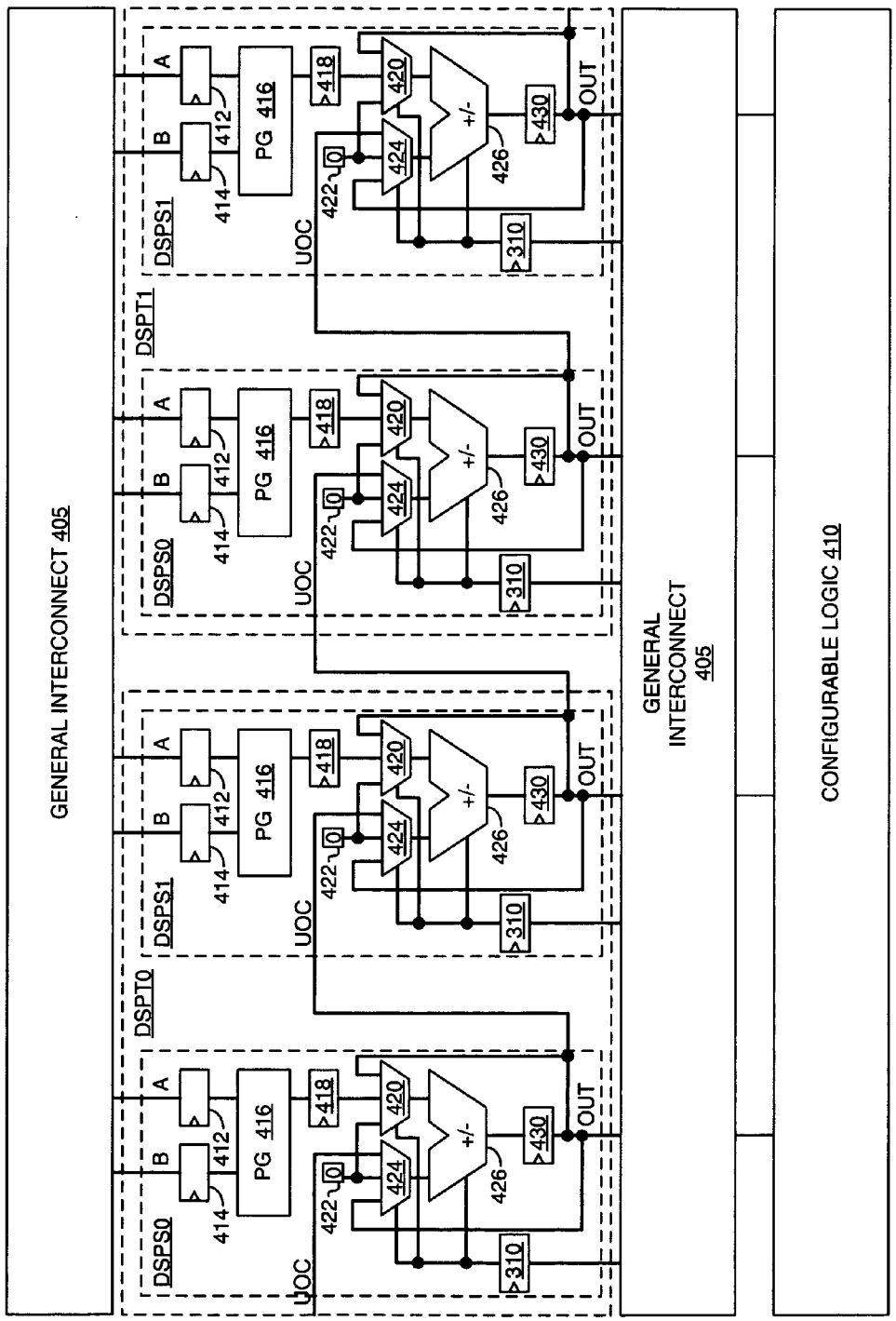
FIG. 4 is a simplified block diagram of a portion of a FPGA in accordance with one embodiment.

FIG. 4 is a simplified block diagram of a portion of an FPGA 400 in accordance with one embodiment. FPGA 400 conventionally includes general interconnect resources 405 having programmable interconnections, and configurable logic 410, and in accordance with one embodiment includes a pair of cascade-connected DSP tiles DSPT0 and DSPT1. Tiles DSPT0 and DSPT1 are similar to tiles 205-1 and 205-2 of FIG. 3A, with like-identified elements being the same or similar.

Tiles DSPT0 and DSPT1 are identical, each including a pair of identical DSP slices DSPS0 and DSPS1. Each DSP slice in turn includes:
  a. a pair of operand input registers 412 and 414 connected to respective operand input ports A and B;
  b. a product generator 416 having a multiplicand port connected to register 412, a multiplier port connected to register 414, and a product port connected to a pipeline register 418;
  c. a first multiplexer 420 having a first input port in which each input line (not shown) is connected to a voltage level 422 representative of a logic zero, a second input port connected to pipeline register 418, and a third input port (a first feedback port) connected to output port OUT;
  d. a second multiplexer 424 having a first input port connected to output port OUT (a second feedback port), a second input port connected to voltage level 422, and a third input port that serves as the upstream-output cascade port UOC, which connects to the output port OUT of an upstream DSP slice; and
  e. an adder 426 having a first addend port connected to multiplexer 420, a second addend port connected to multiplexer 424, and a sum port connected to output port OUT via a DSP-slice output register 430.

Mode registers 310 connect to the select terminals of multiplexers 420 and 424 and to a control input of adder 426. FPGA 400 can be initially configured so that slices 212 define a desired DSP configuration; and control signals are loaded into mode registers 310 initially and at any further time during device operation via general interconnect 405.

Figure 5A:
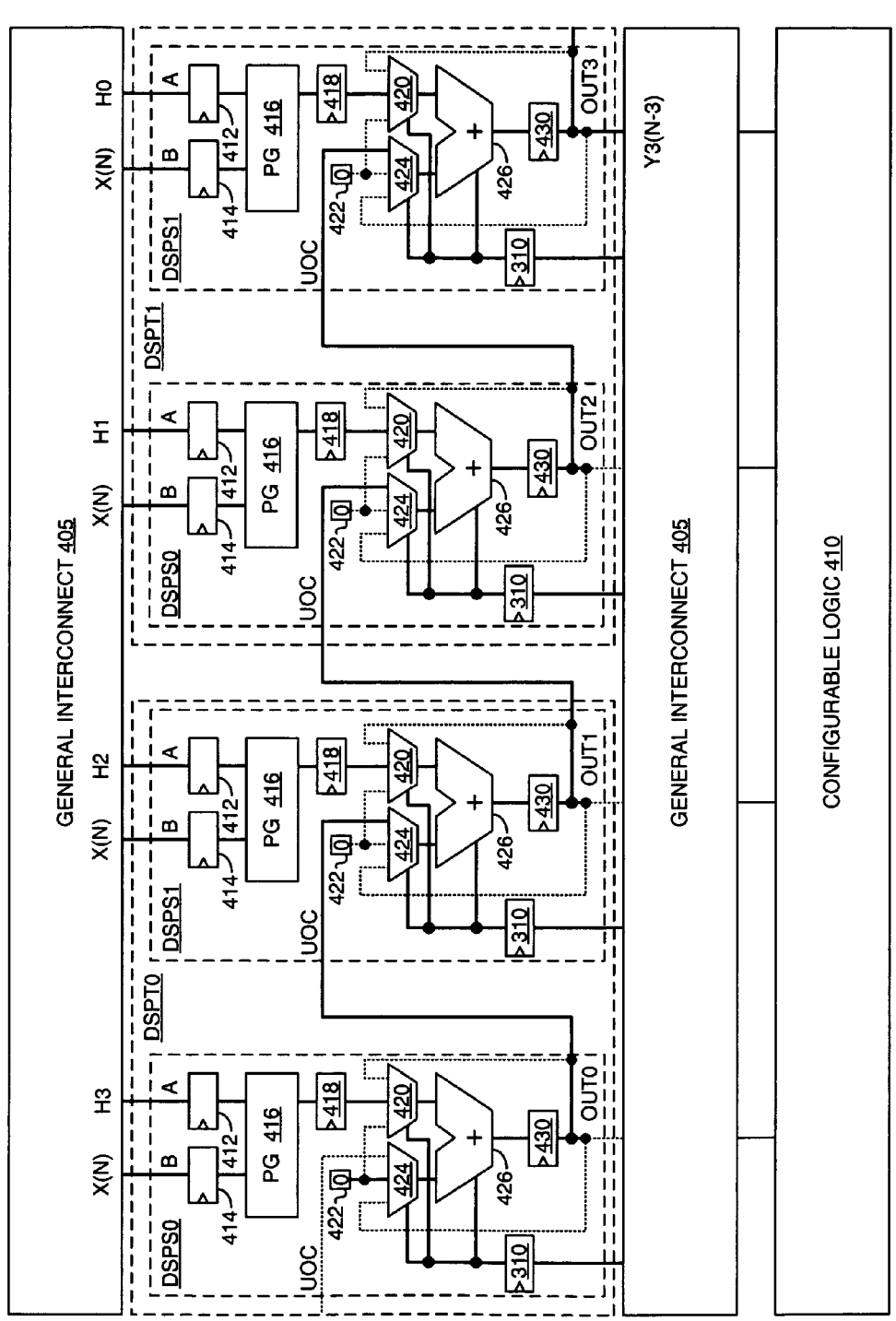
FIG. 5A depicts FPGA of FIG. 4 adapted to instantiate a transposed, four-tap, finite-impulse-response (FIR) filter in accordance with one embodiment.

FIG. 5A depicts FPGA 400 of FIG. 4 adapted to instantiate a transposed, four-tap, finite-impulse-response (FIR) filter 500 in accordance with one embodiment. The elements of FIG. 5A are identical to those of FIG. 4, but the schematics differ for two reasons. First, general interconnect 405 of FIG. 5A is configured to deliver a data series X(N) and four filter coefficients H0-H3 to the DSP slices. Second, FIG. 5A assumes mode registers 310 each store control signals, and that these control signals collectively define the connectivity and functionality required to implement the transposed FIR filter. Signal paths and busses employed in filter 500 are depicted as solid lines, whereas inactive (unused) resources are depicted as dotted lines.

In slice DSPS0 of tile DSPT0, mode register 310 contains mode control signals that operate on multiplexers 420 and 424 and adder 426 to cause the slice to add the product stored in pipeline register 418 to the logic-zero voltage level 422 (i.e., to add zero to the contents of register 418). The mode registers 310 of each of the three downstream slices include a different sets of mode control signals that cause each downstream slice to add the product in the respective pipeline register 418 to the output of the upstream slice.

FIG. 5B is a table 550 illustrating the function of the FIR filter of FIG. 5A. Filter 500 produces the following output signal Y3(N−3) in response to a data sequence X(N):

$$Y3(N-3)=X(N)H0+X(N-1)H1+X(N-2)H2+X(N-3)H3 \quad (1)$$

Table 550 provides the output signals OUT0, OUT1, OUT2, and OUT3 of corresponding DSP slices of FIG. 5A through eleven clock cycles 0-10. Transposed FIR filter algorithms are well known to those skilled in signal processing. For a detailed discussion of transposed FIR filters, see U.S. Pat. No. 5,339,264 to Said and Seckora, entitled "Symmetric Transposed FIR Filter," which is incorporated herein by reference.

Beginning at clock cycle zero, the first input X(0) is latched into each register 414 in the four slices and the four filter coefficients H0-H3 are each latched into one of registers 412 in a respective slice. Each data/coefficient pair is thus made available to a respective product generator 416. Next, at clock cycle one, the products from product generators 416 are latched into respective registers 418. Thus, for example, register 418 within the left-most DSP slice stores product X(0) H3. Up to this point, as shown in Table 550, no data has yet reached product registers 430, so outputs OUT0-OUT3 provide zeroes from each respective slice.

Adders 426 in each slice add the product in the respective register 418 with a second selected addend. In the left-most slice, the selected addend is a hard-wired number zero, so output register 430 captures the contents of register 418, or X0*H3, in clock cycle two and presents this product as output OUT1. In the remaining three slices, the selected addend is the output of an upstream slice. The upstream slices all output zero prior to receipt of clock cycle zero, so the right-most three slices latch the contents of their respective registers 418 into their respective output registers 430.

The cascade interconnections between slices begin to take effect upon receipt of clock cycle 3. Each downstream slice sums the output from the upstream slice with the product stored in the respective register 418. The products from upstream slices are thus cascaded and summed until the right-most DSP slice provides the filtered output Y3(N−3) on a like-named output port. For ease of illustration, FIR filter 500 is limited to two tiles DSPT0 and DSPT1 instantiating a four-tap filter. DSP circuits in accordance with other embodiments include a great many more DSP tiles, and thus support filter configurations having far more taps. Assuming additional tiles, FIR filter 500 of FIG. 5A can easily be extended to include more taps by cascade connecting additional DSP slices. The importance of this aspect of the invention is highlighted below in the following discussion of a DSP architecture that employs adder trees in lieu of cascading.

Figure 5C:
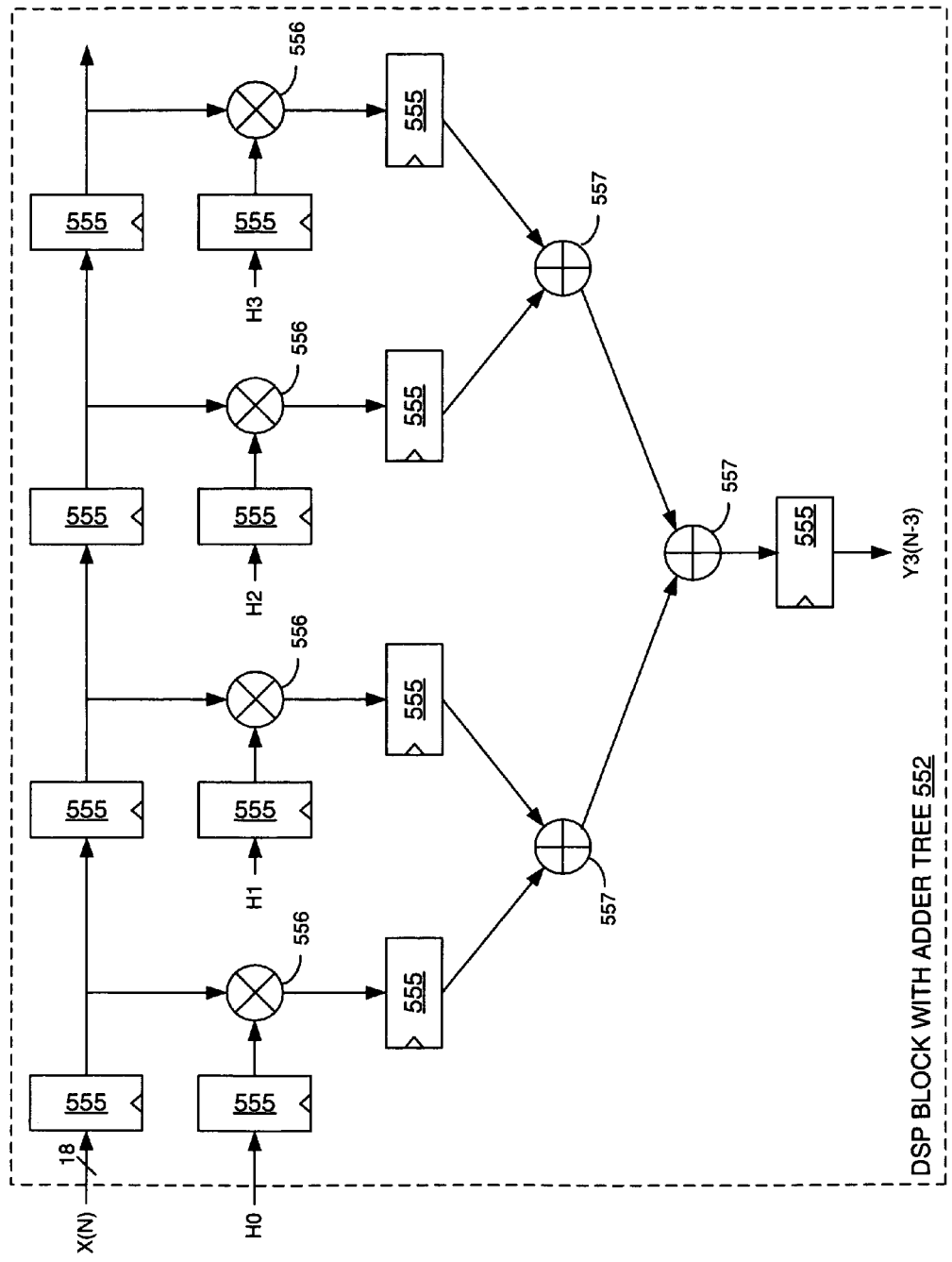
FIG. 5C (prior art) is a block diagram of a conventional DSP element adapted to instantiate an 18-bit, four-tap FIR filter.

FIG. 5C (prior art) is a block diagram of a conventional DSP element 552 adapted to instantiate an 18-bit, four-tap FIR filter. DSP element 552, similar to DSP elements used in a conventional FPGA, employs an adder-tree configuration instead of the cascade configurations described in connection with e.g. FIGS. 5A and 5B. DSP element 552 includes a number of registers 555, multipliers 556, and adders 557. The depicted FIR configuration is well understood by those of skill in the art; a functional description of FIG. 5C is therefore omitted for brevity. DSP element 552 works well for small filters, such as the depicted four-tap FIR filter, but combining multiple DSP elements 552 to implement larger filters significantly reduces speed performance and increases power dissipation.

Figure 5D:
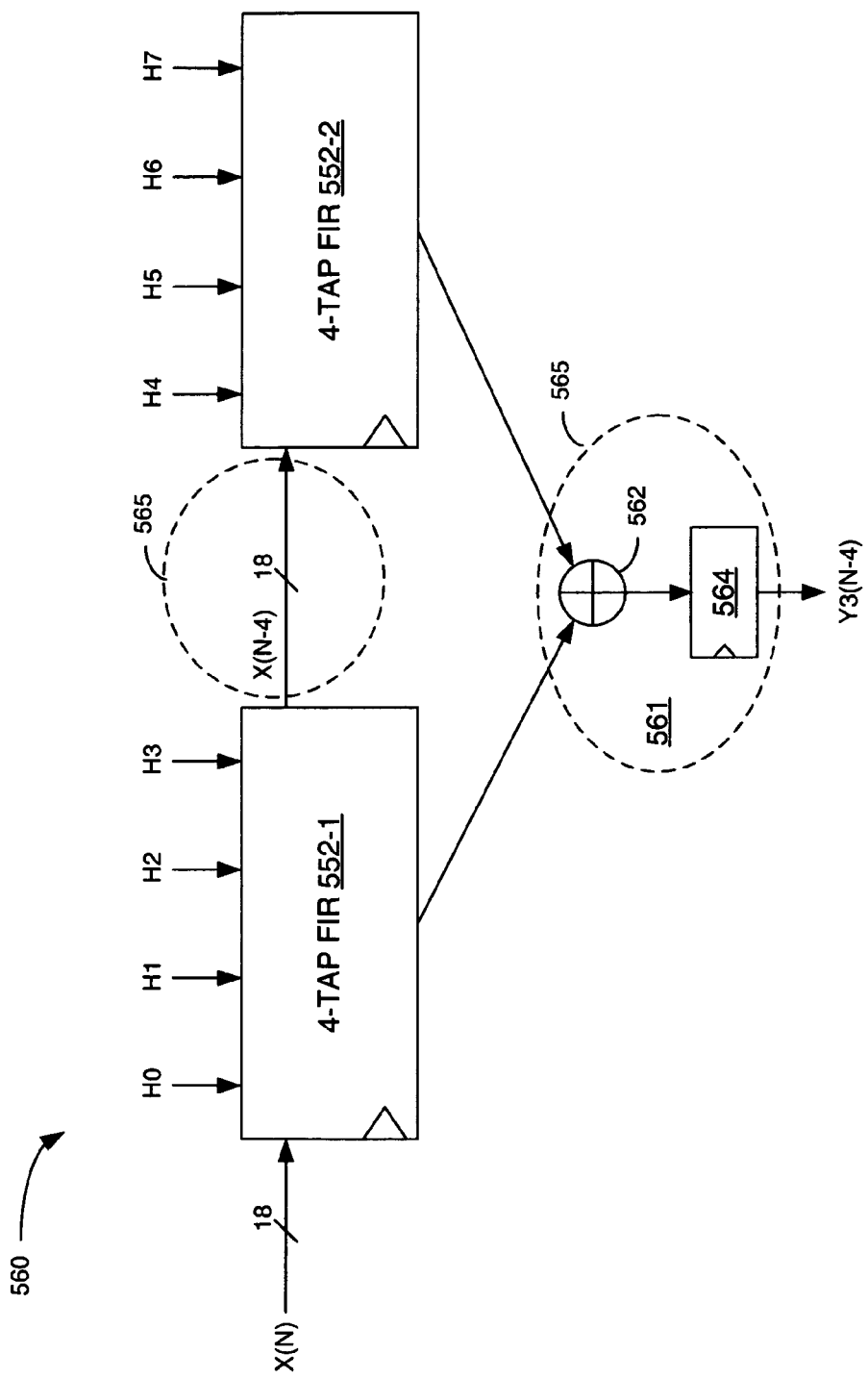
FIG. 5D (prior art) is a block diagram of an 18-bit, eight-tap FIR filter made up of two DSP elements of FIG. 5C.

FIG. 5D (prior art) is a block diagram of an 18-bit, eight-tap FIR filter made up of two DSP elements 552-1 and 552-2, each adapted to instantiate a four-tap FIR filter as shown in FIG. 5C. The results of the two four tap DSP elements 552-1 and 552-2 need to be combined via adder 562 in the general interconnect 565 to get the eight-tap FIR filter result stored in register 564 (also in the general interconnect 565). Unfortunately, general interconnect 565 is slow and has higher power dissipation relative to the dedicated DSP circuitry inside of elements 552-1/2. In addition the general interconnect 565 must be used to connect the DSP element 552-1 to DSP element 552-2 to transfer X(N−4), i.e., DSP element 55-1 is not directly connected to DSP element 552-2. This type of DSP architecture therefore pays a significant price, in terms of speed-performance and power dissipation, when implementing relatively complex DSP circuits. In contrast, the cascaded structures of, e.g., FIG. 5A expand more easily to accommodate complex DSP circuits without the inclusion of configurable logic, and therefore offer significantly improved performance for many types of DSP circuits with lower power dissipation.

Dynamic Processing

In the example of FIG. 5A, mode registers 310 contain the requisite sets of mode control signals to define FIR filter 500. Mode registers 310 can be loaded during device operation via general interconnect 405. Modifying DSP resources to perform different DSP operations without writing to configuration memory is referred to herein as "dynamic" control to distinguish it from modifying DSP resources to perform different DSP operations by altering the contents of the configuration memory. Dynamic control is typically done at operating speed of the DSP resource rather than the relatively much slower reconfiguration speed. Thus dynamic control may be preferred, because altering the contents of the configuration memory can be unduly time consuming. To illustrate the substantial performance improvement of dynamic control over reconfiguration in an exemplary embodiment of the present invention, the Virtex™ families of FPGAs are reconfigured using a configuration clock that operates in, for example, the tens of megahertz range (e.g., 50 MHz) to write to many configuration memory cells. In contrast, the Virtex™ logic runs at operational clock frequencies (for example, in the hundreds of megahertz, e.g., 600 MHz, or greater range) which is at least an order of magnitude faster than the configuration clock, and switching modes requires issuing mode-control signals to a relative few destinations (e.g., multiplexer circuitry 1721 in FIG. 17). Hence an embodiment of the invention can switch modes in a time span of less than one configuration clock period.

The time it takes to set or update a set of bits in the configuration memory is dependent upon both the configuration clock speed and the number of bits to be set or updated. For example, updated bits belong to one or more frames and these updated frame(s) are then sent in byte serial format to the configuration memory. As an example, let configuration clock be 50 MHz, for 16 bit words or a 16*50 or 800 million bits per second configuration rate. Assume there are 10,000 bits in one frame. Hence it takes about 10,000/800,000,000=13 microseconds to update one frame (or any portion thereof) in the configuration memory. Even if the OpMode register were to use the same clock, i.e., the 50 MHz configuration clock, the OpMode register would be reprogrammed in one clock cycle or 20 nanoseconds. Thus there is a significant time difference between setting or updating the configuration memory and the changing the OpMode register.

Figure 6A:
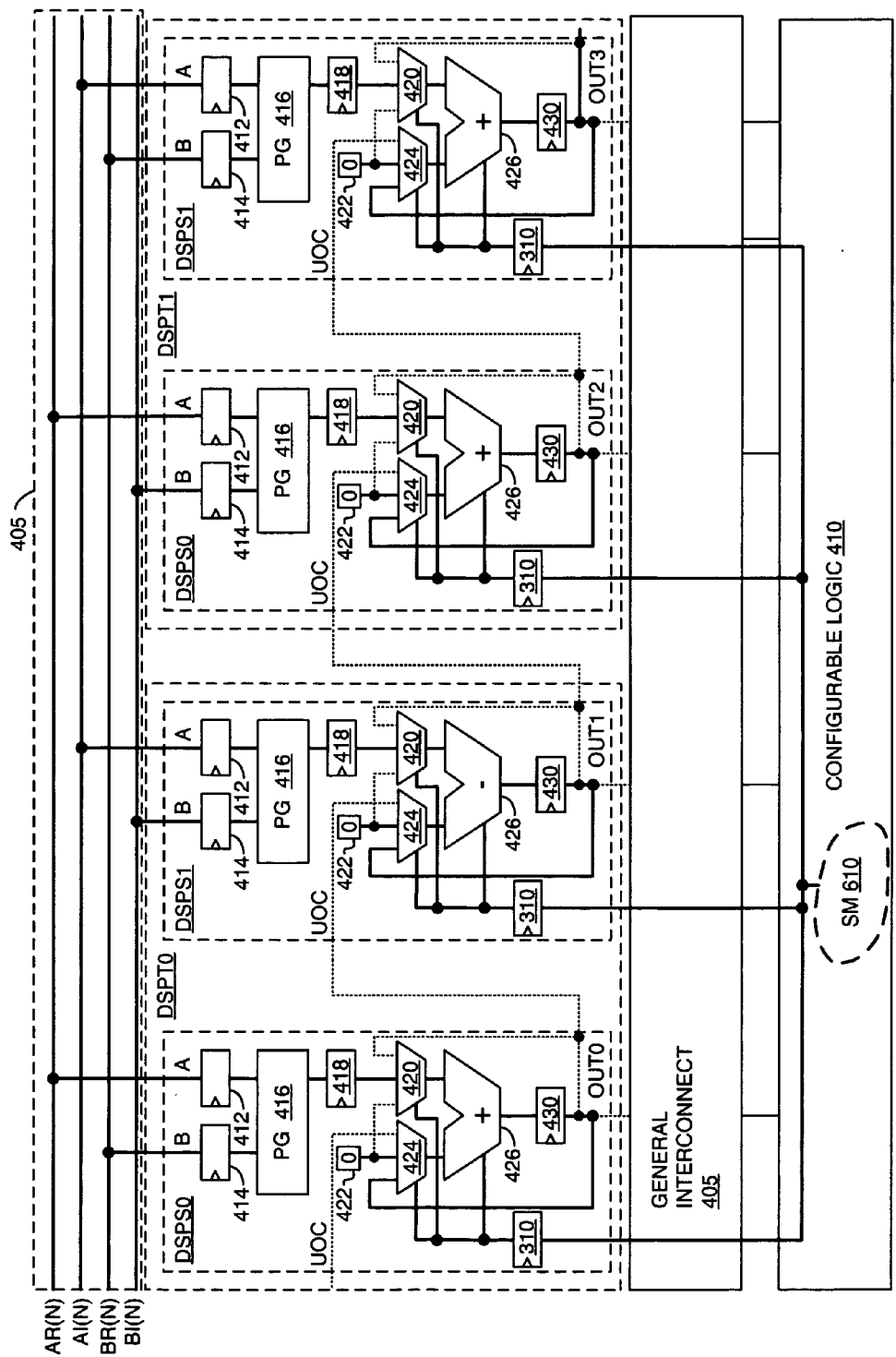
FIGS. 6A and 6B together illustrate how FPGA can be dynamically controlled to implement complicated mathematical functions.
Figure 6B:
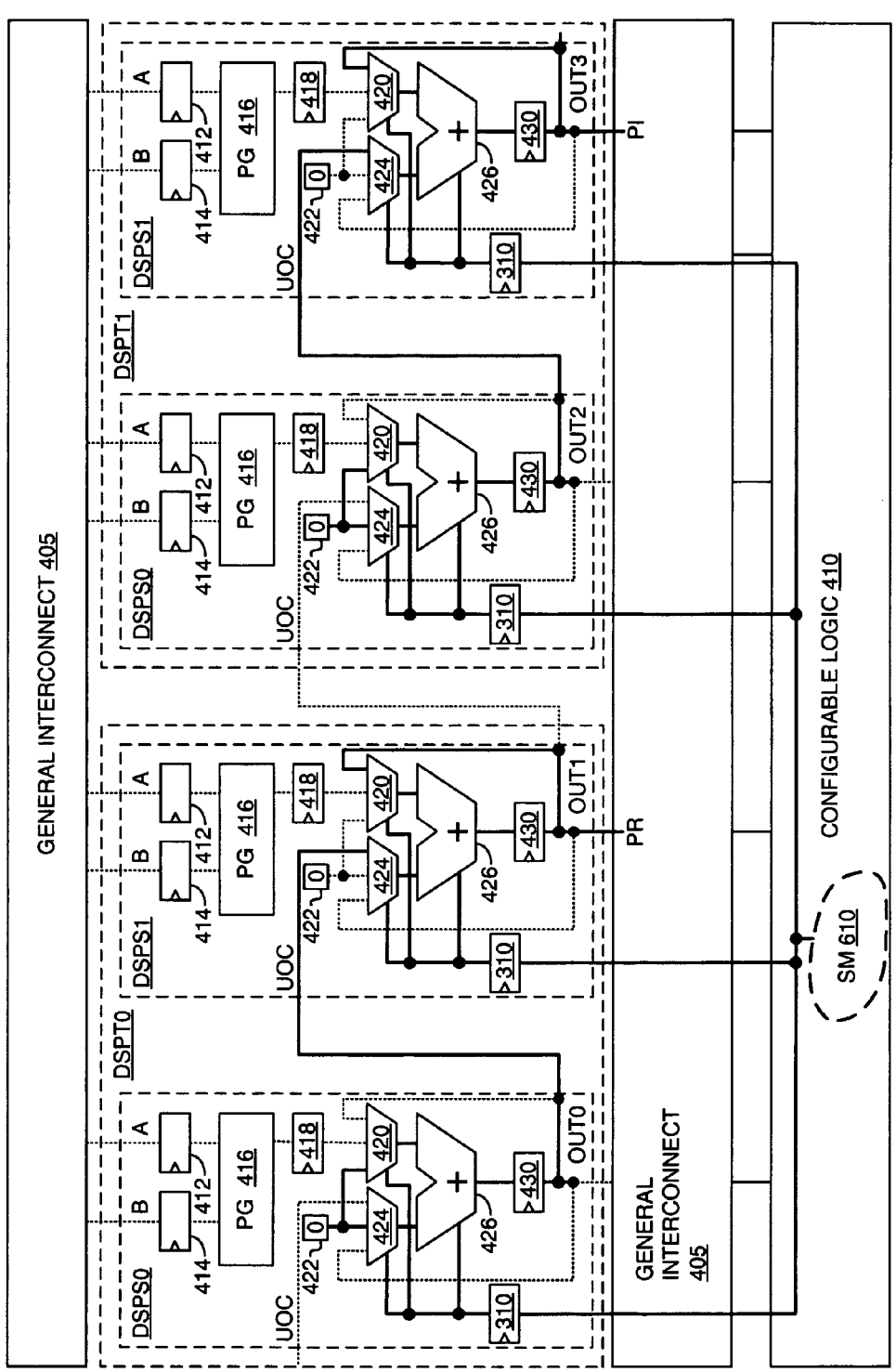

FIGS. 6A and 6B together illustrate how FPGA 400 can be dynamically reconfigured to implement complicated mathematical functions. In this particular example, FPGA 400 receives two series of complex numbers, multiplies corresponding pairs, and sums the result. This well-known operation is typically referred to as a "Complex multiply-accumulate" function, or "Complex MACC." The following series of equations is well known, but is repeated here to illustrate the dynamic DSP operations of FIGS. 6A and 6B.

Multiplying a first pair of complex numbers a+jb and c+jd provides the following complex product:

$$R1+jI1=(a+jb)(c+jd)=(ac-bd)+j(bc+ad)=ac-bd+jbc+jad \quad (2)$$

Similarly, multiplying a second pair of complex number e+jf and g+jh provides:

$$R2+jI2=(e+jf)(g+jh)=(eg-fh)+j(fg+eh)=eg-fh+jfg+jeh \quad (3)$$

Summing the products of equations (2) and (3) gives:

$$(R1+jI1)+(R2+jI2)=ac-bd+jbc+jad+eg-fh+jfg+jeh \quad (4)$$

Rearranging the terms into real/real, imaginary/imaginary, imaginary/real, and real/imaginary product types gives:

$$(R1+jI1)+(R2+jI2)=(ac+eg)+(-bd-fh)+(jbc+jfg)+(jad+jeh) \quad (5)$$

or $$(R1+jI1)+(R2+jI2)=R[(ac+eg)+(-bd-fh)]+I[(bc+fg)+(ad+eh)] \quad (6)$$

The foregoing illustrates that the sum of a series of complex products can be obtained by accumulating each of the four product types and then summing the resulting pair of real numbers and the resulting pair of imaginary numbers. These operations can be extended to any number of pairs, but are limited here to two complex numbers for ease of illustration.

In FIG. 6A, FPGA 400 operates as an accumulator 600 that sums each of the four product types for a series of complex number pairs AR(N)+AI(N)j and BR(N)+BI(N)j. General interconnect 405 is configured to provide real and imaginary parts of the incoming complex-number pairs to the DSP slices. A state machine 610 instantiated in configurable logic 410 controls the contents of each mode register 310 via general interconnect 405, and consequently determines the function and connectivity of the DSP slices. In other embodiments, mode registers 310 are controlled using e.g. circuits external to the FPGA or an on-chip microcontroller. In another embodiment, one or more IBM PowerPC™ microprocessors of the type integrated onto Virtex II Pro™ FPGAs available from Xilinx, Inc., issues mode-control signals to the DSP slices. For FIGS. 6A and 6B, this means that state machine 610 is replaced with an embedded microprocessor.

DSP slice DSPS0 of tile DSPT0 receives the series of real/real pairs AR(N) and BR(N). Product generator 416 multiplies each pair, and adder 426 adds the resulting product to the contents of output register 430. Output register 430 is preset to zero, and so contains the sum of N real/real products after N+2 clock cycles. The two additional clock cycles are required to move the data through registers 412, 414, and 418. The resulting sum of products is analogous to the first real sum ac+eg of equation 6 above. In another embodiment, output registers 430 need not be preset to zero. State machine 610 can configure multiplexer 424 to inject zero into adder 426 at the time the first product is received. Note: the output register 430 does not need to be set to zero. The first data point of each new vector operation is not added to the current output register 430, i.e., the Opmode is set to standard flow-through mode without the ACC feedback.

DSP slice DSPS1 of tile DSPT0 receives the series of imaginary/imaginary pairs AI(N) and BI(N). Product generator 416 multiplies each pair, and adder 426 subtracts the resulting product from the contents of output register 430. Output register 430 thus contains the negative sum of N imaginary/imaginary products after N+2 clock cycles. The resulting sum of products is analogous to the second real sum −bd−fh of equation 6 above.

DSP slice DSPS0 of tile DSPT1 receives the series of real/imaginary pairs AR(N) and BI(N). Product generator 416 multiplies each pair, and adder 426 adds the resulting product to the contents of output register 430. Output register 430 thus contains the sum of N real/imaginary products after N+2 clock cycles. The resulting sum of products is analogous to the first imaginary sum bc+fg of equation 6 above.

Finally, DSP slice DSPS1 of tile DSPT1 receives the series of imaginary/real pairs AI(N) and BR(N). Product generator 416 multiplies each pair, and adder 426 adds the resulting product to the contents of output register 430. Output register 430 thus contains the sum of N imaginary/real products after N+2 clock cycles. The resulting sum of products is analogous to the second imaginary sum ad+eh of equation 6 above.

Once all the product pairs are accumulated in registers 430, state machine 605 alters the contents of mode registers 310 to reconfigure the four DSP slices to add the two cumulative real sums (e.g., ac+eg and −bd−fh) and the two cumulative imaginary sums (e.g., bc+fg and ad+eh). The resulting configuration 655 is illustrated in FIG. 6B.

In configuration 655, DSP slice DSPS1 of tile DSPT0 adds the output OUT0 of DSP slice DSPS1, available on upstream output cascade port UOC, to its own output OUT1. As discussed above in connection with FIG. 6A, OUT0 and OUT1 reflect the contents of two output registers 430, each of which contains a real result. Thus, after one additional clock cycle, output port OUT1 provides a real product PR, the real portion of the MACC result. DSP slices DSPS0 and DSPS1 of tile DSPT1 are similarly configured to add the contents of both respective registers 430, the two imaginary sums of products, to provide the imaginary product PI of the MACC result. The resulting complex number PR+PI is a sum of all the products of the corresponding pairs of complex numbers presented on terminals AR(N), AI(N), BR(N), and BI(N) in configuration 600 of FIG. 6A. The ability to dynamically alter the functionality of the DSP slices thus allows FPGA 400 to reuse valuable DSP resources to accomplish different portions of a complex function.

DSP Slices with Pipelining Resources

Figure 7:
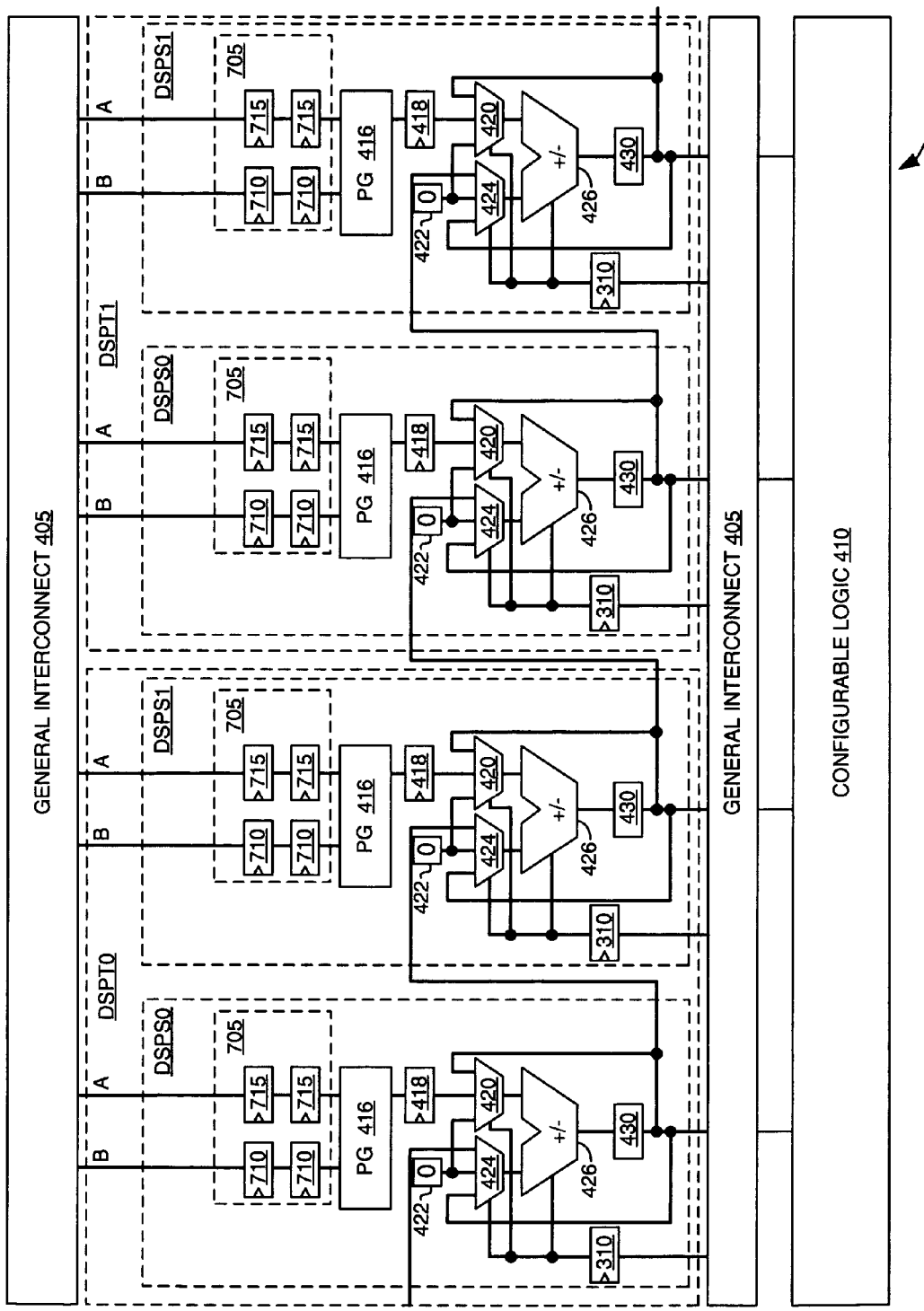
FIG. 7 depicts a FPGA in accordance with another embodiment.

FIG. 7 depicts a FPGA 700 in accordance with another embodiment. FPGA 700 is similar to FPGA 400 of FIG. 4, like-labeled elements being the same or similar. FPGA 700 differs from FPGA 400, however, in that each DSP slice in FPGA 700 includes input registers 705 that can be configured to introduce different amounts of delay. In this example, registers 705 can introduce up to two clock cycles of delay on either or both of operand inputs A and B using two pairs of registers 710 and 715. Configuration memory cells, not shown, determine the amount of delay imposed by a given register 705 on a given operand input. In other embodiments, registers 705 are also controlled dynamically, as by means of mode registers 310.

Figure 8:
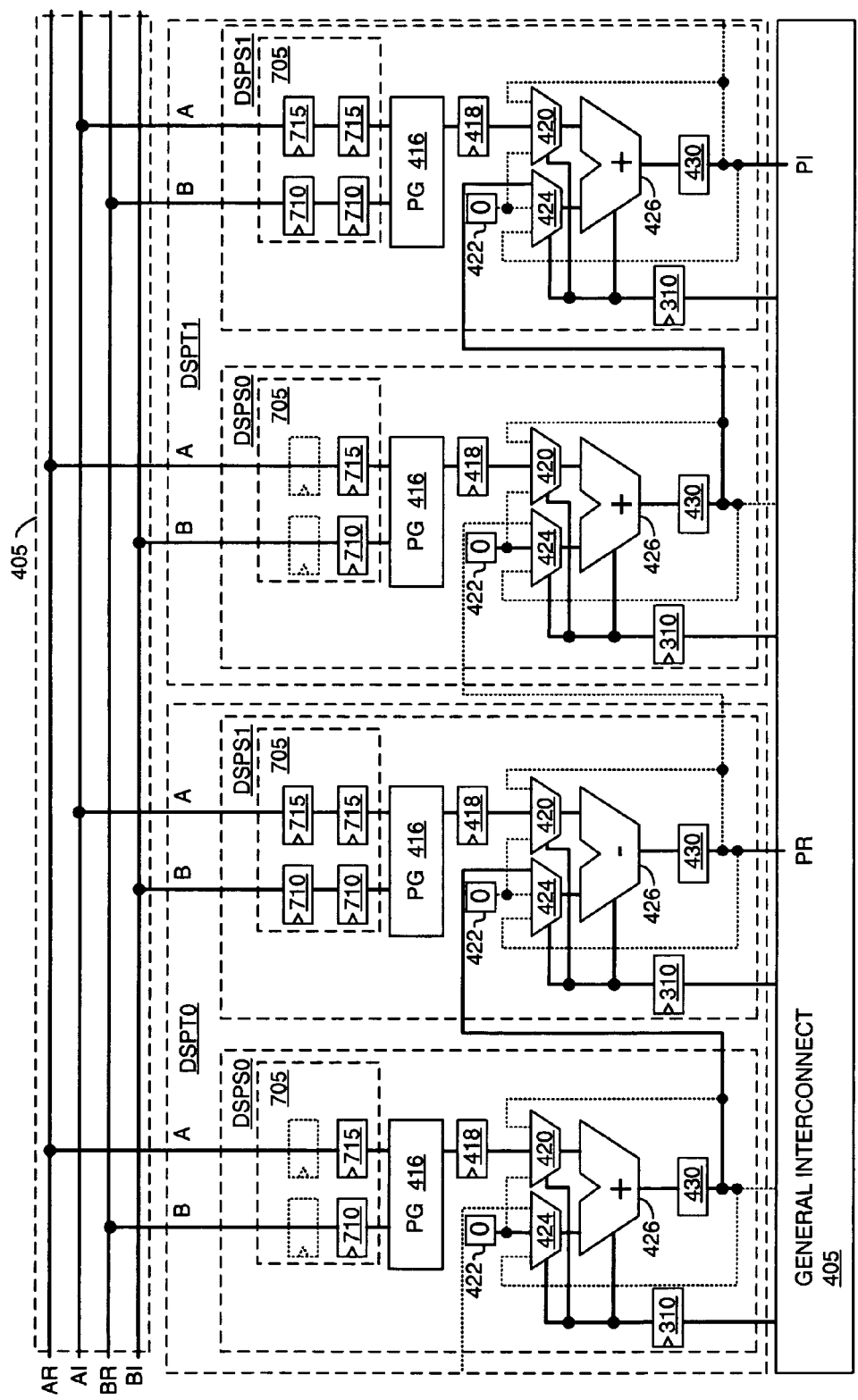
FIG. 8 depicts FPGA of FIG. 7 configured to instantiate a pipelined multiplier for complex numbers.

FIG. 8 depicts FPGA 700 of FIG. 7 configured to instantiate a pipelined multiplier for complex numbers. The contents of register 310 in DSP slice DSPS0 of tile DSPT0 configures that slice to add zero (from voltage level 422) to the product of the real components AR and BR of two complex numbers AR+jAI and BR+jBI and store the result in the corresponding register 430. The associated input register 705 is configured to impose one clock cycle of delay.

The contents of register 310 in DSP slice DSPS1 of tile DSPT0 configures that slice to subtract the real product of the imaginary components AI and BI of complex numbers AR+jAI and BR+jBI from the contents of register 430 of upstream slice DSPS0. Slice DSPS1 then stores the resulting real product PR in the one of registers 430 within DSPS1 of tile DSPT0. The input register 705 of slice DSPS1 is configured to impose a two-cycle delay so that the output of the upstream slice DSPS0 is available to add to register 418 of slice DSPS1 at the appropriate clock cycle.

DSP tile DSPT1 works in a similar manner to DSP tile DSPT0 to calculate the imaginary product PI of the same two imaginary numbers. The contents of register 310 in DSP slice DSPS0 of tile DSPT1 configures that slice to add zero to the imaginary product of the real component AR and imaginary component BI of complex numbers AR+jAI and BR+jBI and store the result in the corresponding register 430. The associated input register 705 is configured to impose one clock cycle of delay. The contents of register 310 in DSP slice DSPS1 of tile DSPT1 configures that slice to add the imaginary product of the imaginary component AI and real component BR from the contents of register 430 of the upstream slice DSPS0. Slice DSPS1 of tile DSPT1 then stores the resulting imaginary product PI in the one of registers 430 within DSPS1 of tile DSPT1. The input register 705 of DSP slice DSPS1 is configured to impose two clock cycles of delay so that the output of upstream slice DSPS0 is available to add to register 418 of slice DSPS1.

The configuration of FIG. 8 imposes four clock cycles of latency. After the first output is realized, a complex product PR+jPI is provided upon each clock cycle. This configuration is therefore very efficient for multiplying relatively long sequences of complex-number pairs.

Figure 9:
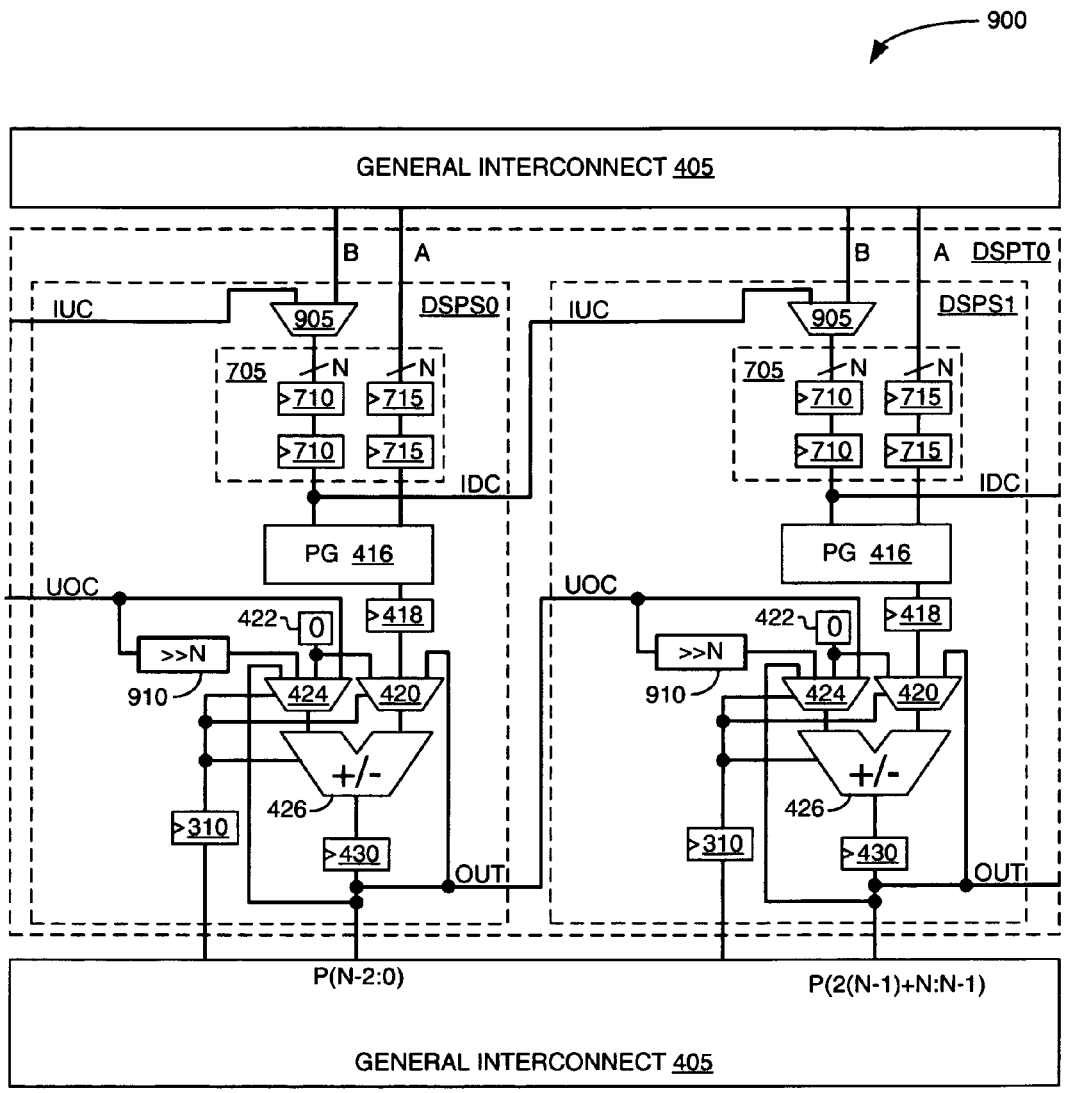
FIG. 9 depicts a FPGA with DSP resources adapted in accordance with another embodiment.

FIG. 9 depicts a FPGA 900 with DSP resources adapted in accordance with another embodiment. Resources described above in connection with other figures are given the same designations in FIG. 9; a description of those resources is omitted here for brevity.

Each DSP slice of FPGA 900 includes a multiplexer 905 that facilitates pipelining of operands. Multiplexer 424 in each slice includes an additional input port connected to the output of the upstream slice via a shifter 910. Shifter 910 reduces the amount of resources required to instantiate some DSP circuits. The generic example of FIG. 9 assumes signed N-bit operands and N-bit shifters 910 for ease of illustration. Specific examples employing both signed and unsigned operands are detailed below. Output of DSPS0 is P(N−2:0), and the output of DSP1 is P(2(N−1)+N:N−1), where N is an integer.

Figure 10:
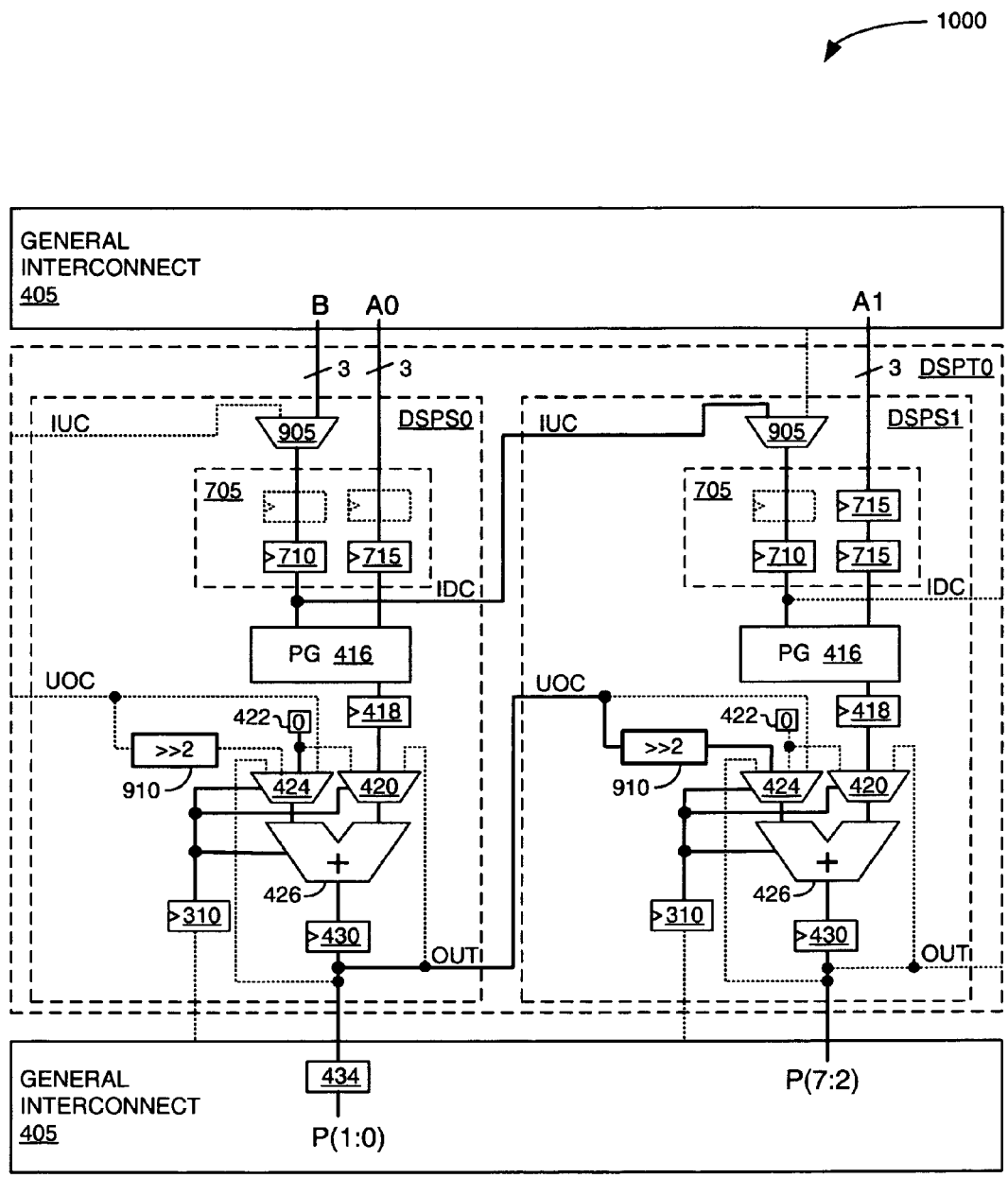
FIG. 10 depicts an example of DSP resources that receive three-bit, signed operands.

FIG. 10 depicts an example of DSP resources 1000 that receive three-bit, signed (two's complement) operands. Resources 1000 are configured via mode registers 310 as a fully pipelined multiplier that multiplies five-bit signed number A by a three-bit signed number B (i.e., A×B). Each operand input bus is only three bits wide, so the five-bit operand A is divided into A0 and A1, where A0 is a three-bit number in which the most-significant bit (MSB) is a zero and the two least significant bits (LSBs) are the two low-order bits of number A and A1 is the MSB's of A. This simple example is illustrative of the function of a two-bit version of shifters 910 first introduced in FIG. 9.

Let B=011 and A=00110. The MSB zeroes indicate that A and B are both positive numbers. The product P of A and B is therefore 00010010. Stated mathematically, $$P = A \times B = 00110 \times 011 = 00010010 \quad (7)$$

A is broken into two signed numbers A0 and A1, in which case a zero is placed in front of the two least-significant bits to create a positive signed number A0. (This zero stuffing of the LSBs is used for both positive and negative values of A). Thus, A1=001 and A0=010.

DSP slices DSPS0 and DSPS1, as configured in FIG. 10, convey the product P of A and B as a combination of two low-order bits P(1:0) and six high-order bits P(7:2) to general interconnect 405. The configuration of FIG. 10 operates as follows.

Input register 705 of slice DSPS0 is configured to introduce just one clock cycle of delay using a single register 710 and a single register 715. After three clock cycles, register 430 contains the product of A0 and B, or 010×011=000110. The two low-order bits of register 430 are provided to a register 434 in the general interconnect 405 as the two low-order product bits P(1:0). In this example, the two low-order bits are "10" (i.e., the logic level on line P(O) is representative of a logic zero, and the logic level on line P(1) is representative of a logic one).

Multiplexer 905 of slice DSPS1 is configured to select input-upstream cascade port IUC, which is connected to the corresponding input-downstream-cascade port IDC of upstream slice DSPS0. Operand B is therefore provided to slice DSPS1 after the one clock cycle of delay imposed by register 705 of slice DSPS0.

Input register 705 of slice DSPS1 is configured to introduce one additional clock cycle of delay on operand B from slice DSPS1 and two cycles of delay on operand A1. The extra clock cycle of delay, as compared with the single clock cycle imposed on operand A0, means that after three clock cycles, register 418 of slice DSPS1 contains the product of A1 and B (001×011=000011) when register 430 of slice DSPS0 contains the product of A0 and B (000110).

Shifter 910 of slice DSPS1 right shifts the contents of the corresponding register 430 (000110) two bits to the right, i.e., while extending the sign bits to fill the resulting new high-order bits, giving 000001. Then, during the fourth clock cycle, slice DSPS1 adds the contents of the associated register 418 with the right-shifted value from slice DSPS0 (000001+000011) and stores the result (000100) in register 430 of slice DSPS1 as the six most significant product bits P(7:2). Combining the low- and high-order product bits P(7:2)=000100 and P(1:0)=10 gives P=00010010. This result is in agreement with the product given in equation 6 above.

In FIG. 10 the outputs two outputs P(7:2) and P(1:0) have separate connections to the general interconnect 405, rather than, for example, one consolidated connection P(7:0). The advantage of this arrangement is that the demand on the interconnect is distributed.

Figure 11:
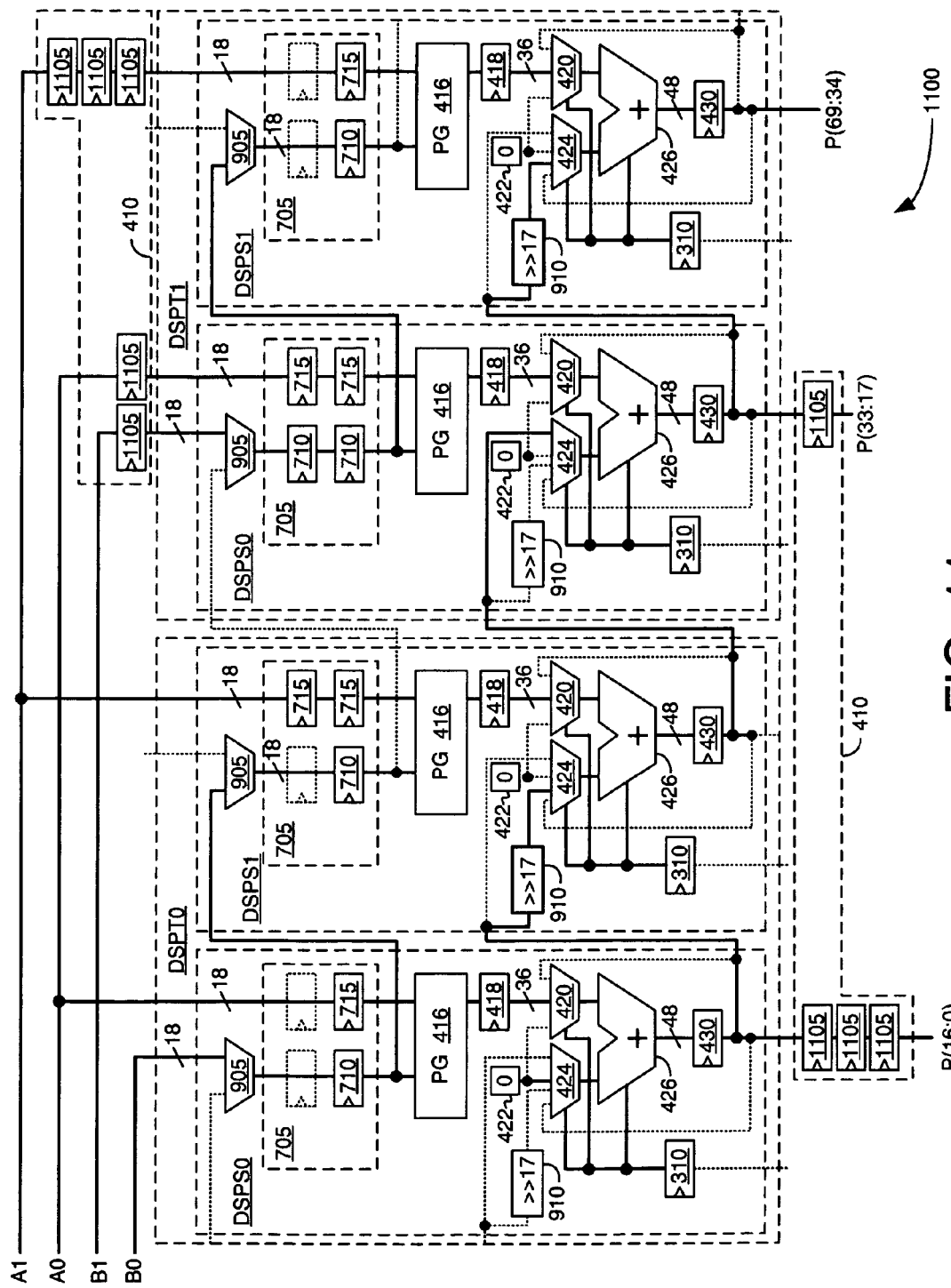
FIG. 11 depicts DSP resources in accordance with another embodiment.

FIG. 11 depicts DSP resources 1100 in accordance with another embodiment. DSP resources 1100 are functionally similar to DSP resources 1000 of the illustrative example of FIG. 10, but the DSP architecture is adapted to receive and manipulate 18-bit signed operands. In this practical example, four DSP slices are configured as a fully pipelined 35×35 multiplier. A number of registers 1105 are included from configurable logic resources 410 to support the pipelining. In other embodiments, slices DSPT0 and DSPT1 include one or more additional operand registers, output registers, or both, for improved speed performance. In some such embodiments, one of multiple output registers associated with a given slice (see FIGS. 17 and 21) can be used to hold data while the contents of another output register is updated. The output from a given slice can thus be preserved while the slice provides one or more registered cascade inputs to a downstream slice.

Figure 12A:
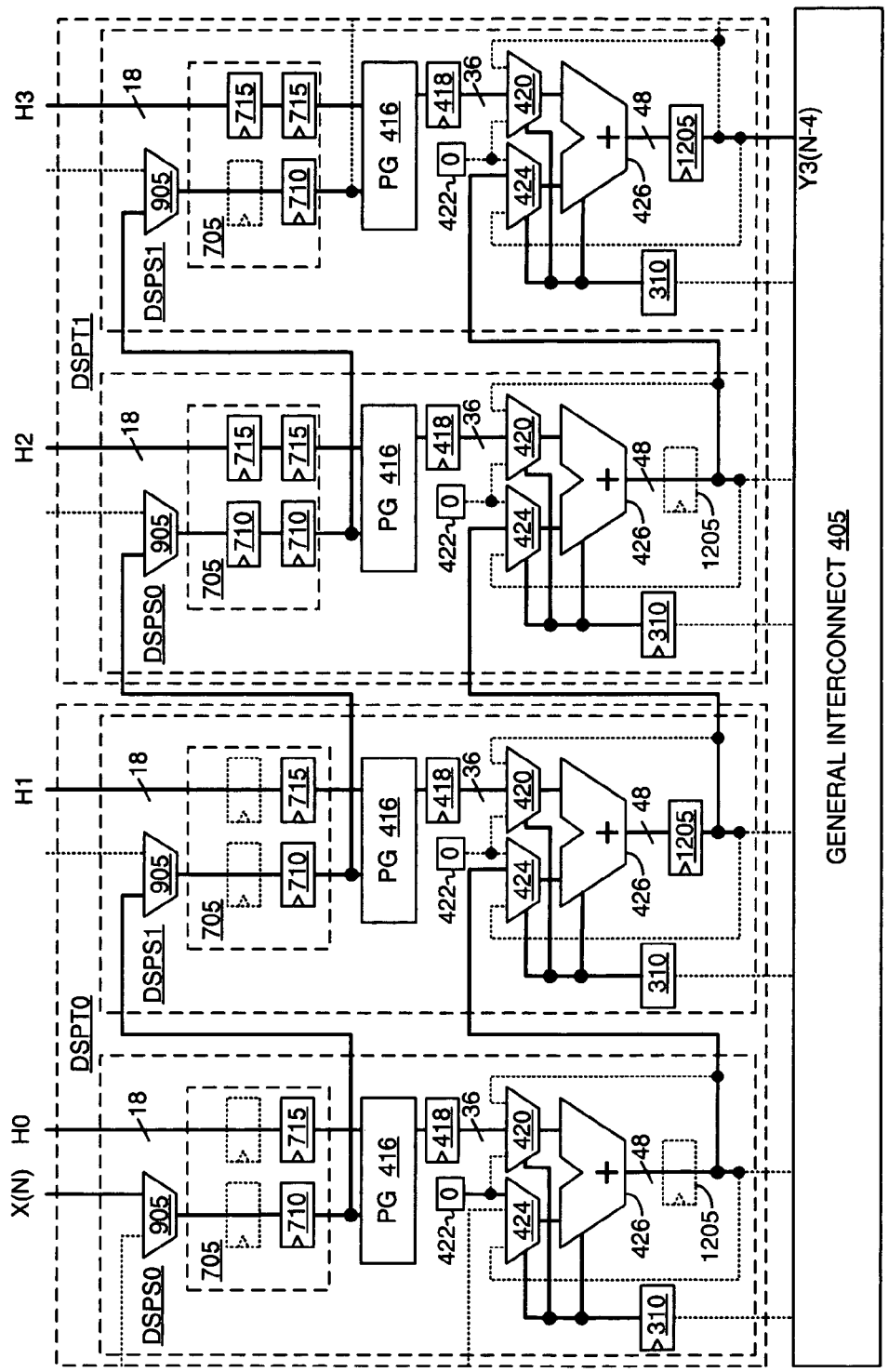
FIG. 12A depicts four DSP slices configured to instantiate a pipelined, four-tap FIR filter.

FIG. 12A depicts four DSP slices configured to instantiate a pipelined, four-tap FIR filter 1200. In place of output register 430 (see e.g. FIG. 4), each slice includes a configurable output register 1205 that can be programmed, during device configuration, to impose either zero or one clock cycle of delay. (Other embodiments include output registers that can be controlled dynamically.) Registers 1205 in DSP slices DSPS0 are bypassed and registers 1205 in slices DSPS1 are included to support pipelining. Input registers 705 within each DSP slice are also configured to impose appropriate delays on the operands to further support pipelining. As in prior examples, mode registers 310 define the connectivity of filter 1200.

FIG. 12B is a table 1250 illustrating the function of FIR filter 1200 of FIG. 12A. Filter 1200 produces the following output signal Y3(N−4) in response to a data sequence X(N):

$$Y3(N-4)=X(N-4)H0+X(N-5)H1+X(N-6)H2+X(N-7)H3 \quad (8)$$

Table 1250 illustrates the operation of FIR filter 1200 by presenting the outputs of registers 710, 715, 418, and 1205 for each DSP slice of FIG. 12A for each of eight clock cycles 0-7. The outputs of registers 710 and 715 refer to the outputs of those registers 710 and 715 closest to the respective product generator 416.

Figure 13A:
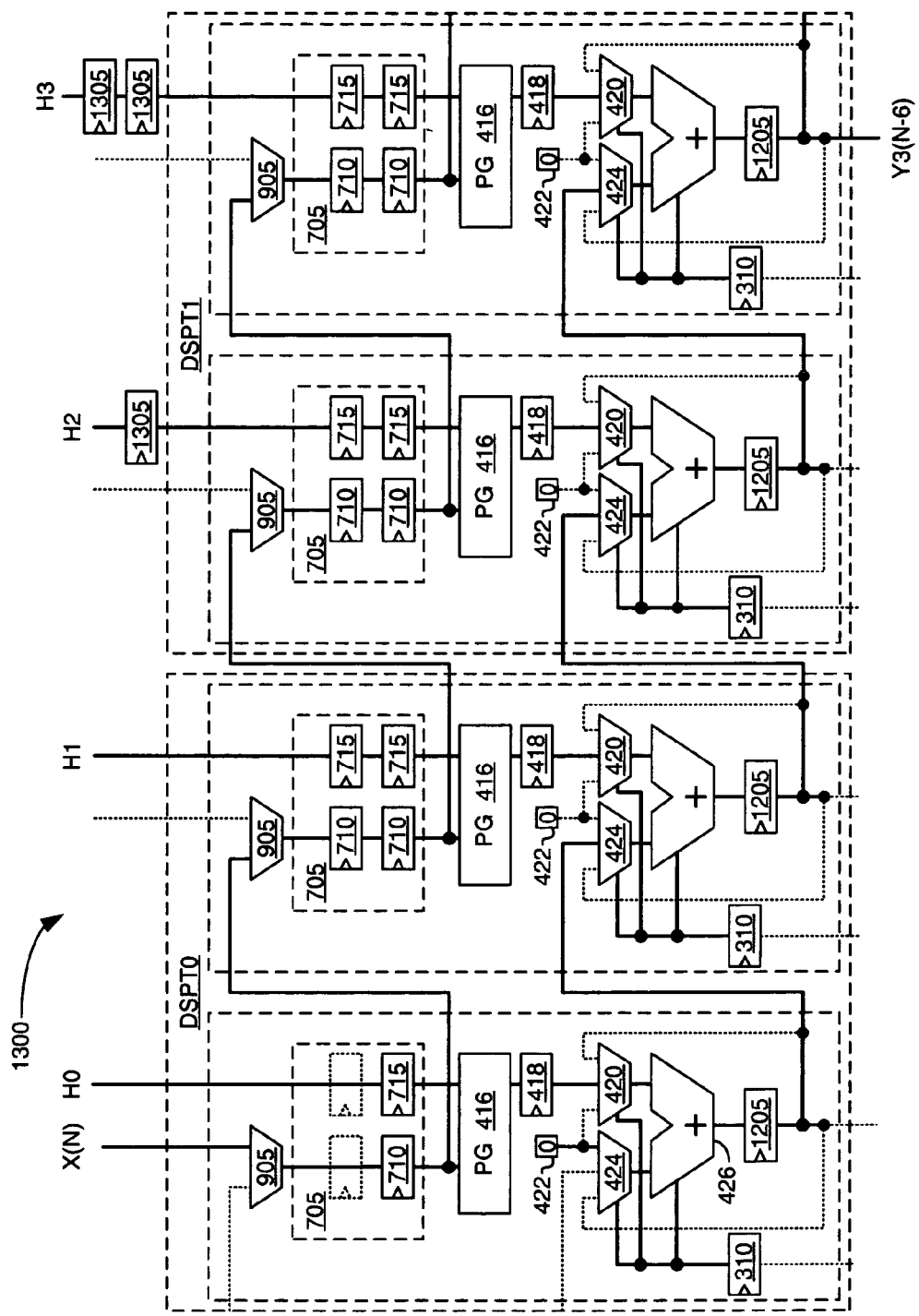
FIG. 13A depicts two DSP tiles DSPT0 and DSPT1 (four DSP slices) configured, using the appropriate mode control signals in mode registers, to instantiate a systolic, four-tap FIR filter.

FIG. 13A depicts two DSP tiles DSPT0 and DSPT1 (four DSP slices) configured, using the appropriate mode control signals in mode registers 310, to instantiate a systolic, four-tap FIR filter 1300. A number of registers 1305 selected from the configurable resources surrounding the DSP tiles and interconnected with the tiles via the general routing resources are included. Filter 1300 can be extended to N taps, where N is greater than four, by cascading additional DSP slices and associated additional registers.

FIG. 13B is a table 1350 illustrating the function of FIR filter 1300 of FIG. 13A. Filter 1300 produces the following output signal Y3(N−6) in response to a data sequence X(N):

$$Y3(N-6)=X(N-6)H0+X(N-7)H1+X(N-8)H2+X(N-9)H3 \quad (9)$$

Table 1350 illustrates the operation of FIR filter 1300 by presenting the outputs of registers 710, 715, 418, and 1205 for each DSP slice of FIG. 13A for each of nine clock cycles 0-8. The outputs of registers 710 and 715 refer to the outputs of those registers 710 and 715 closest to the respective product generator 416.

Figure 14:
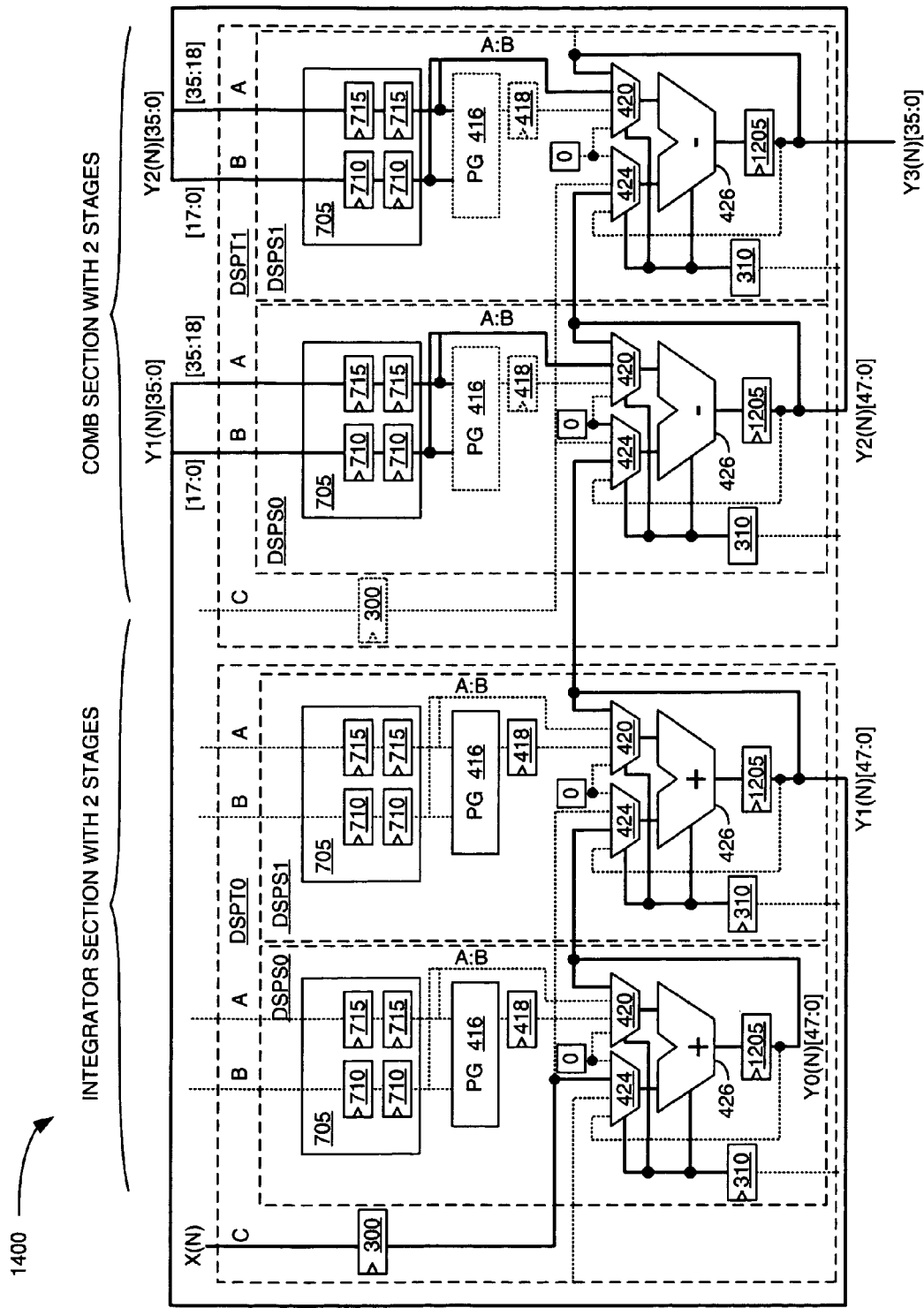
FIG. 14 depicts a FPGA having DSP slices modified to include a concatenation bus A:B that circumvents the product generator.

FIG. 14 depicts a FPGA 1400 having DSP slices modified to include a concatenation bus A:B that circumvents product generator 416. In this example, each of operands A and B are 18 bits, concatenation bus A:B is 36 bits, and operand bus C is 48 bits. The high-order 18 bits of bus A:B convey operand A and the low-order 18 bits convey operand B. Multiplexer 420 includes an additional input port for bus A:B. Each DSP tile additionally includes operand register 300, first introduced in FIG. 3, which conveys a third operand C to multiplexers 424 in the associated slices. Among other advantages, register 300 facilitates testing of the DSP tiles because test vectors can directed around product generator 416 to adder 426.

Mode registers 310 store mode control signals that configure FPGA 1400 to operate as a cascaded, integrator-comb, decimation filter that operates on input data X(N), wherein N is e.g. four. Slices DSPS0 and DSPS1 of tile DSPT0 form a two-stage integrator. Slice DSPS0 accumulates the input data X(N) from register 300 in output register 1205 to produce output data Y0(N)[47:0], which is conveyed to multiplexer 424 of the downstream slice DSPS1. The downstream slice accumulates the accumulated results from upstream slice DSPS0 in corresponding output register 1205 to produce output data Y1(N)[47:0]. Data Y1(N)[35:0] is conveyed to the A and B inputs of slice DSPS0 of tile DSPT1 via the general interconnect.

Slices DSPS0 and DSPS1 of tile DSPT1 form a two-stage comb filter. Slice DSPS0 of tile DSPT1 subtracts Y1(N−2) from Y1(N) to produce output Y2(N). Slice DSPS1 of tile DSPT0 repeats the same operation on Y2(N) to produce filtered output Y3(N)[35:0].

Dynamic and Configurable Rounding

Many of the DSP circuits and configurations described herein multiply large numbers to create still larger products. Processing of large, unnecessarily precise products is cumbersome and resource intensive, and so such products are often rounded to some desired number of bits. Some embodiments employ a fast, flexible rounding scheme that requires few additional resources and that can be adjusted dynamically to change the number of bits involved in the rounding.

Figure 15:
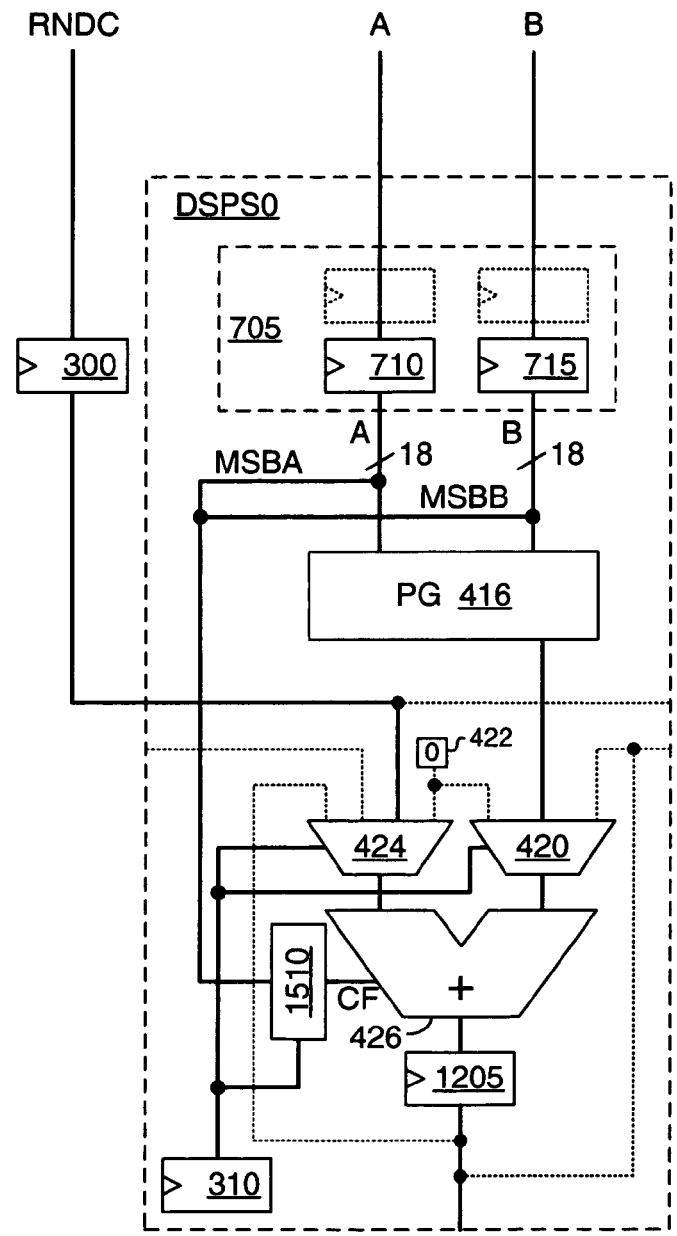
FIG. 15 depicts a DSP slice in accordance with an embodiment that facilitates rounding.

FIG. 15 depicts a DSP slice 1500 in accordance with an embodiment that facilitates rounding. The precision of a given round can be altered either dynamically or, when slice 1500 is instantiated on a programmable logic device, by device programming.

Slice 1500 is similar to the preceding DSP slices, like-identified elements being the same or similar. Slice 1500 additionally includes a correction circuit 1510 having first and second input terminals connected to the respective sign bits of the first and second operand input ports A and B. Correction circuit 1510 additionally includes an output terminal connected to an input of adder 426. Correction circuit 1510 generates a one-bit correction factor CF based on the multiplier sign bit and the multiplicand sign bit. Adder 426 then adds the product from product generator 416 with an X-bit rounding constant in operand register 300 and correction factor CF to perform the round. The length X of the rounding constant in register 300 determines the rounding point, so the rounding point is easily altered dynamically.

Conventionally, symmetric rounding rounds numbers to the nearest integer (e.g., 2.5 rounds to 3, −2.5 rounds to −3, 1.5<=x<2.5 rounds to 2, and −1.5>=x>−2.5 rounds to −2). To accomplish this in binary arithmetic, one can add a correction factor of 0.1000 for positive numbers or 0.0111 for negative numbers and then truncate the resulting fraction. Changing the number of trailing zeroes in the correction factor for positive numbers or the number of trailing ones in the correction factor for negative numbers changes the rounding point. Slice 1500 is modified to automatically round a user-specified number of bits from both positive and negative numbers.

Figure 16:
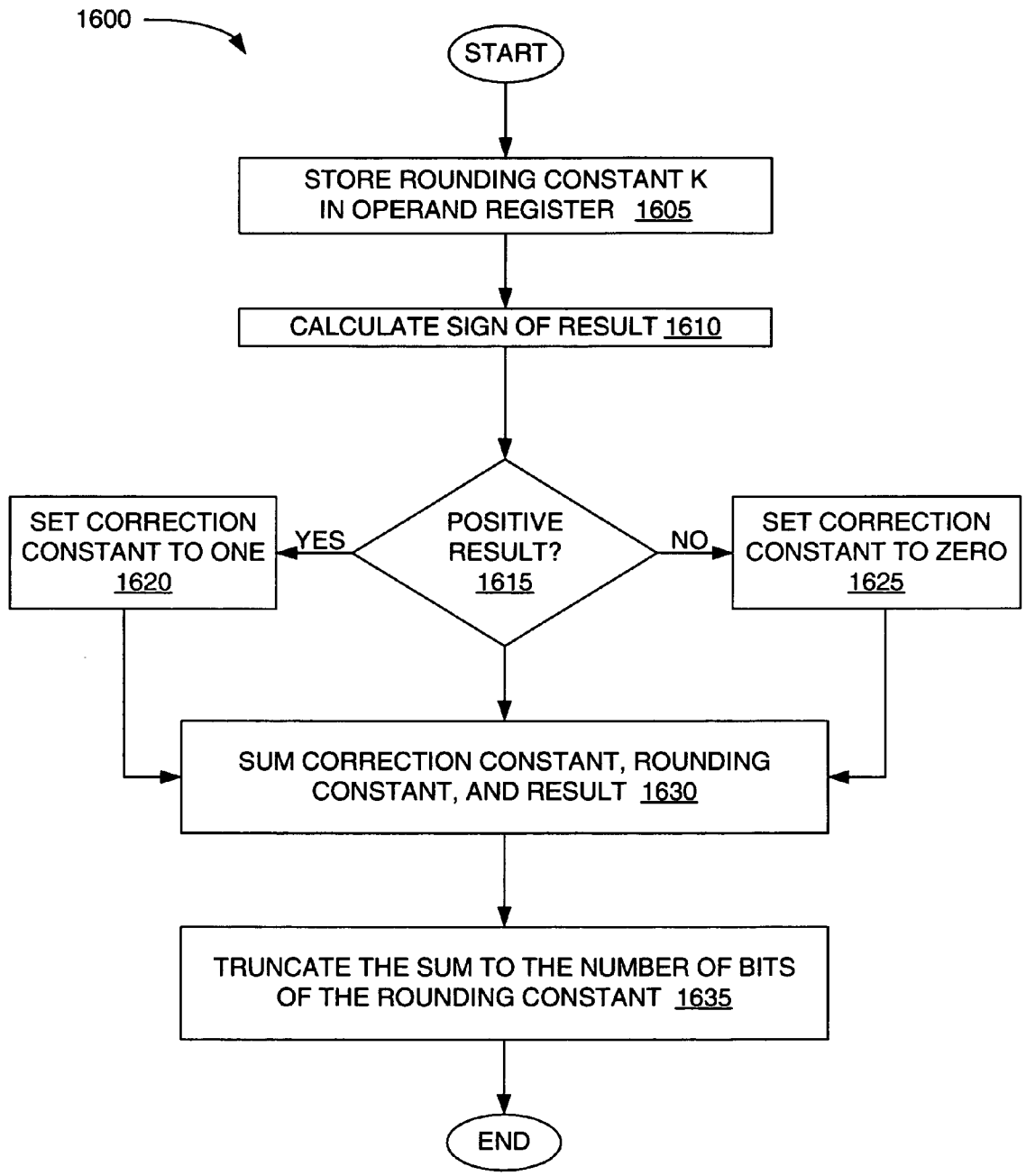
FIG. 16 is a flowchart describing the rounding process in accordance with an embodiment that employs the slice of FIG. 15 to round off the least-significant N bits.

FIG. 16 is a flowchart 1600 describing the rounding process in accordance with an embodiment that employs slice 1500 of FIG. 15 to round off the least-significant N bits. Beginning at step 1605, the circuit or system controlling the rounding process stores a rounding constant K in operand register 300. In the illustrated embodiment, rounding constant K is a binary number in which the N−1 least-significant digits are binary ones and the remaining bits are logic zeros (i.e., $K=2^{(N-1)}-1$). For example, rounding off the three least significant bits (N=3) uses a rounding constant of $2^{(3-1)}-1$, or 000011.

Next, in step 1610, slice 1500 determines the sign of the number to be rounded. If the number is a product of a multiplier in operand register 715 and a multiplicand in operand register 710 (or vice versa), correction circuit 1510 XNORs the sign bits of the multiplier and multiplicand (e.g. the MSBs of operands A and B) to obtain a logic zero if the signs differ or a logic one if the signs are alike. Determining the inverse of the sign expedites the rounding process, though this advanced signal calculation is unnecessary if the rounding is to be based upon the sign of an already computed value.

If the result is positive (decision 1615), correction circuit 1510 sets correction factor CF to one (step 1620); otherwise, correction circuit 1510 sets correction factor CF to zero (step 1625). Adder 426 then sums rounding constant K, correction factor CF, and the result (e.g., from product generator 416) to obtain the rounded result (step 1630). Finally, the rounded result is truncated to the rounding point N, where N−1 is the number of low-order ones in the rounding constant (step 1635). The rounded result can then be truncated by, for example, conveying only the desired bits to the general interconnect.

Table 1 illustrates rounding off the four least-significant binary bits (i.e., N=4) in accordance with one embodiment. The rounding constant in register 300 is set to include N−1 low-order ones, or 0111. In the first row of Table 1, the decimal value and its binary equivalent BV are positive, so correction factor CF, the XNOR of the signs of the multiplier and multiplicand, is one. Adding binary value BV, rounding constant K, and correction factor CF provides an intermediate rounded value. Truncating the intermediate rounded valued to eliminate the N lowest order bits gives the rounded result.

TABLE 1

| Dec. Value | Binary (BV) | K | CF | BV + K + CF | Truncate | Rounded Value |
|---|---|---|---|---|---|---|
| 2.4375 | 0010.0111 | 0.0111 | 1 | 0010.1111 | 0010 | 2 |
| 2.5 | 0010.1000 | 0.0111 | 1 | 0011.0000 | 0011 | 3 |
| 2.5625 | 0010.1001 | 0.0111 | 1 | 0011.0001 | 0011 | 3 |
| −2.4375 | 1101.1001 | 0.0111 | 0 | 1110.0000 | 1110 | −2 |
| −2.5 | 1101.1000 | 0.0111 | 0 | 1101.1111 | 1101 | −3 |
| −2.5625 | 1101.0111 | 0.0111 | 0 | 1101.1110 | 1101 | −3 |

Predetermining the sign of the product expedites the rounding process. The above-described examples employ an XNOR of the sign values of a multiplier and multiplicand to predetermine the sign of the resulting product. Other embodiments predetermine sign values for mathematical calculations in addition to multiplication, such as concatenation for numbers formed by concatenating two operands, in which case there is only one sign bit to consider. In such embodiments, mode register 310 instructs correction circuit 1510 to develop an appropriate correction factor CF for a given operation. An embodiment of correction circuit 1510 capable of generating various forms of correction factor in response to mode control signals from mode register 310 is detailed below in connection with FIGS. 17 and 19. Furthermore, the rounding constant need not be $2^{(N-1)}-1$. In another embodiment, for example, the rounding constant is $2^{(N-1)}$ and the sign bit is subtracted from the sum of the rounding constant and the product.

Complex DSP Slice

Figure 17:
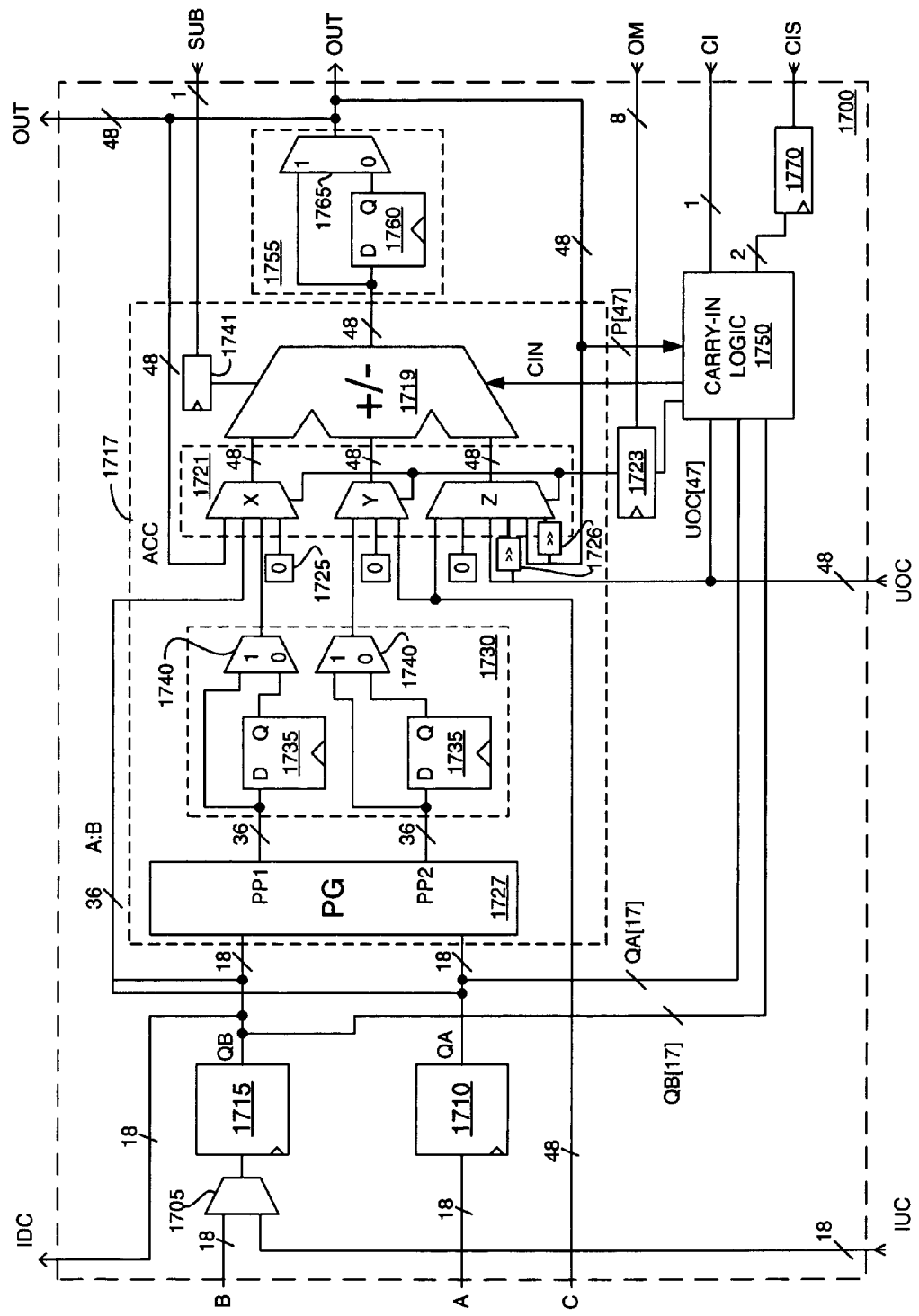
FIG. 17 depicts a complex DSP slice in accordance with an embodiment that combines various features of the above-described examples.

FIG. 17 depicts a complex DSP slice 1700 in accordance with an embodiment that combines various features of the above-described examples. Features similar to those described above in connection with earlier figures are given similar names, and redundant descriptions are omitted where possible for economy of expression.

DSP slice 1700 communicates with other DSP slices and to other resources on an FPGA via the following input and output signals on respective lines or ports:

a. Signed operand busses A and B programmably connect to the general interconnect to receive respective operands A and B. Operand busses A and B are each 18-bits wide, with the most significant bit representing the sign.

b. Signed operand bus C connects directly to a corresponding C register 300 (see e.g. FIG. 3), which in turn programmably connects to the general interconnect to receive operands C. Operand bus C is 48-bits wide, with the most significant bit representing the sign.

c. An 18-bit input-upstream cascade bus IUC connects directly to an upstream slice in the manner shown in FIG. 3.

d. An 18-bit input-downstream cascade bus IDC connects to the input-upstream cascade bus IUC of an upstream slice.

e. A 48-bit upstream-output cascade bus UOC connects directly to the output port of an upstream slice.

f. A 48-bit output bus OUT connects directly to the upstream-output cascade bus UOC of a downstream slice and to a pair of internal feedback ports, and is programmably connectable to the general interconnect.

g. A 7-bit operational-mode port OM programmably connects to the general interconnect to receive and store sets of mode control signals for configuring slice 1700.

h. A one-bit carry-in line CI programmably connects to the general interconnect.

i. A 2-bit carry-in-select port CIS programmably connects to the general interconnect.

j. A 1-bit subtract port SUB programmably connects to the general interconnect to receive an instruction to add or subtract.

k. Each register within DSP slice 1700 additionally receives reset and enable signals, though these are omitted here for brevity.

Slice 1700 includes a B-operand multiplexer 1705 that selects either the B operand of slice 1700 or receives on the IUC port the B operand of the upstream slice. Multiplexer 1705 is controlled by configuration memory cells (not shown) in this embodiment, but might also be controlled dynamically. The purpose of multiplexer 1705 is detailed above in connection with FIG. 9, which includes a similar multiplexer 905.

A pair of two-deep input registers 1710 and 1715 are configurable to introduce zero, one, or two clock cycles of delay on operands A and B, respectively. Embodiments of registers 1710 and 1715 are detailed below in connection with respective FIGS. 20A & B and 21. The purpose of registers 1710 and 1715 is detailed above in connection with e.g. FIG. 7, which includes a similar configurable register 705.

Slice 1700 caries out multiply and add operations using a product generator 1727 and adder 1719, respectively, of an arithmetic circuit 1717. Multiplexing circuitry 1721 between product generator 1727 and adder 1719 allows slice 1700 to inject numerous addends into adder 1719 at the direction of a mode register 1723. These optional addends include operand C, the concatenation A:B of operands A and B, shifted and unshifted versions of the slice output OUT, shifted and unshifted versions of the upstream output cascade UOC, and the contents of a number of memory-cell arrays 1725. Some of the input buses to multiplexing circuitry 1721 carry less than 48 bits. These input busses are sign extended or zero filled as appropriate to 48 bits.

A pair of shifters 1726 shift their respective input signals seventeen bits to the right, i.e., towards the LSB, by presenting the input signals on bus lines representative of lower-order bits with sign extension to fill the vacated higher order bits. The purpose of shifters 1726 is discussed above in connection with FIG. 10, which details a simpler two-bit shift. Some embodiments include shifters capable of shifting a selectable number of bit positions in place of shifters 1726. An embodiment of the combination of product generator 1727, multiplexing circuitry 1721, and adder 1719 is detailed below in connection with FIG. 26.

Product generator 1727 is conventional (e.g. an AND array followed by array reduction circuitry), and produces two 36-bit partial products PP1 and PP2 from an 18-bit multiplier and an 18-bit multiplicand (where one is a signed partial product and the other is an unsigned partial product). Each partial product is optionally stored for one clock cycle in a configurable pipeline register 1730, which includes a pair of 36-bit registers 1735 and respective programmable bypass multiplexers 1740. Multiplexers 1740 are controlled by configuration memory cells, but might also be dynamic.

Adder 1719 has five input ports: three 48-bit addend ports from multiplexers X, Y, and Z in multiplexer circuitry 1721, a one-bit add/subtract line from a register 1741 connected to subtract port SUB, and a one-bit carry-in port CIN from carry-in logic 1750. Adder 1719 additionally includes a 48-bit sum port connected to output port OUT via a configurable output register 1755, including a 48-bit register 1760 and a configurable bypass multiplexer 1765.

Carry-in logic 1750 develops a carry-in signal CIN to adder 1719, and is controlled by the contents of a carry-in select register 1770, which is programmably connected to carry-in select port CIS. In one mode, carry-in logic 1750 merely conveys carry-in signal CI from the general interconnect to the carry-in terminal CIN of adder 1719. In each of a number of other modes, carry-in logic provides a correction factor CF on carry-in terminal CIN. An embodiment of carry-in logic 1750 is detailed below in connection with FIG. 19.

Slice 1700 supports many DSP operations, including all those discussed above in connection with previous figures. The operation of slice 1700 is defined by memory cells (not shown) that control a number of configurable elements, including the depth of registers 1710 and 1715, the selected input port of multiplexer 1705, the states of bypass multiplexers 1740 and 1765, and the contents of registers 1725. Other elements of slice 1700 are controlled by the contents of registers that can be written to without reconfiguring the FPGA or other device of which slice 1700 is a part. Such dynamically controlled elements include multiplexing circuitry 1721, controlled by mode register 1723, and carry-in logic 1750, jointly controlled by mode register 1723 and carry-in-select register 1770. More or fewer components of slice 1700 can be made to be dynamically controlled in other embodiments. Registers storing dynamic control bits are collectively referred to as an OpMode register.

The following Table 2A lists various operational modes, or "op-modes," supported by the embodiment of slice 1700 depicted in FIG. 17. The columns of Table 2 include an "OpMode" label, corresponding seven-bit sets of mode control signals(OpMode<6:0>) that may be stored in one or more Opmode registers, and the result on output port OUT of slice 1700 that results from the selected set of dynamic control signals. Some OpModes are italicized to indicate that output multiplexer 1765 should be configured to select the output of register 1760. OpModes may be achieved using more than one Opmode code.

TABLE 2A

Operating Modes

| | OpMode<6:0> | | | | | | | |
| | Z | | Y | | X | | | |
| OpMode | 6 | 5 | 4 | 3 | 2 | 1 | 0 | Output |
|---|---|---|---|---|---|---|---|---|
| Zero | 0 | 0 | 0 | 0 | 0 | 0 | 0 | +/− Cin |
| *Hold OUT* | 0 | 0 | 0 | 0 | 0 | 1 | 0 | +/− (OUT + Cin) |
| A:B Select | 0 | 0 | 0 | 0 | 0 | 1 | 1 | +/− (A:B + Cin) |
| Multiply | 0 | 0 | 0 | 0 | 1 | 0 | 1 | +/− (A * B + Cin) |
| C Select | 0 | 0 | 0 | 1 | 1 | 0 | 0 | +/− (C + Cin) |
| *Feedback Add* | 0 | 0 | 0 | 1 | 1 | 1 | 0 | +/− (C + OUT + Cin) |
| 36-Bit Adder | 0 | 0 | 0 | 1 | 1 | 1 | 1 | +/− (A:B + C + Cin) |
| OUT Cascade Select | 0 | 0 | 1 | 0 | 0 | 0 | 0 | UOC +/− Cin |
| *OUT Cascade Feedback Add* | 0 | 0 | 1 | 0 | 0 | 1 | 0 | UOC +/− (OUT + Cin) |
| OUT Cascade Add | 0 | 0 | 1 | 0 | 0 | 1 | 1 | UOC +/− (A:B + Cin) |
| OUT Cascade Multiply Add | 0 | 0 | 1 | 0 | 1 | 0 | 1 | UOC +/− (A * B + Cin) |
| OUT Cascade Add | 0 | 0 | 1 | 1 | 1 | 0 | 0 | UOC +/− (C + Cin) |
| *OUT Cascade Feedback Add Add* | 0 | 0 | 1 | 1 | 1 | 1 | 0 | UOC +/− (C + OUT + Cin) |
| OUT Cascade Add Add | 0 | 0 | 1 | 1 | 1 | 1 | 1 | UOC +/− (A:B + C + Cin) |
| *Hold OUT* | 0 | 1 | 0 | 0 | 0 | 0 | 0 | OUT +/− Cin |
| *Double Feedback Add* | 0 | 1 | 0 | 0 | 0 | 1 | 0 | OUT +/− (OUT + Cin) |
| *Feedback Add* | 0 | 1 | 0 | 0 | 0 | 1 | 1 | OUT +/− (A:B + Cin) |
| *Multiply-Accumulate* | 0 | 1 | 0 | 0 | 1 | 0 | 1 | OUT +/− (A * B + Cin) |
| *Feedback Add* | 0 | 1 | 0 | 1 | 1 | 0 | 0 | OUT +/− (C + Cin) |
| *Double Feedback Add* | 0 | 1 | 0 | 1 | 1 | 1 | 0 | OUT +/− (C + OUT + Cin) |
| *Feedback Add Add* | 0 | 1 | 0 | 1 | 1 | 1 | 1 | OUT +/− (A:B + C + Cin) |
| C Select | 0 | 1 | 1 | 0 | 0 | 0 | 0 | C +/− Cin |

TABLE 2A-continued

Operating Modes

| | OpMode<6:0> | | | | | | | |
|---|---|---|---|---|---|---|---|---|
| | | Z | | Y | | X | | |
| OpMode | 6 | 5 | 4 | 3 | 2 | 1 | 0 | Output |
| *Feedback Add* | 0 | 1 | 1 | 0 | 0 | 1 | 0 | C +/− (OUT + Cin) |
| 36-Bit Adder | 0 | 1 | 1 | 0 | 0 | 1 | 1 | C +/− (A:B + Cin) |
| Multiply-Add | 0 | 1 | 1 | 0 | 1 | 0 | 1 | C +/− (A * B + Cin) |
| Double | 0 | 1 | 1 | 1 | 1 | 0 | 0 | C +/− (C + Cin) |
| *Double Add Feedback Add* | 0 | 1 | 1 | 1 | 1 | 1 | 0 | C +/− (C + OUT + Cin) |
| Double Add | 0 | 1 | 1 | 1 | 1 | 1 | 1 | C +/− (A:B + C + Cin) |
| 17-Bit Shift OUT Cascade Select | 1 | 0 | 1 | 0 | 0 | 0 | 0 | Shift(UOC) +/− Cin |
| *17-Bit Shift OUT Cascade Feedback Add* | 1 | 0 | 1 | 0 | 0 | 1 | 0 | Shift(UOC) +/− (OUT + Cin) |
| 17-Bit Shift OUT Cascade Add | 1 | 0 | 1 | 0 | 0 | 1 | 1 | Shift(UOC) +/− (A:B + Cin) |
| 17-Bit Shift OUT Cascade Multiply Add | 1 | 0 | 1 | 0 | 1 | 0 | 1 | Shift(UOC) +/− (A * B + Cin) |
| 17-Bit Shift OUT Cascade Add | 1 | 0 | 1 | 1 | 1 | 0 | 0 | Shift(UOC) +/− (C + Cin) |
| *17-Bit Shift OUT Cascade Feedback Add Add* | 1 | 0 | 1 | 1 | 1 | 1 | 0 | Shift(UOC) +/− (C + OUT + Cin) |
| 17-Bit Shift OUT Cascade Add Add | 1 | 0 | 1 | 1 | 1 | 1 | 1 | Shift(UOC) +/− (A:B + C + Cin) |
| *17-Bit Shift Feedback* | 1 | 1 | 0 | 0 | 0 | 0 | 0 | Shift(OUT) +/− Cin |
| *17-Bit Shift Feedback Feedback Add* | 1 | 1 | 0 | 0 | 0 | 1 | 0 | Shift(OUT) +/− (OUT + Cin) |
| *17-Bit Shift Feedback Add* | 1 | 1 | 0 | 0 | 0 | 1 | 1 | Shift(OUT) +/− (A:B + Cin) |
| *17-Bit Shift Feedback Multiply Add* | 1 | 1 | 0 | 0 | 1 | 0 | 1 | Shift(OUT) +/− (A * B + Cin) |
| *17-Bit Shift Feedback Add* | 1 | 1 | 0 | 1 | 1 | 0 | 0 | Shift(OUT) +/− (C + Cin) |
| *17-Bit Shift Feedback Feedback Add Add* | 1 | 1 | 0 | 1 | 1 | 1 | 0 | Shift(OUT) +/− (C + OUT + Cin) |
| *17-Bit Shift Feedback Add Add* | 1 | 1 | 0 | 1 | 1 | 1 | 1 | Shift(OUT) +/− (A:B + C + Cin) |

Table 2B with reference to FIGS. 17 and 25 shows how the Opmode bits map to X, Y, and Z MUX input selections:

TABLE 2B

| OpMode | | | Z MUX | OpMode | | Y MUX | OpMode | | X MUX |
|---|---|---|---|---|---|---|---|---|---|
| 6 | 5 | 4 | Selection | 3 | 2 | Selection | 1 | 0 | Selection |
| 0 | 0 | 0 | Zero | 0 | 0 | Zero | 0 | 0 | Zero |
| 0 | 0 | 1 | UOC | 0 | 1 | PP2 | 0 | 1 | PP1 |
| 0 | 1 | 0 | OUT | 1 | 1 | C | 1 | 0 | OUT |
| 0 | 1 | 1 | C | | | | 1 | 1 | A:B |
| 1 | 0 | 1 | Shifted UOC | | | | | | |
| 1 | 1 | 0 | Shifted OUT | | | | | | |

Different slices configured using the foregoing operational modes can be combined to perform many complex, "composite" operations. Table 3, below, lists a few composite modes that combine differently configured slices to perform complex DSP operations. The columns of Table 3 are as follows: "composite mode" describes the function performed; "slice" numbers identify ones of a number of adjacent slices employed in the respective composite mode, lower numbers corresponding to upstream slices; "OpMode" describes the operational mode of each designated slice; input "A" is the A operand for a given OpMode; input "B" is the B operand for a given Opmode; and input "C" is the C operand for a given Opmode ("X" indicates the absence of a C operand, and RND identifies a rounding constant of the type described above in connection with FIGS. 15 and 16).

TABLE 3

Composite-Mode Inputs

| Composite Mode | Slice | OpMode | Inputs | | |
|---|---|---|---|---|---|
| | | | A | B | C |
| 35 × 18 Multiply | 0 | Multiply 17-Bit Shift OUT Cascade | A<zero, 16:0> | B<17:0> | RND |
| | 1 | Multiply Add | A<34:17> | cascade | X |
| 35 × 35 Multiply | 0 | Multiply 17-Bit Shift OUT Cascade | A<zero, 16:0> | B<zero, 16:0> | RND |
| | 1 | Multiply Add OUT Cascade Multiply | A<34:17> | cascade | X |
| | 2 | Add 17-Bit Shift OUT Cascade | A<zero, 16:0> | B<34:17> | X |
| | 3 | Multiply Add | A<34:17> | cascade | X |
| Complex Multiply-Accumulate (n cycle) | 0 | Multiply OUT Cascade Multiply | $A_{Re}$<17:0> | $B_{Re}$<17:0> | X |
| | 1 | Add OUT Cascade Feedback | $A_{Im}$<17:0> | $B_{Im}$<17:0> | X |
| | 2 | Add | X | X | X |
| | 3 | Multiply OUT Cascade Multiply | $A_{Re}$<17:0> | $B_{Im}$<17:0> | X |
| | 4 | Add OUT Cascade Feedback | $A_{Im}$<17:0> | $B_{Re}$<17:0> | X |
| | 5 | Add | X | X | X |

TABLE 3-continued

Composite-Mode Inputs

| Composite Mode | Slice | OpMode | Inputs A | B | C |
|---|---|---|---|---|---|
| 4-Tap Direct Form FIR Filter | 0 | Multiply OUT Cascade Multiply | $h_0$<17:0> | x(n)<17:0> | X |
| | 1 | Add OUT Cascade Multiply | $h_1$<17:0> | cascade | X |
| | 2 | Add OUT Cascade Multiply | $h_2$<17:0> | cascade | X |
| | 3 | Add | $h_3$<17:0> | cascade | X |
| 4-Tap Transpose Form FIR Filter | 0 | Multiply OUT Cascade Multiply | $h_3$<17:0> | x(n)<17:0> | X |
| | 1 | Add OUT Cascade Multiply | $h_2$<17:0> | x(n)<17:0> | X |
| | 2 | Add OUT Cascade Multiply | $h_1$<17:0> | x(n)<17:0> | X |
| | 3 | Add | $h_0$<17:0> | x(n)<17:0> | X |
| 4-Tap Systolic Form FIR Filter | 0 | Multiply OUT Cascade Multiply | $h_0$<17:0> | x(n)<17:0> | X |
| | 1 | Add OUT Cascade Multiply | $h_1$<17:0> | cascade | X |
| | 2 | Add OUT Cascade Multiply | $h_2$<17:0> | cascade | X |
| | 3 | Add | $h_3$<17:0> | cascade | X |

The following Table 4 correlates the composite modes of Table 3 with appropriate operational-mode signals, or "OpMode" signals, and register settings, where:

a. Z, Y, and X (collectively the OpMode) express the respective control signals to the Z, Y, and X multiplexers of multiplexer circuit 1720.

b. A and B refer to the configuration of operand registers 1710 and 1715, respectively: an "X" indicates the corresponding operand register is configured to include two consecutive registers; otherwise, the register is assumed to provide one clock cycle of delay.

c. M refers to register 1730, an X indicating multiplexers 1730 and 1740 are configured to select the output of registers 1735.

d. OUT refers to output register 1760, an X indicating that multiplexer 1765 is configured to select the output of register 1760.

e. "External Resources" refers to the type of resources employed outside of slice 1700.

f. "Output" refers to the mathematical result, where "P" stands for "product," but is not limited to products.

g. "2d" indicates that cascading the B registers of the slices results in a total of the two delays. "3d" indicates there is total of three delays.

TABLE 4

Composite-Mode Register Settings and Outputs

| Composite Mode | Slice | Z 6 | 5 | 4 | Y 3 | 2 | X 1 | 0 | Dual A | B | M | OUT | External Resources | Output |
|---|---|---|---|---|---|---|---|---|---|---|---|---|---|---|
| 35 × 18 Multiply | 0 | 0 | 0 | 0 | 0 | 1 | 0 | 1 | | | | | | P<16:0> |
| | 1 | 1 | 0 | 1 | 0 | 1 | 0 | 1 | x | 2d | | | | P<52:17> |
| 35 × 35 Multiply | 0 | 0 | 0 | 0 | 0 | 1 | 0 | 1 | | | | | registers | P<16:0> |
| | 1 | 1 | 0 | 1 | 0 | 1 | 0 | 1 | x | 2d | | | | |
| | 2 | 0 | 0 | 1 | 0 | 1 | 0 | 1 | x | x | | | registers | P<33:17> |
| | 3 | 1 | 0 | 1 | 0 | 1 | 0 | 1 | | 3d | | | registers | P<69:34> |
| Complex Multiply | 0 | 0 | 0 | 0 | 0 | 1 | 0 | 1 | | | x | x | | |
| | 1 | 0 | 0 | 1 | 0 | 1 | 0 | 1 | x | x | x | x | | P(real) |
| | 2 | 0 | 0 | 0 | 0 | 1 | 0 | 1 | | | x | x | | |
| | 3 | 0 | 0 | 1 | 0 | 1 | 0 | 1 | x | x | x | x | | P(imaginary) |
| Complex Multiply-Accumulate (n cycle) | 0 | 0 | 0 | 0 | 0 | 1 | 0 | 1 | | | x | x | | |
| | 1 | 0 | 0 | 1 | 0 | 1 | 0 | 1 | x | x | x | x | | |
| | 2 | 0 | 0 | 1 | 0 | 0 | 1 | 0 | | | | x | | P(real) |
| | 3 | 0 | 0 | 0 | 0 | 1 | 0 | 1 | | | x | x | | |
| | 4 | 0 | 0 | 1 | 0 | 1 | 0 | 1 | x | x | x | x | | |
| | 5 | 0 | 0 | 1 | 0 | 0 | 1 | 0 | | | | x | | P(imaginary) |
| 4-Tap Direct Form FIR Filter | 0 | 0 | 0 | 0 | 0 | 1 | 0 | 1 | | | x | | | |
| | 1 | 0 | 0 | 1 | 0 | 1 | 0 | 1 | | | x | x | | |
| | 2 | 0 | 0 | 1 | 0 | 1 | 0 | 1 | x | x | x | | | |
| | 3 | 0 | 0 | 1 | 0 | 1 | 0 | 1 | x | | x | x | | $y_3(n-4)$ |
| 4-Tap Transpose Form FIR Filter | 0 | 0 | 0 | 0 | 0 | 1 | 0 | 1 | | | x | x | | |
| | 1 | 0 | 0 | 1 | 0 | 1 | 0 | 1 | | | x | x | | |
| | 2 | 0 | 0 | 1 | 0 | 1 | 0 | 1 | | | x | x | | |
| | 3 | 0 | 0 | 1 | 0 | 1 | 0 | 1 | | | x | x | | $y_3(n-3)$ |
| 4-Tap Systolic Form FIR Filter | 0 | 0 | 0 | 0 | 0 | 1 | 0 | 1 | | | x | x | | |
| | 1 | 0 | 0 | 1 | 0 | 1 | 0 | 1 | x | x | x | x | | |
| | 2 | 0 | 0 | 1 | 0 | 1 | 0 | 1 | x | x | x | x | registers | |
| | 3 | 0 | 0 | 1 | 0 | 1 | 0 | 1 | x | x | x | x | registers | $y_3(n-6)$ |

FIGS. 6A and 6B showed examples of dynamic control. Slice 1700 supports many dynamic DSP configurations in which slices are instructed, using consecutive sets of mode control signals, to configure themselves in a first operational mode at a time t1 to perform a first portion of a DSP operation and then reconfigure themselves in a second operational mode at a later time t2 to perform a second portion of the same DSP operation. Table 5, below, lists a few dynamic operational modes supported by slice 1700. Dynamic modes are also referred to as "sequential" modes because they employ a sequence of dynamic sub-modes, or sub-configurations.

The columns of Table 5 are as follows: "sequential mode" describes the function performed; "slice" numbers identify one or more slices employed in the respective sequential mode, lower numbers corresponding to upstream slices; "Cycle #" identifies the sequence order of number of operational modes used in a given sequential mode; "OpMode" describes the operational modes for each cycle #; and "OpMode<6:0>" define the 7-bit mode-control signals to the Z, Y, and X multiplexers (see FIG. 17) for each operational mode.

TABLE 5

Dynamic Operational Modes

| Sequential Mode | Slice | Cycle # | OpMode | OpMode<6:0> Z 6 | 5 | 4 | Y 3 | 2 | X 1 | 0 |
|---|---|---|---|---|---|---|---|---|---|---|
| 35 × 18 Multiply | 0 | 1 | Multiply | 0 | 0 | 0 | 0 | 1 | 0 | 1 |
|  |  | 2 | 17-Bit Shift Feedback Multiply Add | 1 | 1 | 0 | 0 | 1 | 0 | 1 |
| 35 × 35 Multiply | 0 | 1 | Multiply | 0 | 0 | 0 | 0 | 1 | 0 | 1 |
|  |  | 2 | 17-Bit Shift Feedback Multiply Add | 1 | 1 | 0 | 0 | 1 | 0 | 1 |
|  |  | 3 | Multiply-Accumulate | 0 | 1 | 0 | 0 | 1 | 0 | 1 |
|  |  | 4 | 17-Bit Shift Feedback Multiply Add | 1 | 1 | 0 | 0 | 1 | 0 | 1 |
| Complex Multiply | 0 | 0 | Multiply | 0 | 0 | 0 | 0 | 1 | 0 | 1 |
|  |  | 1 | Multiply-Accumulate | 0 | 1 | 0 | 0 | 1 | 0 | 1 |
|  |  | 2 | Multiply | 0 | 0 | 0 | 0 | 1 | 0 | 1 |
|  |  | 3 | Multiply-Accumulate | 0 | 1 | 0 | 0 | 1 | 0 | 1 |
| Complex Multiply-Accumulate | 0 | 1 to n | Multiply-Accumulate | 0 | 1 | 0 | 0 | 1 | 0 | 1 |
|  |  | n + 1 | Multiply | 0 | 0 | 0 | 0 | 1 | 0 | 1 |
|  | 1 | 1 to n | Multiply-Accumulate | 0 | 1 | 0 | 0 | 1 | 0 | 1 |
|  |  | n + 1 | P Cascade Feedback Add | 0 | 0 | 1 | 0 | 0 | 1 | 0 |
|  | 2 | 1 to n | Multiply-Accumulate | 0 | 1 | 0 | 0 | 1 | 0 | 1 |
|  |  | n + 1 | Multiply | 0 | 0 | 0 | 0 | 1 | 0 | 1 |
|  | 3 | 1 to n | Multiply-Accumulate | 0 | 1 | 0 | 0 | 1 | 0 | 1 |
|  |  | n + 1 | P Cascade Feedback Add | 0 | 0 | 1 | 0 | 0 | 1 | 0 |

Table 6, below, correlates the dynamic operational modes of Table 5 with the appropriate inputs and outputs, where input "A" is the A operand for a given Cycle #; input "B" is the B operand for a given Cycle #; input "C" is the C operand for a given Cycle # ("X" indicates the absence of a C operand); and "Output" is the output, identified by slice, for a given Cycle #.

TABLE 6

Inputs and Outputs for Dynamic Operational Modes

| Sequential Mode | Slice | Cycle # | Inputs A | B | C | Output |
|---|---|---|---|---|---|---|
| 35 × 18 Multiply | 0 | 1 | A<zero, 16:0> | B<17:0> | X | P<16:0> |
|  |  | 2 | A<34:17> | B<17:0> | X | P<52:17> |
| 35 × 35 Multiply | 0 | 1 | A<zero, 16:0> | B<zero, 16:0> | X | P<16:0> |
|  |  | 2 | A<34:17> | B<zero, 16:0> | X |  |
|  |  | 3 | A<zero, 16:0> | B<34:17> | X | P<33:17> |
|  |  | 4 | A<34:17> | B<34:17> | X | P<69:34> |
| Complex Multiply | 0 | 0 | $A_{Re}$<17:0> | $B_{Re}$<17:0> | X |  |
|  |  | 1 | $A_{Im}$<17:0> | $B_{Im}$<17:0> | X | P(real) |
|  |  | 2 | $A_{Re}$<17:0> | $B_{Im}$<17:0> | X |  |
|  |  | 3 | $A_{Im}$<17:0> | $B_{Re}$<17:0> | X | P(imaginary) |
| Complex Multiply-Accumulate | 0 | 1 to n | $A_{Re}$<17:0> | $B_{Re}$<17:0> | X |  |
|  |  | n + 1 | $A_{Re}$<17:0> | $B_{Re}$<17:0> | 0 |  |
|  | 1 | 1 to n | $A_{Im}$<17:0> | $B_{Im}$<17:0> | X |  |
|  |  | n + 1 | $A_{Im}$<17:0> | $B_{Im}$<17:0> | X | P(real) |
|  | 2 | 1 to n | $A_{Re}$<17:0> | $B_{Im}$<17:0> | X |  |
|  |  | n + 1 | $A_{Re}$<17:0> | $B_{Im}$<17:0> | 0 |  |
|  | 3 | 1 to n | $A_{Im}$<17:0> | $B_{Re}$<17:0> | X |  |
|  |  | n + 1 | $A_{Im}$<17:0> | $B_{Re}$<17:0> | X | P(imaginary) |

Figure 18:
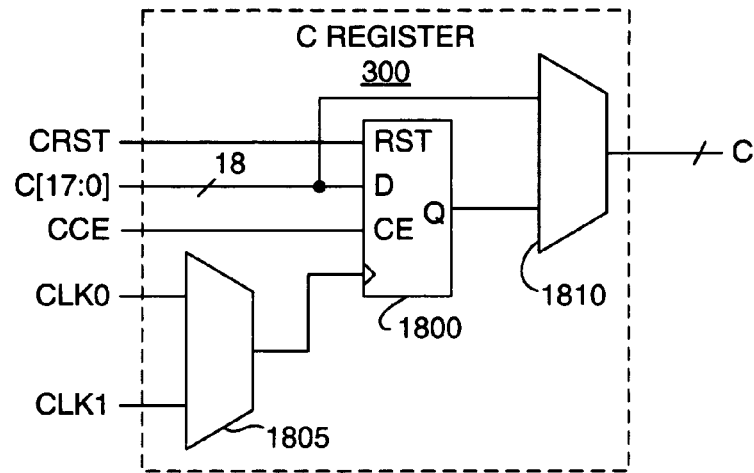
FIG. 18 depicts an embodiment of C register (FIG. 3) used in connection with a slice of FIG. 17.

FIG. 18 depicts an embodiment of C register 300 (FIG. 3) used in connection with slice 1700 of FIG. 17. Register 300 includes 18 configurable storage elements 1800, each having a data terminal D connected to one of 18 operand input lines C[17:0]. Storage elements 1800 conventionally include reset and enable terminals connected to respective reset and enable lines. In one embodiment, the A, B, and C registers have separate reset and enable terminals. A configurable multiplexer 1805 provides either of two clock inputs CLK0 and CLK1 to the clock terminals of elements 1800. A configurable bypass multiplexer 1810 selectively includes or excludes storage element 1800 in the C operand input path. Configurable multiplexers 1805 and 1810 are controlled by configuration memory cells (not shown), but may also be dynamically controlled—e.g. by an extended mode register 1723.

Figure 19:
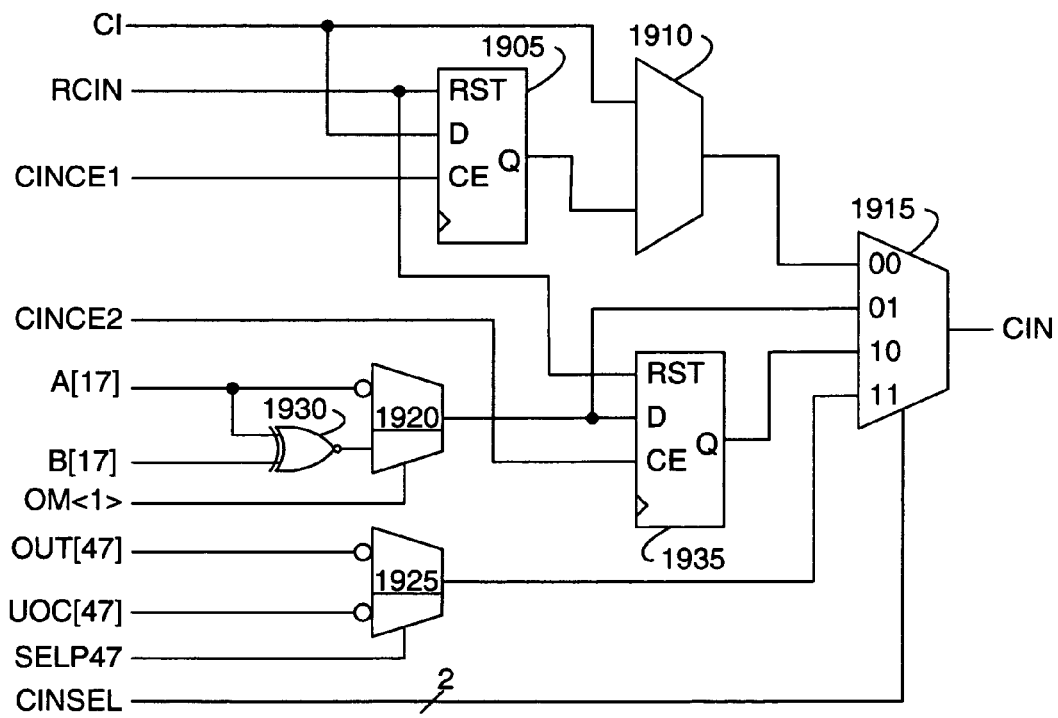
FIG. 19 depicts an embodiment of carry-in logic of FIG. 17.

FIG. 19 depicts an embodiment of carry-in logic 1750 of FIG. 17. Carry-in logic 1750 includes a carry-in register 1905 with associated configurable bypass multiplexer 1910. These elements together deliver registered or un-registered carry-in signals to a dynamic output multiplexer 1915 controlled via carry-in-select lines CINSEL from the general interconnect.

Carry-in logic 1750 conventionally delivers carry-in signal CI to adder 1719 (FIG. 17) via carry-in line CIN. Carry-in logic 1750 additionally supports rounding in a manner similar to that described above in connection with FIGS. 15 and 16, but is not limited to the rounding of products. The rounding resources include a pair of dynamic multiplexers 1920 and 1925, and XNOR gate 1930, and a bypassed register 1935. Registers 1905 and 1935 receive respective enable signals on respective lines CINCE1 and CINCE2. These rounding resources support the following functions:

CINSEL=00: Multiplexer 1915 provides carry-in input CI to adder 1719 via carry-in line CIN.

CINSEL=01: Multiplexer 1915 provides the output of multiplexer 1920 to adder 1719. If slice 1700 is configured to round a product from product generator 1727, OpMode bit OM[1] will be a logic zero. In that case, multiplexer 1920 provides an XNOR of the sign bits of operands A and B to register 1935 and multiplexer 1915. The carry-in signal on line CIN will therefore be the correction factor CF discussed above in connection with FIG. 15 for multiply/round functions.

CINSEL=10: This functionality is the same as when CINSEL=01, except that the output of multiplexer 1920 is taken from register 1935. Signal CINSEL is set to 10 when registers 1735 (FIG. 17) are included.

CINSEL=11: Multiplexer 1925 decodes OpMode bits OM[6,5,4,1,0] to determine whether slice 1700 is rounding its own output OUT, as for an accumulate operation, or the output of an upstream slice, as for a cascade operation. Accumulate operations select the sign bit OUT[47] of the output of slice 1700, whereas cascade operations select the sign bit UOC[47] of upstream-output-cascade bus UOC. The select terminals of multiplexer 1925 decode the OpMode bits as follows: SELP47=(OM[1]&~OM[0])||OM[5]||~OM[6]||OM[4], where "~" denotes the AND function, "||" the OR function, and "~" the NOT function.

Figure 20A:
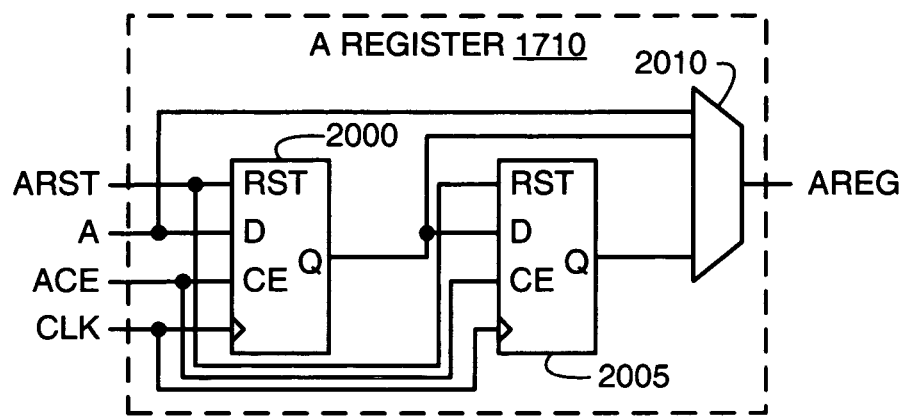
FIG. 20A details a two-deep operand register in accordance with one embodiment of a slice of FIG. 17.
Figure 20B:
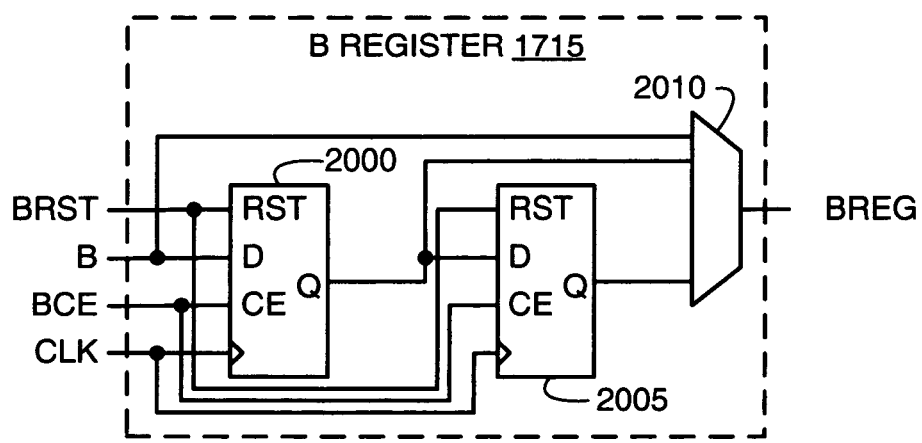
FIG. 20B details a two-deep operand register in accordance with one embodiment of a slice of FIG. 17.

FIGS. 20A and 20B detail respective two-deep operand registers 1710 and 1715 in accordance with one embodiment of slice 1700. Registers 1710 and 1715 are identical, so a discussion of register 1715 is omitted. While two-deep in the depicted example, either or both of registers 1710 and 1712 can include additional cascaded storage elements to provide greater depth.

Register 1710, the "A" register, includes two 18-bit collections of cascaded storage elements 2000 and 2005 and a bypass multiplexer 2010. Multiplexer 2010 can be configured to delay A operands by zero, one, or two clock cycles by selecting the appropriate input port. Multiplexer 2010 is controlled by configuration memory cells (not shown) in this embodiment, but might also be controlled dynamically, as by an OpMode register. In the foregoing examples, such as in FIG. 9, the B registers are cascaded to downstream slices; in other embodiments, the A registers are cascaded in the same manner or cascaded in the opposite direction as B.

Figure 21:
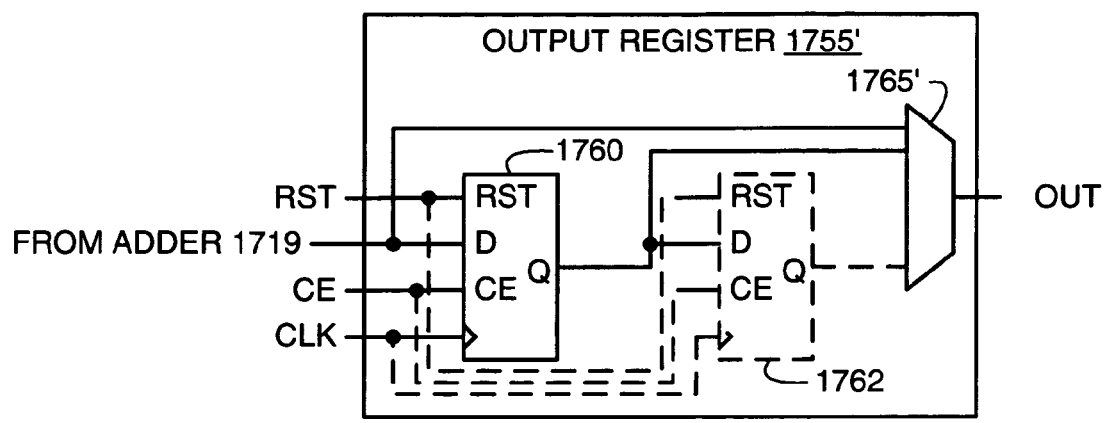
FIG. 21 details a two-deep output register in accordance with an alternative embodiment of a slice of FIG. 17.

It is sometimes desirable to alter operands without interrupting signal processing. It may be beneficial, for example, to change the filter coefficients of a signal-processing configuration without having to halt processing. Storage elements 2000 and 2005 are therefore equipped, in some embodiments, with separate, dynamic enable inputs. One storage element, e.g., 2005, can therefore provide filter coefficients, via multiplexer 2010, while the other storage element, e.g., 2000, is updated with new coefficients. Multiplexer 2010 can then be switched between cycles to output the new coefficients. In an alternative embodiment, register 2000 is enabled to transfer data to adjacent register 2005. In other embodiments, the Q outputs of registers 2000 can be cascaded to the D inputs of registers 2000 in adjacent slices so that new filter coefficients can be shifted into registers 2000 while registers 2005 hold previous filter coefficients. The newly updated coefficients can then be applied by enabling registers 2005 to capture the new coefficients from corresponding registers 2000 on the next clock edge FIG. 21 details a two-deep output register 1755' in accordance with an alternative embodiment of slice 1700 of FIG. 17. The output register 1755' shown in FIG. 21 is similar to output register 1755 in FIG. 17 except an optional second register 1762 is connected in between register 1760 and multiplexer 1765'. The 48-bit output from adder 1719 can be stored in registers 1760 or 1762 or both registers. Either registers 1760 or 1762 or both registers may be bypassed so that the 48-bit output from adder 1719 can be sent directly to OUT. Register 1762 can be used as a holding register for OUT while register 1760 receives another input from adder 1719.

Figure 22:
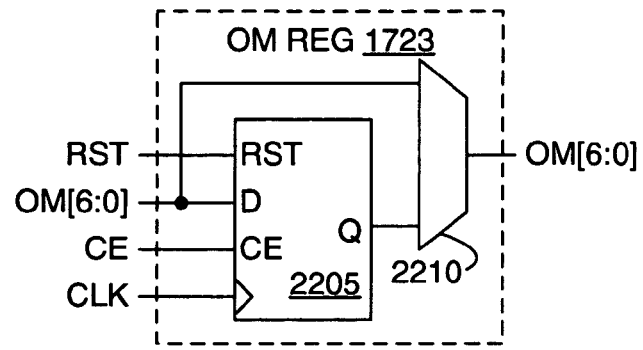
FIG. 22 depicts an OpMode register in accordance with one embodiment of a slice.

FIG. 22 depicts OpMode register 1723 in accordance with one embodiment of slice 1700. Register 1723 includes a storage element 2205 and a configurable bypass multiplexer 2210. The input and output busses of register 1723 bear the same name. Storage element 2205 includes seven storage elements connected in parallel to seven lines of OpMode bus OM[6:0]. The number of bits in OpMode register 1723 can be extended to support additional dynamic resources.

Figure 23:
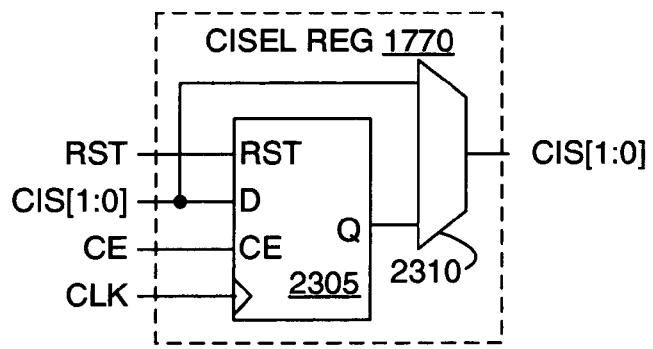
FIG. 23 depicts a carry-in-select register in accordance with one embodiment of a slice.

FIG. 23 depicts carry-in-select register 1770 in accordance with one embodiment of slice 1700. Register 1770 includes a storage element 2305 and a configurable bypass multiplexer 2310. The input and output busses of register 1770 bear the same name. Storage element 2305 includes two Storage elements connected in parallel to two carry-in-select lines of carry-in-select bus CIS[1:0]. The number of bits in register 1770 can be extended to support additional operations.

Figure 24:
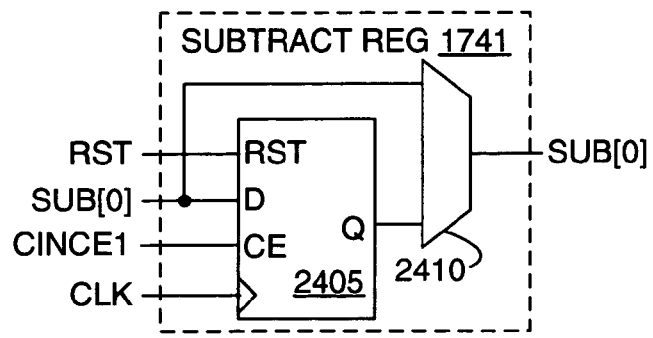
FIG. 24 depicts a subtract register in accordance with one embodiment of a slice.

FIG. 24 depicts subtract register 1741 in accordance with one embodiment of slice 1700. Register 1741 includes a storage element 2405 and a configurable bypass multiplexer 2410. The input and output busses of register 1741 bear the same name. Storage element 2405 connects to subtract line SUB. In one embodiment, subtract register 1741 and carry-in-select register 1770 share an enable terminal CINCE1.

Arithmetic Circuit With Multiplexed Addend Input Terminals

FIG. 25 depicts an arithmetic circuit 2600 in accordance with one embodiment. Arithmetic circuit 2600 is also similar to arithmetic circuit 1717, including product generator 1727, register bank 1730, multiplexing circuitry 1721, and adder 1719 in slice 1700 of FIG. 17, but is simplified for ease of illustration. Also, where applicable, the same label numbers are used in FIG. 25 as in FIG. 17 for ease of illustration.

The multiplexing circuitry of arithmetic circuit 2600 includes an X multiplexer 2605 dynamically controlled by two low-order OpMode bits OM[1:0], a Y multiplexer 2610 dynamically controlled by two mid-level OpMode bits OM[3:2], and a Z multiplexer 2615 dynamically controlled by the three high-order OpMode bits OM[6:4]. OpMode bits OM[6:0] thus determine which of the various input ports present data to adder 1719. Multiplexers 2605, 2610, and 2615 each include input ports that receive addends from sources other than product generator 1727, and are referred to collectively as "PG bypass ports." In this example, the PG bypass ports are connected to the OUT port, i.e., OUT[0:48], the concatenation of operands A and B A:B[0:35], the C operand upstream-output-cascade bus UOC, and various collections of terminals held at voltage levels representative of logic zero. Other embodiments may use more or fewer PG bypass ports that provide the same or different functionality as the ports of FIG. 25.

If the sum of the outputs of X multiplexer 2605, Y multiplexer 2610, and the carry-in signal CIN are to be subtracted from the Z input from multiplexer 2615, then subtract signal SUB is asserted. The result is:

$$\text{Result} = [Z - (X + Y + Cin)] \quad (8)$$

The full adders in adder 1719, as will be further described in relation to FIG. 36 below, use a well known identity to perform subtraction:

$$Z - (X + Y + Cin) = \overline{Z + \overline{(X + Y + Cin)}} \quad (9)$$

Equation 9 shows that subtraction can be done by inverting Z (one's complement) and adding it to the sum of (X+Y+Cin) and then inverting (one's complement) the result.

Figure 26:
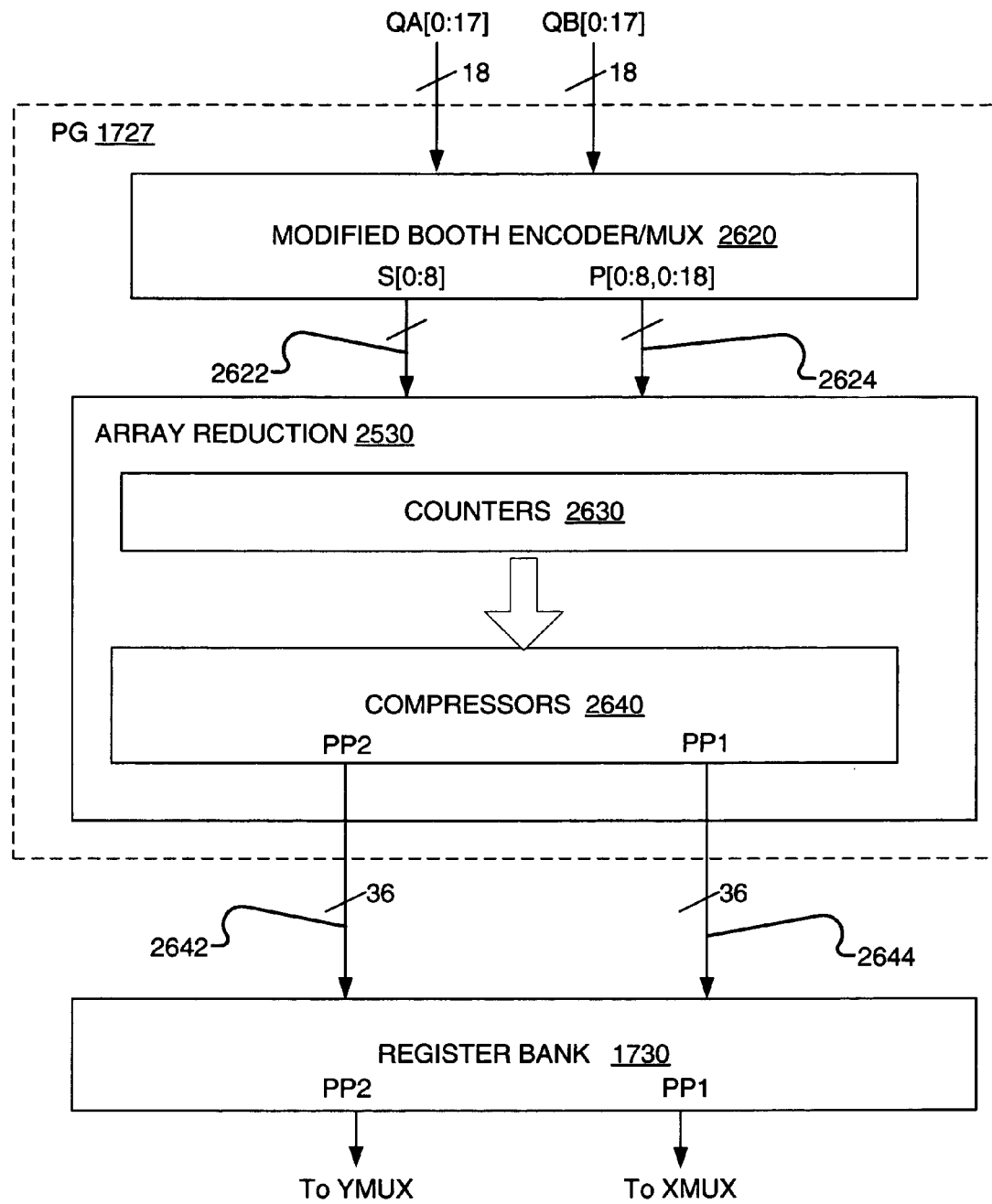
FIG. 26 is an expanded view of the product generator (PG) of FIG. 25.

FIG. 26 is an expanded view of the product generator (PG) 1727 of FIG. 25. The PG 1727 receives two 18-bit inputs, QA[0:17] and QB[0:17] (FIG. 17). QA[0:17] and QB[0:17] are encoded to a redundant radix 4 form via Modified Booth Encoder/Mux 2620 to produce nine subtract bits S[0:8], i.e., s0 to s8, and a [9×18] partial product array, P[0:8, 0:18] (see FIG. 29). The subtract bits and partial products are input into array reduction 2530 that includes counters 2630 and compressors 2640. The counters 2630 receives the subtract bits and partial products inputs and send output values to the compressors 2640 which produce two 36-bit partial product outputs PP2 and PP1.

There are two types of counters, i.e., a (11,4) counter and a (7,3) counter. The counters count the number of ones in the input bits. Hence a (11,4) counter has 11 1-bit inputs that contain up to of 11 logic ones and the number of ones is indicated by a 4-bit output (0000 to 1011). Similarly a (7,3) counter has 7 1-bit inputs that can have up to 7 ones and the number of ones is indicated by a 3-bit output (000 to 111).

There are two types of compressors, i.e., a (4,2) compressor and a (3,2) compressor, where each compressor has one or more adders. The (4,2) compressor has five inputs, i.e., four external inputs and a carry bit input (Cin) and three outputs, i.e., a sum bit (S) and two carry bits (C and Cout). The output bits, S, C, and Cout represent the sum of the 5 input bits, i.e., the four external bits plus Cin. The (3,2) has four inputs, i.e., three external inputs and a carry bit input (Cin) and three outputs, i.e., a sum bit (S) and two carry bit (C and Cout). The output bits, S, C, and Cout represent the sum of the 4 input bits, i.e., the three external bits plus Cin.

The partial products PP2 and PP1 are transferred via 36-bit buses 2642 and 2644 from compressors 2640 to register bank 1730. With reference to FIGS. 17, 25, and 26, PP2 and PP1 go via the Y multiplexer 2610 (YMUX) and the X multiplexer 2605 (XMUX) in multiplexer circuitry 1721 to adder 1719 where PP1 and PP2 are added together to produce a 36 bit product on a 48 bit bus that is stored in register bank 1755.

In an exemplary embodiment the Modified Booth Encoder/Mux 2520 of FIG. 26 receives two 18-bit inputs, i.e., QA[0:17] and QB[0:17] and produces a partial product array that is sent to array reduction 2530. There are nine 19-bit partial products, P[0:8,0:18] and nine subtract bits s0-s8 (see FIG. 29 described below).

The booth encoder coverts the multiplier from a base 2 form to a base 4 form. This reduces the number of partial products by a factor of 2, e.g., in our example from 18 to 9 partial products. For illustration purposes, let X = $X_{m-1}, x_{m-2}, \ldots, x_0$, be a binary m-bit number, where m is a positive even number. Then the m-bit multiplier may be written in two-complement form as:

$$X = -2^{m-1} x_{m-1} + \sum_{i=0}^{m-2} x_i 2^i$$

where $x_i = 0, 1$

An equivalent representation of X in base four is given by:

$$X = \sum_{i=0}^{\frac{m}{2}-1} (x_{2i-1} + x_{2i} - x_{2i+1}) 4^i = \sum_{i=0}^{\frac{m}{2}-1} (d_i) 4^i$$

where $x_{-1} = 0$ and $d_i$ may have a value of from the set of $\{-2,-1,0,1,2\}$.

If the multiplicand has n bits then the XY product is given by;

$$XY = \sum_{i=0}^{\frac{m}{2}-1} (d_i) 4^i Y = \sum_{i=0}^{\frac{m}{2}-1} P_i 4^i$$

$P_i$ represents the value X shifted and/or negated according to the value of $d_i$. There are m/2 partial products $P_i$ where each partial product has at least n bits. In the case of FIG. 26 where m=n=18 (inputs X=QA[0:17] and Y=QB[0:17]), there are 9 partial products, e.g., $P_0$ to $P_8$, and each partial products has n+1 or 19 bits.

For the purposes of illustration let the multiplier be X, where X=QA[0:17] and let Y be the multiplicand, where Y=QB[0:17]. A property of the modified Booth algorithm is that only three bits are needed to determine $d_i$. The 18 bits of X are given by $x_{2i+1}$, $x_{2i}$, and $x_{2i-1}$, where i=0, 1, . . . 8. We define $x_{-1=0}$. For each i, three bits $x_{2i+1}$, $x_{2i}$, and $x_{2i-1}$ are used to determine $d_i$ by using table 7 below:

TABLE 7

| $x_{2i+1}$ | $x_{2i}$ | $x_{2i-1}$ | $d_i$ | A | S | X2 |
|---|---|---|---|---|---|---|
| 0 | 0 | 0 | 0 | 1 | 1 | 1 |
| 0 | 0 | 1 | 1 | 0 | 1 | 0 |
| 0 | 1 | 0 | 1 | 0 | 1 | 0 |
| 0 | 1 | 1 | 2 | 0 | 1 | 1 |
| 1 | 0 | 0 | -2 | 1 | 0 | 1 |
| 1 | 0 | 1 | -1 | 1 | 0 | 0 |

TABLE 7-continued

| $x_{2i+1}$ | $x_{2i}$ | $x_{2i-1}$ | $d_i$ | A | S | X2 |
|---|---|---|---|---|---|---|
| 1 | 1 | 0 | -1 | 1 | 0 | 0 |
| 1 | 1 | 1 | 0 | 1 | 0 | 1 |

Figure 27:
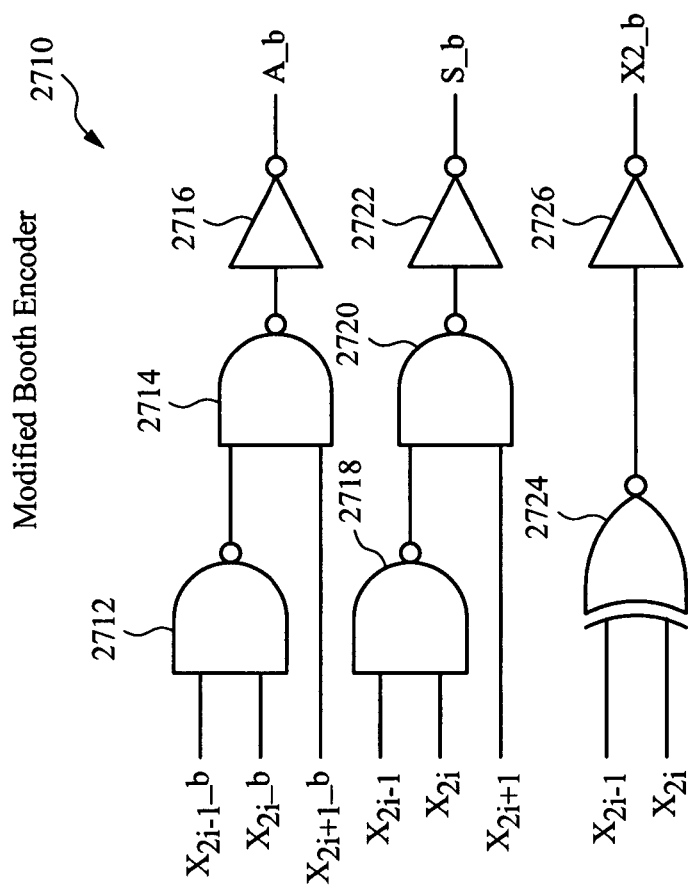
FIG. 27 is a schematic of the modified Booth encoder.

FIG. 27 is a schematic of the modified Booth encoder as represented by table 7. The inputs are bits $x_{2i+1}$, $x_{2i}$, and $x_{2i-1}$ or their inverted value as represented by the "_b", e.g., $x_{2i-1}$_b is $x_{2i-1}$ inverted. FIG. 27 shows NAND 2712 connected to NAND 2714 which is in turn connected to inverter 2716 which produces output A_b (i.e., A inverted). NAND 2718 is connected to NAND 2720 which is in turn connected to inverter 2722 which produces output S_b (i.e., S inverted). XNOR 2724 is connected to the inverter 2726 which produces output X2_b (i.e., X2 inverted).

Figure 28:
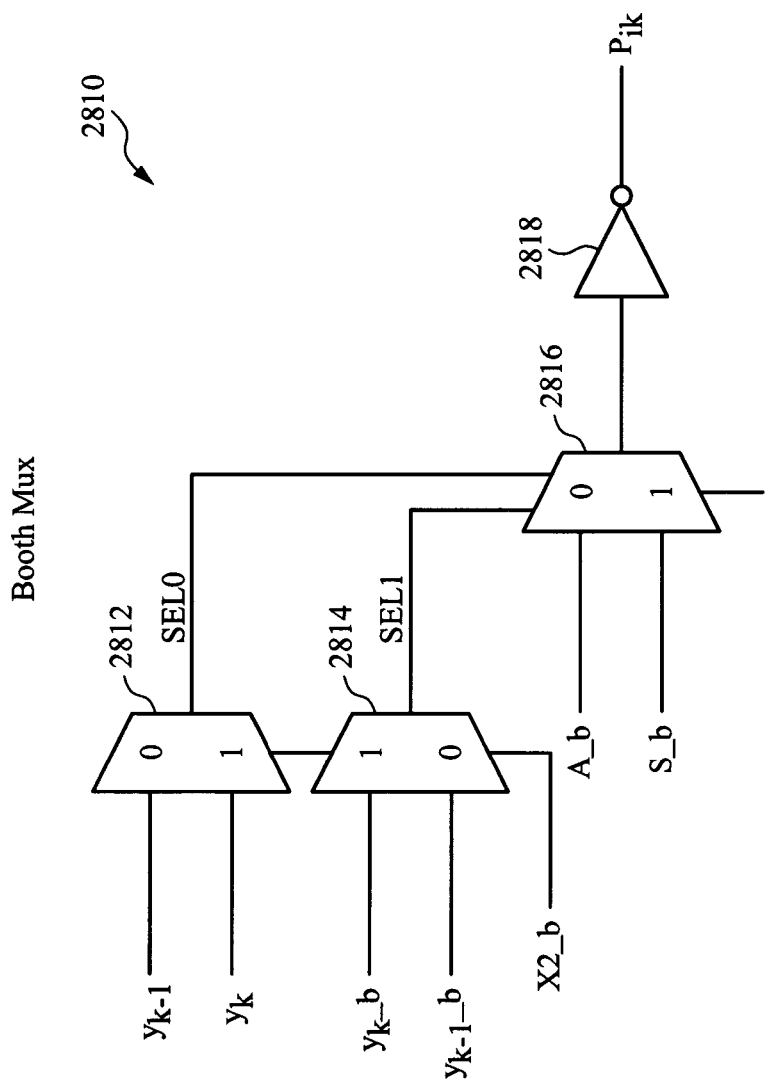
FIG. 28 is a schematic of a Booth multiplexer that produces the partial products.

FIG. 28 is a schematic of a Booth multiplexer that produces the partial products $P_k$, i.e., P[0:8, 0:18]. Once the multiplier X is encoded, the encoded multiplier (e.g., $d_0$ to $d_8$) is then multiplied by the multiplicand Y. Because $d_i$ has values in the set {-2, -1, 0, 1, 2}, non-zero values of $d_i Y$ can be calculated by a combination of left shifting (i.e., for $d_i$={-2, 2}, selecting $y_{k-1}$ at bit k) and negating multiplicand Y (i.e., for $d_i$={-2, -1}). Multiplexers 2812 and 2814 are differential multiplexers that receive $y_{k-1}$ and $y_k$ and the inverse of $Y_{k-1}$ and $y_k$, (i.e., $y_{k-1}$_b and $y_k$_b). The two select lines SEL0 and SEL1 have inverted values relative to each other into multiplexer 2816. The output of multiplexer 2816 is inverted via inverter 2818, which produces partial products $P_{ik}$. In addition an inverted subtract bit s0_b to s8_b is produced for each i.

FIG. 29 shows the partial product array produced from the Booth encoder/mux 2620. Header row 2930 shows the 36 weights output by the modified Booth encoder/mux 2620. Header column 2920 shows the nine rows, that contains the partial product output by the Booth encoder/mux 2620. For example, p0 represents $P_{ik}$, where i=0 and k=0, 1, ..., 18. The subtract bit for p0 is given by s0. The array shown in FIG. 29 is well known to one of ordinary skill in the art.

Because the partial products are in two's complement form, to obtain the correct value for the sum of the partial products, each partial product would require sign extension. However, the sign extension increases the circuitry needed to multiply two numbers. A modification to each partial product by inverting the most significant bit, e.g., p0 at bit 18 becomes p0_b, and adding a constant 10101010 ... 101011 starting at the 18$^{th}$ bit, i.e., adding 1 to bit 18 and adding 1 to the right of each partial product, reduces the circuitry needed (more explanation is given in the published paper "Algorithms for Power Consumption Reduction and Speed Enhancement in High-Performance Parallel Multipliers", by Rafael Fried, presented at the PATMOST'97 Seventh International Workshop Program in Belgium on Sep. 8-10, 1997 and is herein incorporated by reference). FIG. 30 in sub-array 3012 shows the modified partial products array.

FIG. 30 shows the array reduction of the partial products in four stages. Stage 1 is the sub-array 3012 and gives the partial products array received and modified from the booth encoder/mux 2620 (FIG. 26) by the array reduction block 2530 (FIG. 26). In the counter block 2630, (11,4) counters 3024 are applied to bit columns 14-21, (7,3) counters 3022 are applied to bit columns 6-13 and 22-28, full adders 3020 are applied to bit columns 2, 4-5 and 29-31. The results of the counters and full adders are sent to stage 2 (sub-array 3014) and thence to stage 3 (sub-array 3016). Stages 2 and 3 are done in compressor block 2640. In compressor block 2640, (4,2) compressors 3028 are applied to bit columns 12 and 17-24, (3,2) compressors 3026 are applied to bit columns 13-16 and 25-29, and full adders 3020 are applied to bit columns 3-11 and 30-33. The results of stages 2 and 3 are shown in stage 4 (sub-array 3018) and are the 36-bit partial product PP1 and 36-bit partial product PP2, which is sent to register bank 1730 (FIG. 26).

With reference to FIGS. 31, 32, and 33A-E, the (11,4) and (7,3) counters of counter block 2630 of FIG. 26 and the (11,4) and (7,3) counters of FIG. 30, are described in more detail below.

Figure 31:
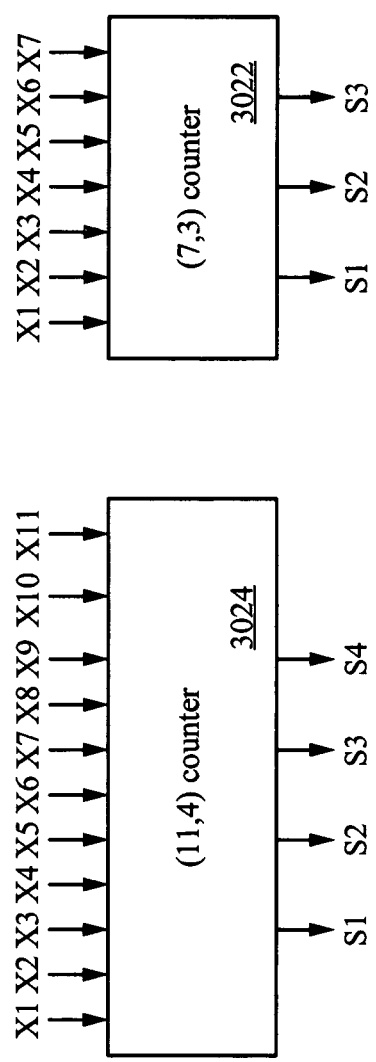
FIG. 31 shows a black box representation of an (11,4) counter and a (7,3) counter.

FIG. 31 shows the block diagram of an (11,4) counter 3024 and a (7,3) counter 3022. The (11,4) and (7,3) counters count the number of 1's in their 11-bit (i.e., X1-X11) and 7-bit (i.e., X1-X7) inputs, respectively, and give a 4-bit (S1-S4) or 3-bit (S1-S3) output of the number of ones in the input bits. In one embodiment, the (11,4) counter is formed using a (15,4) counter. To improve the performance of the (15,4) and (7,3) counters, in one embodiment, symmetric functions are used.

Symmetric functions are based on combinations of n variables taken k at a time. For example, for three letters in CAT (n=3), there are three two-letter groups (k=2): CA, CT, and AT. Note order does not matter. Two types of symmetric functions are defined: the XOR-symmetric function {n,k} and OR-symmetric function [n,k]. Given n Boolean variables: X1, X2, ..., Xn, the XOR-symmetric function {n,k}, is a XORing of products where each product consists of k of the n variables ANDed together and the products include all distinct ways of choosing k variables from n. The OR-symmetric function [n,k], is an ORing of products where each product consists of k of the n variables ANDed together and the products include all distinct ways of choosing k variables from n.

Examples of XOR-symmetric and OR-symmetric functions for the counter result bits, i.e., S1 and S2, of the (3,2) counter are:

S1=X1⊕X2⊕X3
S2={3,2}=X1X2⊕X1X3⊕X2X3 (XOR-symmetric function)
1.OR
S2=[3,2]=X1X2+X1X3+X2X3 (OR-symmetric function)

The symmetric functions for the (7,3) counter are (where the superscript c means the ones complement, i.e., the bits are inverted):
S1={7,1}
S2=[7,2][7,4]c+[7,6]
S3=[7,4]

The symmetric functions for the (15,4) counter are:
S1={15,1}
S2={15,2}
S3=[15,4][15,8]c+[15,12]
S4=[15,8]

A divide and conquer methodology is used to implement the (7, 3) and (15,4) symmetric functions. The methodology is based on Chu's identity for elementary symmetric functions:

$$[r+s, n] = \sum_{k}^{+} [r, k][s, n-k]$$

$$\{r+s, n\} = \sum_{k}^{\oplus} \{r, k\}\{s, n-k\}$$

Chu's identity allows large combinatorial functions to be broken down into a sum of products of smaller ones. As an example, consider the four Boolean variables: X1, X2, X3, and X4. To compute [4,2], two groups of variables, e.g., group 0=(X1, X2) and group 1=(X3, X4), are taken one at a time and these two groups of variables are then taken two at a time:

$[2,1]_0 = X1+X2$  $[2,1]_1 = X3+X4$
$[2,2]_0 = X1X2$  $[2,2]_1 = X3X4$

Figure 32:
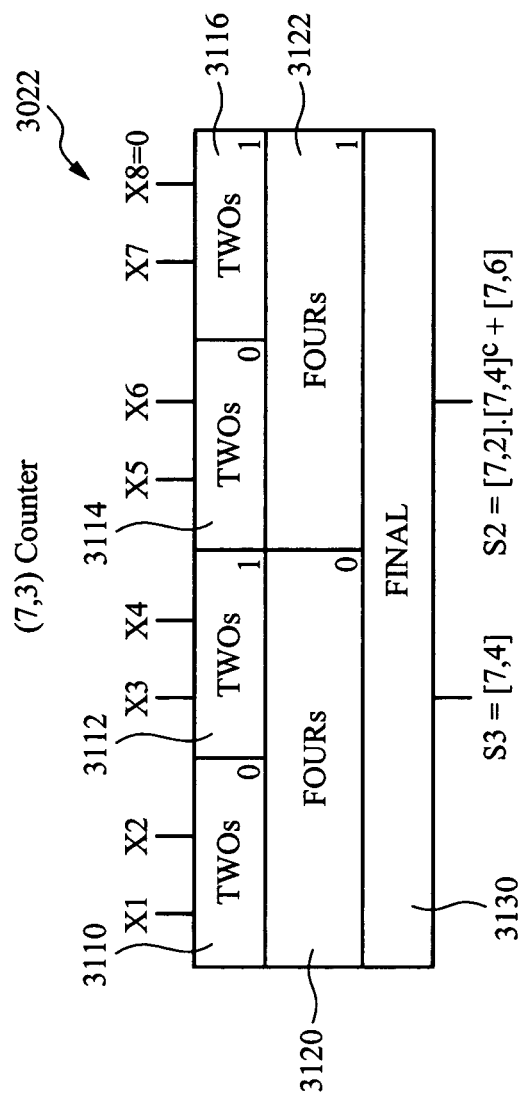
FIG. 32 shows an example of a floorplan for a (7,3) counter.

Hence with r=s=2 and n=2 and using Chu's identity above:
$[4,2] = [2,1]_0[2,1]_1 + [2,2]_0 + [2,2]_1$ FIG. 32 shows an example of a floor plan for a (7,3) counter. There are four groups of twos (3110, 3112, 3114, and 3116), each representing 2 inputs of X1-X8 (where X8=0) taken two and one at a time. Next there are two groups of four (3120, 3122), each representing four inputs from each pair of groups of two. The final block 3130 combines the two groups of four (3120 and 3122), to produce the sums S3 and S2.

The eight inputs into the (7,3) counter are first grouped into four groups of two elements each, i.e., (X1,X2), (X3,X4), (X5,X6), (X7,X8), where X8=0. For the first group of (X1, X2), denoted by the subscript 0 in FIG. 32:

$[2,1]_0 = X1+X2$
$[2,2]_0 = X1X2$

For the second group of (X3,X4), denoted by the subscript 1 in FIG. 32:

$[2,1]_1 = X3+X4$
$[2,2]_1 = X3X4$

There are similar equations are for (X5,X6) and (X7,X8). Next the first two groups of the four groups of two are input into a first group of four (subscript 0). The second two groups of the four groups of two are input into a second group of four (subscript 1). As computation of the second group of four is similar to the first group of four, only the first group of four is given:

$[4,1]_0 = [2,1]_0 + [2,1]_1$
$[4,2]_0 = [2,1]_0[2,1]_1 + [2,2]_0 + [2,2]_1$
$[4,3]_0 = [2,1]_0[2,2]_1 + [2,1]_1[2,2]_0$
$[4,4]_0 = [2,2]_0[2,2]_1$

Next the two groups of four are combined to give the final count:

$[8,4] = [4,1]_0[4,3]_1 + [4,2]_0[4,2]_1 + [4,3]_0[4,1]_1 + [4,4]_0 + [4,4]_1$
$[8,2] = [4,1]_0[4,1]_1 + [4,2]_0 + [4,2]_1$
$[8,6] = [4,2]_0[4,4]_1 + [4,3]_0[4,3]_1 + [4,4]_0[4,2]_1$

Since X8=0 and $[4,4]_1 = 0$, $[7,4] = [4,1]_0[4,3]_1 + [4,2]_0[4,2]_1 + [4,3]_0[4,1]_1 + [4,4]_0$
$[7,2] = [4,1]_0[4,1]_1 + [4,2]_0 + [4,2]_1$
$[7,6] = [4,3]_0[4,3]_1 + [4,4]_0[4,2]_1$ Hence,
S3=[7,4]
$S2=[7,2][7,4]^c + [7,6]$
S1={7,1}

The symmetric functions for the (15,4) counter are divided into two parts. The two most significant bits (MSBs), e.g., S3 and S4 are computed using an OR symmetric function (AND-OR and NAND-NAND logic) and the two least significant bits (LSBs), e.g., S1 and S2, are computed using an XOR symmetric function.

The FIG. 33A shows the floor plan for the (15,4) counter. There are 16 input bits (X1-X16, where X16=0). The MSBs are computed using alternate rows 3320, 3322, 3324, and 3326. The LSBs are computed using alternate rows 3312, 3314, 3316, and 3318. Row 3312 and 3320 are groups of twos, rows 3314 and 3322 are groups of four, rows 3316 and 3324 are groups of eight, and rows 3318 and 3326 are the final groups which produces the sum.

For the MSBs the groups of two and four are constructed similarly to the (7,3) counter and the description is not repeated. The group of 8 is:

$[8,1] = [4,1]_0 + [4,1]_1$
$[8,2] = [4,1]_0[4,1]_1 + [4,2]_0 + [4,2]_1$
$[8,3] = [4,3]_0 + [4,3]_1 + [4,2]_0[4,1]_1 + [4,2]_1[4,1]_0$
$[8,4] = [4,4]_0 + [4,4]_1 + [4,3]_0[4,1]_1 + [4,1]_0[4,3]_1 + [4,2]_0[4,2]_1$
$[8,5] = [4,4]_0[4,1]_1 + [4,1]_0[4,4]_1 + [4,2]_0[4,3]_1 + [4,3]_0[4,2]_1$
$[8,6] = [4,2]_0[4,4]_1 + [4,4]_0[4,2]_1 + [4,3]_0[4,3]_1$
$[8,7] = [4,3]_0[4,4]_1 + [4,4]_0[4,3]_1$
$[8,8] = [4,4]_0[4,4]_1$

Figure 33B:
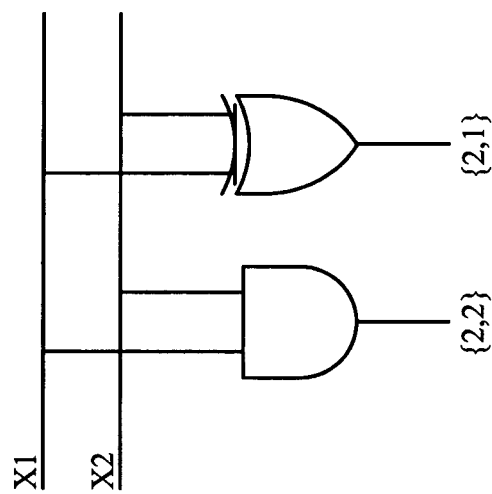
Figure 33B:
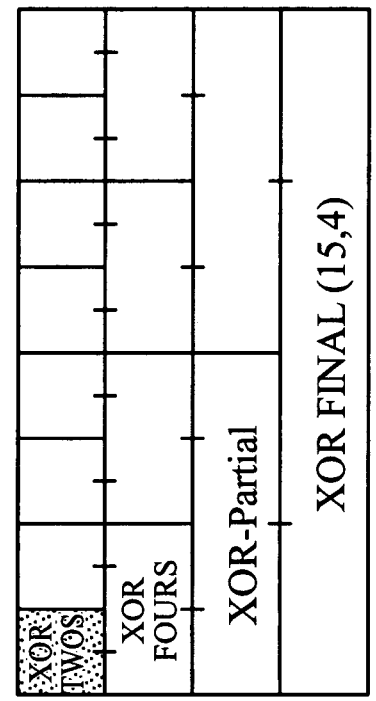
Figure 33C:
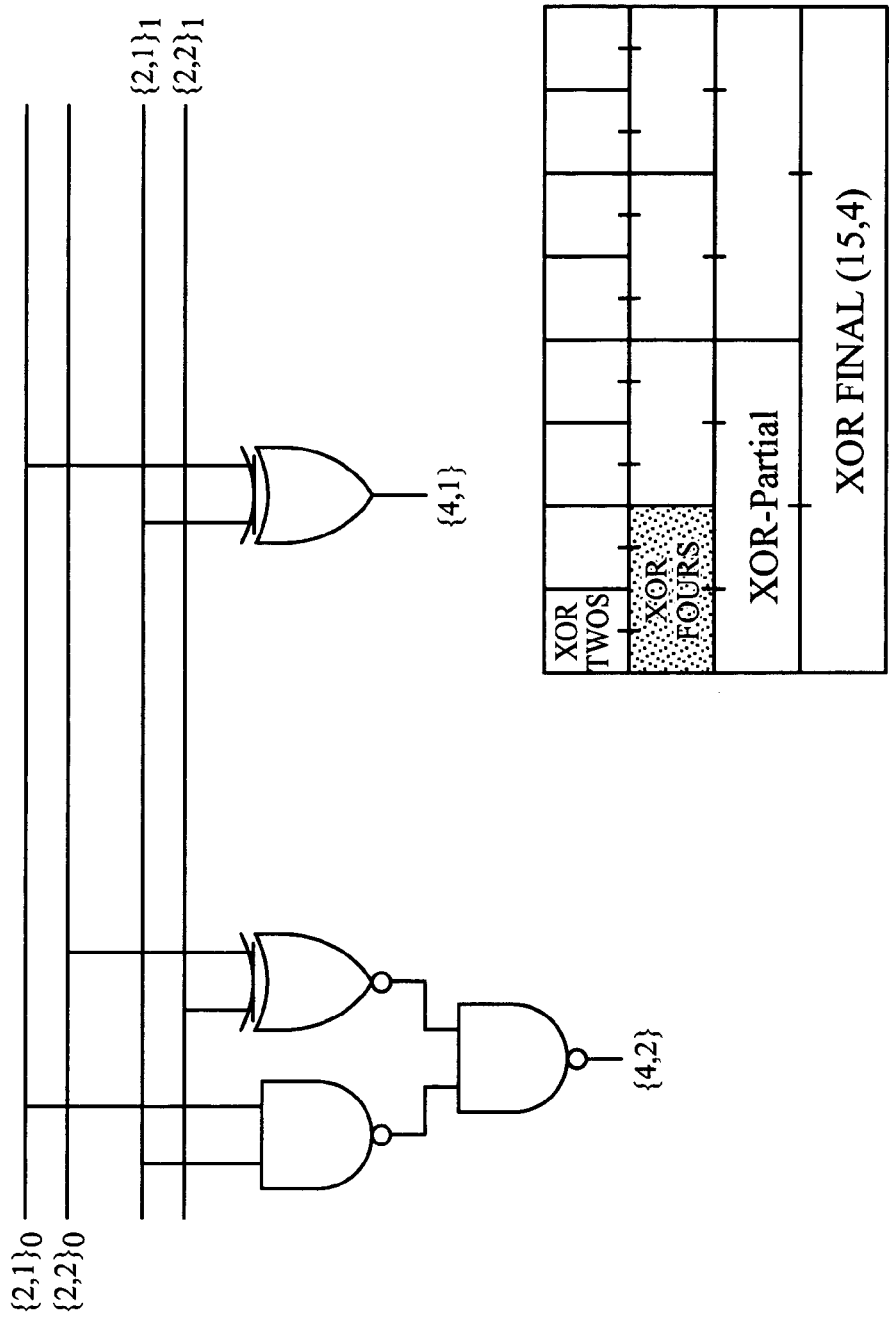
Figure 33D:
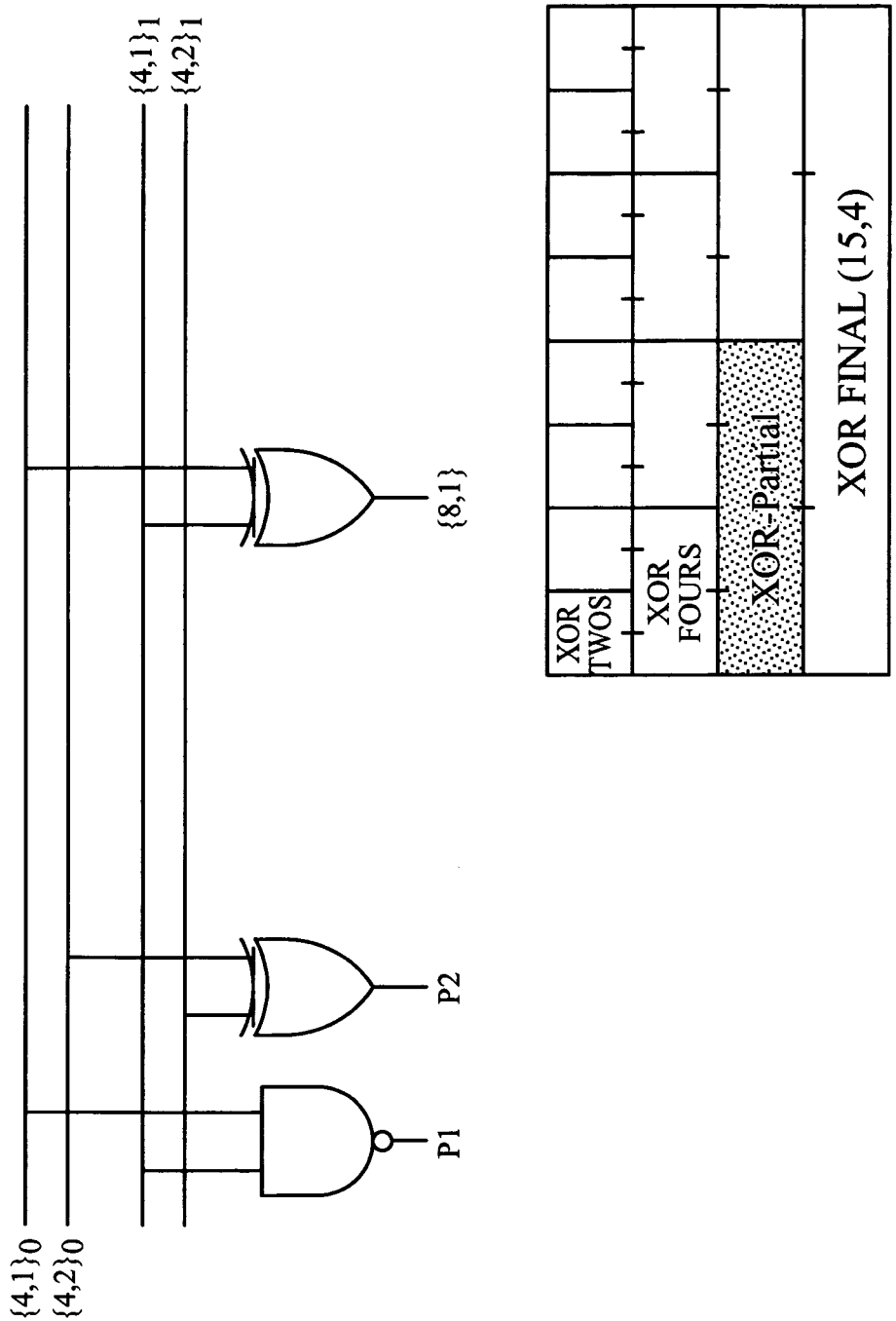
Figure 33E:
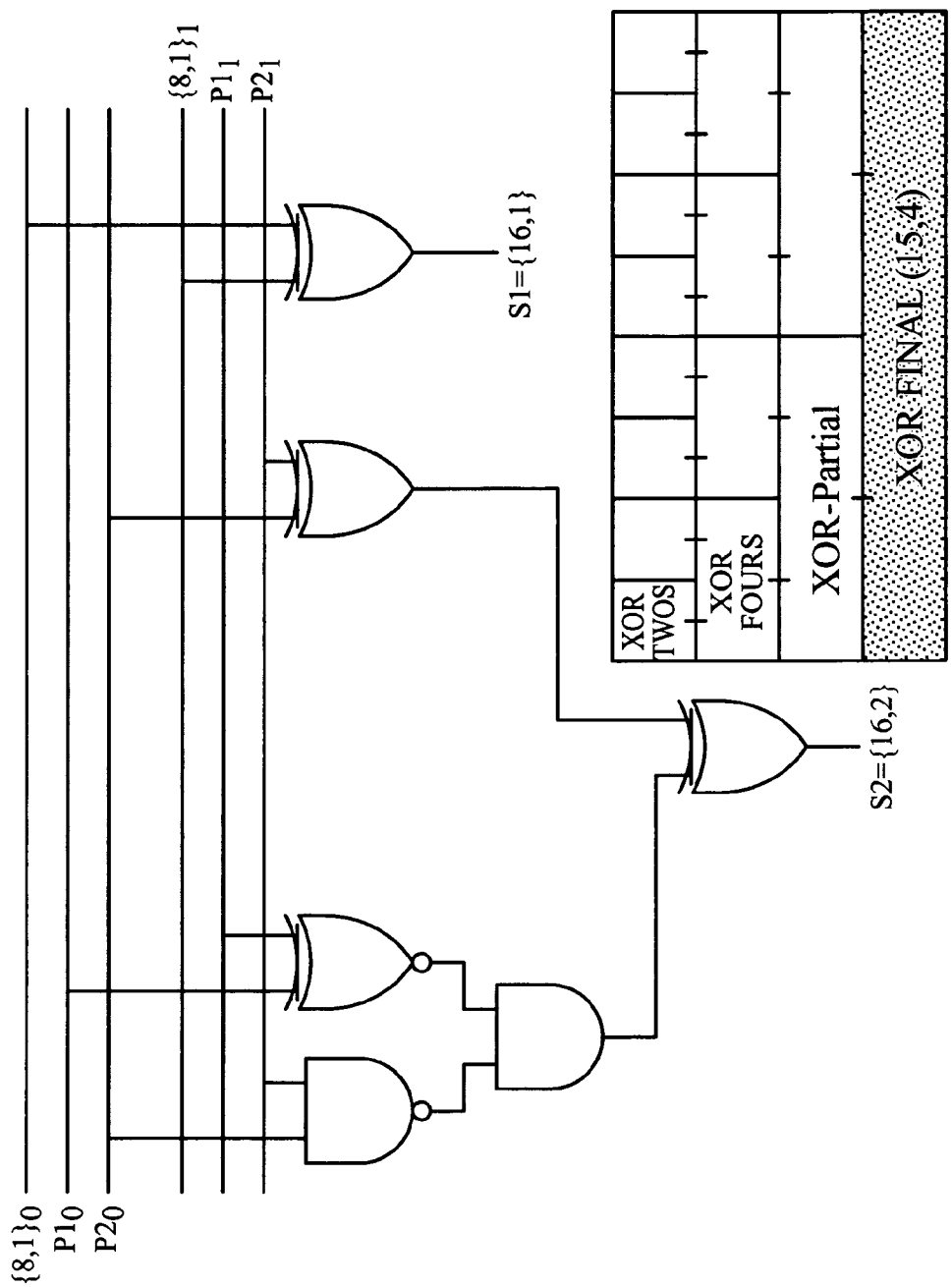

The final sums S3 and S4 for the MSBs are:
S4=[15,8]
$S3=(([15,8]+[15,4]^c)[15,12]^c)^c = [15,4][15,8]^c + [15,12]$ FIGS. 33B-33E shows the circuit diagrams for the LSBs. The result is the LSBs of the sum, S1={16,1} and S2={16,2}, which because X16=0 gives S1={15,1} and S2={15,2}. FIG. 33B shows one of the XOR group of twos, i.e., {2,2}=X1X2 and {2,1}=X1⊕X2. FIG. 33C shows one of the XOR group of fours, i.e., $\{4,1\}_0 = \{2,1\}_0 \oplus \{2,1\}_1$ and $\{4,2\}_0 = ((\{2,1\}_0\{2,1\}_1)^c(\{2,2\}_0 \oplus \{2,2\}_1)^c)^c$. FIG. 33D shows one of the XOR group of partial eights, i.e., $\{8,1\} = \{4,1\}_0 \oplus \{4,1\}_1$ and $P1 = (\{4,1\}_0\{4,1\}_1)^c$ and $P2 = \{4,2\}_0\{4,2\}_1$. FIG. 33E shows the final sums S1 and S2, i.e., $S1 = \{16,1\} = \{8,1\}_0 \oplus \{8,1\}_1$ and $S2 = \{16,2\} = ((P2_0 P2_1)^C (P1_0 \oplus P1_1)^C) \oplus (P2_0 \oplus P2_1)$.

A more detailed description of the compressor block 2640 of FIG. 26 and stages 2-4 (sub-arrays 3014, 3016, and 3018) of FIG. 30 is now given with reference to FIGS. 34, 35A and 35B.

FIG. 34 is a schematic of a [4,2] compressor. The [4,2] compressor receives five inputs, X1-X4 and CIN, and produces a representation of the ones in the inputs with sum (S) and two carry (C and COUT) outputs. The CIN and COUT are normally connected to adjacent [4,2] compressors. The [4,2] compressor 3410 is composed of two [3,2] counters, i.e., full adders, 3420 and 3422. The first full adder 3420 receives inputs X2, X3, and X4 and produces intermediary output 3432 and COUT. The second full adder 3422 receives inputs X1, intermediary output 3432, and CIN and produces outputs sum (S) and carry (C).

Referring back to FIG. 30, the [4,2] compressor 3028 may receive five inputs (X1-X4 and CIN) and produce three outputs (S, C, COUT). Similarly, the [3,2] compressor 3026 from FIG. 30 may receive four inputs (X1-X3 and CIN) and produce three outputs (S, C, COUT). Block 3412 of FIG. 34 corresponds to stage 2 (sub-array 3014) of FIG. 30. Block 3412 has four inputs X1-X4 (shown as four elements in a bit column in sub-array 3014 in FIG. 30) and produces a first intermediary output 3430, a second intermediary output 3432, and COUT. These two intermediary outputs and CIN are input into block 3414 of FIG. 34. Block 3414 corresponds to stage 3 (sub-array 3016) of FIG. 30. The two intermediary outputs 3430 and 3432 and CIN are added via full adder 3422 to produce a sum (S) bit and a Carry (C) bit out of block 3414. For the [3,2] compressor, block 3412 has inputs X1-X3 with input X4 being omitted. Block 3414 remains the same for the [3,2] compressor. The S and C bits produced by block 3414 are shown in stage 4 (sub-array 3018) of FIG. 30.

FIG. 35A shows four columns 3030 of FIG. 30 and how the outputs of some of the counters of stage 1 map to some of the compressors of stages 2 and 3. There are four [11,4] counters 3520, 3522, 3524, and 3526 having inputs from sub-array 3012 and bit columns 16-19 (labeled by 3030) of FIG. 30. FIG. 35A also shows four compressors 3540, 3542, 3544, and 3546 having inputs from sub-array 3014 and bit columns 16-19 of FIG. 30. Focusing on bit 19 and [4,2] compressor 3544, compressor 3544 receives as inputs: S4 from [11,4] counter 3520, S3 from counter 3522, S2 from [11,4] counter 3524, and S1 from [11,4] counter 3526.

FIG. 35B is a schematic that focuses on the [4,2] compressor of bit 19 of FIG. 35A. The reason S4 3560, S3 3562, S2 3564, and S1 3566 from counters 3520 (bit 16), 3522 (bit 17), 3524 (bit 18) and 3526 (bit 19), respectively are chosen as inputs into compressor 3544 is to align the counters input weights, so that they can be added together correctly. For example, S2 from bit 18 has the same weight as S1 from bit 19. These four bits 3560, 3562, 3564, and 3566 are added together in compressor 3544 along with a carry bit, CIN, 3570 from a compressor 3542 and the summation is output as a sum bit S 3580, a carry bit C 3582, and another carry bit COUT 3584 which is sent to compressor 3546. The four dotted boxes 3012, 3014, 3016, and 3018 represent the four sub-arrays in FIG. 30. The inputs in stage 1 are shown in the dotted circle 3558 and correspond to elements in bit column 18 in sub-array 3012 of FIG. 30. Inputs 3560, 3562, 3564, and 3566 correspond to elements s13, s12, s11, s10 in bit column 19 in sub-array 3014. Inputs CIN 3570, 3572, and 3574 correspond to elements s20, s30, and s31 in bit column 19 in sub-array 3016. The outputs S 3580 and C 3582 corresponds to elements s31 and s30 in bit column 19 and 20, respectively, in sub-array 3018.

With reference to FIG. 25, after PP1 2642 and PP2 2644 are stored in register bank 1730, PP2 (a signed and sign extended number) is sent via Y multiplexer 2610 to adder 1719 and PP1 (a unsigned and zero filled number) is sent via X multiplexer 2605 to adder 1719 to be added together. Zero is sent via Z multiplexer 2615 to adder 1719. In one embodiment of the present invention the outputs of the Z 2615, Y 2610, and X 2605 multiplexers are inverted.

FIG. 36 is a schematic of an expanded view of the adder 1719 of FIG. 25. The inputs of Z_b[0:47], Y_b[0:47], and X_b[0:47] are sent to a plurality of 1-bit full adders 3610. A subtract (SUB) input to each full adder 3610 indicates if a subtraction Z−(X+Y) should be done. The output of the 1-bit full adders 3610 are sum bits S[0:47] and Carry bits C[0:47], which are input into carry lookahead adder (CLA) 3620. The 48 bit summation result is then stored in register bank 1755.

When subtracting, the 1-bit full adder 3610 implements the equation $Z^c+(X+Y)$ which produces S and C for subtraction by inverting Z, i.e., $Z^c$. To produce the subtraction result the output of the CLA 3620 is inverted in XOR gate 3622 prior to being stored in register bank 1755.

FIG. 37 is a schematic of the 1-bit full adder 3610 of FIG. 36. The inverters 3710, 3712, 3714, 3716, and 3730 invert the 1-bit inputs X_b, Y_b, SUB, and Z_b. There are differential XOR gates 3726 and 3728 along with differential multiplexer 3740 which produces the carry bit (C) after inverter 3742. The two differential XOR gates 3722 and 3724 in block 3720 invert Z if there is a subtraction. XOR 3744 receives the outputs of XORs 3726 and 3728 and the outputs of block 3720 via inverters 3732 and 3734 to produce the 1-bit sum S after inverter 3746.

The carry-lookahead adder (CLA) 3620 in one embodiment receives the sum bits S[0:47] and Carry bits C[0:47] from the full adders 3610 in FIG. 36 and adds them together to produce a 48-bit sum, representing the product of the multiplication, to be stored in register bank 1755.

The carry-lookahead adder is a form of carry-propagate adder that to pre-computes the carry before the addition. Consider a CLA having inputs, e.g., a(n) and b(n), then the CLA uses a generate (G) signal and a propagate (P) signal to determine whether a carry-out will be generated. When G is high then the carry in for the next bit is high. When G is low then the carry in for the next bit depends in part on if P is high. The forgoing relationships can be easily seen by looking at the equations for a 1-bit carry lookahead adder:

G(n)=a(n) AND b(n)
P(n)=a(n) XOR b(n)
Carry(n+1)=G(n) OR(P(n) AND Carry(n))
Sum(n)=P(n) XOR Carry(n)
where n is the nth bit.

In general, for a conventional fast carry look ahead adder the generate function is given by:

$G_{n-1:0}=G_{n-1:m}+P_{n-1:m}G_{m-1:0}$
where $P_{n-1:m}=P_{n-1}P_{n-2}\ldots P_m$
where $p_i=a_i \oplus b_i$ In order to improve the efficiency of a conventional CLA, the generate function is decomposed as follows:

$G_{n-1:0}=D_{n-1:m}[B_{n-1:m}+G_{m-1:0}]$
where $D_{n-1:m}=G_{n-1:m+1}+P_{n-1}P_{n-2}\ldots P_m$
where $B_{n-1:m}=g_{n-1}+g_{n-2}+\ldots+g_m$
where $g_i=a_i b_i$ and $p_i=a_i \oplus b_i$
where $a_i$ and $b_i$ are the "ith" bit of each of the two 48-bit adder inputs Other decompositions for G are:
$G_{n-1:0}=G_{n1:m}+P_{n-1:m}G_{m-1:0}$
$G_{n-1:0}=D_{n-1:m}K_{n-1:0}$
$G_{n-1:0}=D_{n-1:m}[B_{n-1:i}+G_{i-1:k}+B_{k-1:m}+G_{m-1:0}]$
$G_{n-1:0}=D_{n-1:m}[B_{n-1:m}+G_{m-1:k}+P_{m-1:i}D_{i-1:j}P_{j-1:k}G_{k'-1:0}]$ An example of the new generate function $G_{4:0}$ for n=4 and m=2 is:

$G_{4:0}=g_4+p_4g_3+p_4p_3g_2+p_4p_3p_2g_1+p_4p_3p_2p_1g_0$
a.$=p_4[g_4+g_3+p_3g_2+p_3p_2g_1+p_3p_2p_1g_0]$ (since $g_ip_i=g_i$)
b.$=[g_4+p_4p_3][g_4+g_3+g_2+p_2g_1+p_2p_1g_0]$
c.$=[g_4+p_4g_3+p_4p_3p_2]([g_4+g_3+g_2]+[g_1+p_1g_0])$
d.$=[D_{4:2}]+([B_{4:2}]+[G_{1:0}])$ Using the new decomposition of G, we next define a K signal analogous to and a Q signal analogous to the P signal. The correspondence between functions and the K and Q functions are given in tables 8 and 9 below:

TABLE 8

| Base | Carry Look Ahead Generate (G) Function | K Function (Sub Generate) |
|---|---|---|
| 2 | $G_1 + P_1G_0$ | — |
| 3 | $G_2 + P_2G_1 + P_2P_1G_0$ | $K_2 + K_1 + Q_1K_0$ |
| 4 | $G_3 + P_3G_2 + P_3P_2G_1 + P_3P_2P_1G_0$ | $K_3 + K_2 + Q_2K_1 + Q_2Q_1K_0$ |
| 5 | $G_4 + P_4G_3 + P_4P_3G_2 + P_4P_3P_2G_1 + P_4P_3P_2P_1G_0$ | $K_4 + K_3 + K_2 + Q_2K_1 + Q_2Q_1K_0$ |

TABLE 9

| Base | Carry Look Ahead Generate (P) Function | Q Function (Hyper Propagate) |
|---|---|---|
| 2 | $P_1P_0$ | — |
| 3 | $P_2P_1P_0$ | $Q_2Q_1 (K_1 + Q_0)$ |
| 4 | $P_3P_2P_1P_0$ | $Q_3Q_2Q_1 (K_1 + Q_0)$ |
| 5 | $P_4P_3P_2P_1P_0$ | $Q_4Q_3Q_2 (K_2 + K_1Q_1 + Q_1Q_0)$ |

The K signal is related to the G signal by the following equation:

$K_{n-1:0}=B_{n-1:m}+G_{m-1:0}$

Assuming n−1>i>k>m>k'>m'>0, where n, i, k, m, k', m' are positive numbers, then:

$K_2=B_{n-1:i}+G_{i-1:k}$
$K_1=B_{k-1:m}+G_{m-1:k'}$
$K_0=B_{k'-1:m'}+G_{m'-1:0}$

The Q signal is related to the P signal by the following equation:

$Q_{n-1:0}=P_{n-1:m} \cdot D_{m-1:0}$ where D can be expressed as:

$D_{n-1:0}=G_{n-1:m}+P_{n-1:m}D_{m-1:0}$
$D_{n-1:0}=D_{n-1:m}[B_{n-1:m}+D_{m-1:0}]$

Hence, for example:

$Q_2 = P_{n-1:l} D_{i-1:k}$
$Q_1 = P_{k-1:m} D_{m-1:k'}$
$Q_0 = P_{k'-1:m} D_{m'-1:0}$

FIG. 38 is the structure for generation of K for every 4 bits. There are similar structures for Q and D. There are three types of K stages 4130 (two inputs), 4140 (three inputs) and 4150 (four inputs). There is a pass though stage 4142. The area 4112 shows the inputs 0-43 into the structure 4110 (inputs 44-47 are not needed). There are four levels of the tree 4120 (base 2), 4122 (base 4), 4124 (base 3), and 4126 (base 2) to calculate K.

FIG. 39 shows the logic functions associated with each type of K (and Q) stage. K, Q stage 4130 has logic functions shown in block 4154. K, Q stage 4140 has logic functions shown in block 4156. K, Q stage 4150 has logic functions shown in block 4158.

The final sum for the 48-bit CLA 3620 is given by:

$$S_n = a_n \oplus b_n \oplus G_{n-1:0}$$

$n = 4, 8, 12 \ldots$ or 44 where $G_{n-1:0} = D_{n-1:m} K_{n-1:0}$ where $S_{n+d+1} = a_{n+d+1} \oplus b_{n+d+1} \oplus G_{n+d:0}$ $d = 0, 1$ or 2 where $$\begin{aligned} G_{n+d:0} &= G_{n+d:n} + P_{n+d:n} G_{n-1:0} \\ &= G_{n+d:n} + P_{n+d:n} D_{n-1:m} K_{n-1:0} \\ &= K_{n-1:0}[G_{n+d:n} + P_{n+d:n} D_{n-1:m}] + \sim K_{n-1:0} G_{n+d:n} \\ &= K_{n-1:0}[D_{n-1:m}(G_{n+d:n} + P_{n+d:n}) + \\ &\quad \sim D_{n-1:m} G_{n+d:n}] + \sim K_{n-1:0} G_{n+d:n} \\ &= K_{n-1:0}[D_{n-1:m} D_{n+d:n} + \sim D_{n-1:m} G_{n+d:n}] + \\ &\quad \sim K_{n-1:0} G_{n+d:n} \end{aligned}$$

FIG. 40 is an expanded view of an example of the CLA 3620 of FIG. 36. The example CLA 3620 has a plurality of 4-bit adders, 3708-3712 connected to a plurality of 4-bit multiplexers 3720-3724. The first 4-bit adder 3708 adds S[0:3] to C[0:3] with a 0 carry-in bit and produces a 4-bit output which then becomes part of the 48-bit adder output sent to 1755. The next four sum and carry bits, i.e., S[4:7] and C[4:7], are input concurrently to two 4-bit adders 3710 and 3712, which add in parallel. Adder 3710 has a 0 carry in and adder 3712 has a 1 carry in. Multiplexer 3720 selects which 4-bit output of adder 3710 or 3712 to use depending on the value of $G_{3:0}$. $G_{3:0}$ is used, because from the formula for $S_n = a_n \oplus b_n \oplus G_{n-1:0}$ where n=4, 8, 12 . . . or 44, $S_4 = a_4 \oplus b_4 \oplus G_{3:0}$ where $a_4 = S[4]$, $b_4 = C[4]$, when $G_{3:0} = 1$ then adder 3712 is selected and when $G_{3:0} = 0$ adder 3710 is selected. The other [5:7] sum bits output out of 3710 and 3712 are given by $S_{n+d+1} = a_{n+d+1} \oplus b_{n+d+1} \oplus G_{n+d:0}$, with d=0, 1 or 2. Hence $S_5 = a_5 \oplus b_5 \oplus G_{4:0}$, where $S[5] = a_5$ and $C[5] = b_5$, $S_6 = S[6] \oplus C[6] \oplus G_{5:0}$ and $S_7 = S[7] \oplus C[7] \oplus G_{6:0}$. As can be seen from the $G_{43:0}$ selection signal into multiplexer 3724 the efficient calculation of $G_{43:0}$ using $G_{43:0} = D_{43:m} K_{43:0}$ substantially improves the speed of CLA 3620, where $K_{43:0}$ is the K value at node 4128 in FIG. 38.

FIG. 40 illustrates that in a CLA the carry-out from adding two 4-bit numbers is not sent to the next stage. For example, the carry-out of adding S[4:7] and C[4:7] is not sent as a carry-in to the stage adding S[8:11] and C[8:11].

Adder designs, including the CLA and the full adders shown in FIGS. 36-40 and counter and compressor designs, including those shown in FIGS. 31-35B, for use in some embodiments are available from Arithmatica Inc. of Redwood City, Calif. The following documents detail some aspects of adder/subtractor, counter, compressor, and multiplier circuits available from Arithmatica, and are incorporated herein by reference: UK Patent Publication GB 2,373,883; UK Patent Publication GB 2383435; UK Patent Publication GB 2365636; U.S. Patent Application Pub. No. 2002/0138538; and U.S. Patent Application Pub. No. 2003/0140077.

FIG. 41 depicts a pipelined, eight-tap FIR filter 4100 to illustrate the ease with which DSP slices and tiles disclosed herein scale to create more complex filter organizations. Filter 4100 includes a pair of four-tap FIR filters 1200A and 1200B similar to filter 1200 of FIG. 12A. An additional DSP tile 4110 combines the outputs of filters 1200A and 1200B to provide a filtered output Y7(N–6). Four additional registers 3005 are included from outside the DSP tiles, from nearby configurable logic blocks, for example. The connections Y3A (N–4) and Y3B(N–4) between filters 1200A and 1220B and tile 4110 is made via the general interconnect.

While the present invention has been described in connection with specific embodiments, variations of these embodiments will be obvious to those of ordinary skill in the art. Therefore, the spirit and scope of the appended claims should not be limited to the foregoing description.

What is claimed is:
1. An integrated circuit comprising:
a plurality of configurable blocks;
configurable interconnect resources programmably interconnecting the plurality of configurable blocks;
a dedicated signal line that is non-programmable;
a plurality of configurable digital signal processing (DSP) elements each having an adder/subtractor circuit, the plurality of DSP elements including a first DSP element and a second DSP element, the second DSP element including:
a product generator having an output port;
an element output port;
a register coupled between an output of the adder/subtractor circuit and the element output port; and
multiplexing circuitry having:
a feedback port connected to the element output port;
a cascade input port connected to a first end of the dedicated signal line, wherein a second end of the dedicated signal line is connected to an element output port of the first DSP element;
a product generator port;
a multiplexing-circuitry output port coupled to the adder/subtractor circuit of the second DSP element; and
a select port receiving mode control signals;
wherein the multiplexing circuitry connects at least one of the feedback port and the cascade input port to the multiplexing-circuitry output port in response to the mode control signals, and wherein the multiplexing circuitry comprises a first multiplexer which enables the coupling of either the product generator port or the feedback port to a first addend port of the adder/subtractor circuit and a second multiplexer which enables the coupling of either the feedback port and the cascade input port to a second addend port of the adder/subtractor circuit, and wherein data output by the adder/subtractor circuit and stored in the register may be coupled to the first addend port of the adder/subtractor circuit and the second addend port of the adder/subtractor circuit.

2. The integrated circuit of claim 1, wherein the select port receives a plurality of sets of the mode control signals, wherein a first set of the plurality of sets is received at a different time than a second set of the plurality of sets.

3. The integrated circuit of claim 1, wherein a first set of the mode control signals connects the feedback port to the multiplexing-circuitry output port and a second set of the mode control signals connects the cascade input port to the multiplexing-circuitry output port.

4. The integrated circuit of claim 1, wherein the element output port of the second DSP element programmably connects to the interconnect resources.

5. The integrated circuit of claim 1, wherein each DSP element further includes at least one operand input port programmably connected to the interconnect resources.

6. A programmable device comprising:
a plurality of configurable blocks;
configurable interconnect resources connecting some of the plurality of configurable blocks;
a plurality of configurable DSP slices each having an adder/subtractor circuit, the plurality of DSP slices including a first DSP slice and a second DSP slice, the second DSP slice comprising:
a product generator having an output port;
a slice output port;
a register coupled between an output of the adder/subtractor circuit and the slice output port; and
multiplexing circuitry comprising:
a feedback port connected to the slice output port;
a cascade input port connected to a slice output port of the first DSP slice;
a product generator port;
a multiplexing-circuitry output port coupled to the adder/subtractor circuit of the second DSP slice; and
a select port receiving mode control signals; and
wherein the first DSP slice performs an arithmetic operation in response to the mode control signals, and wherein the multiplexing circuitry comprises a first multiplexer which enables the coupling of either the product generator port or the feedback port to a first addend port of the adder/subtractor circuit and a second multiplexer which enables the coupling of either the feedback port and the cascade input port to a second addend port of the adder/subtractor circuit, and wherein data output by the adder/subtractor circuit and stored in the register may be coupled to the first addend port of the adder/subtractor circuit and the second addend port of the adder/subtractor circuit.

7. The programmable device of claim 6, wherein the select port receives a plurality of sets of the mode control signals.

8. The programmable device of claim 7, wherein a first set of the mode control signals connects the feedback port to the multiplexing-circuitry output port and a second set of the mode control signals connects the cascade input port to the multiplexing-circuitry output port.

9. The programmable device of claim 6, wherein the arithmetic operation is selected from the group consisting of multiply, add or subtract, feedback add or subtract, multiply accumulate, shift out, shift feedback, and output cascade.

10. The programmable device of claim 6, the second DSP slice further comprising a mode-control-signal register connected to the select port and receiving the mode control signals.

11. The programmable device of claim 10, wherein the second DSP slice further comprises a mode-control-signal multiplexer selectively bypassing the mode-control-signal register.

12. The programmable device of claim 6, further comprising a state machine issuing the mode control signals.

13. The programmable device of claim 12, wherein the state machine includes a microcontroller or a microprocessor.

14. The programmable device of claim 6 adapted to multiply a first complex number by a second complex number to obtain a complex product, wherein the first complex number includes a first real part and a first imaginary part, the second complex number includes a second real part and a second imaginary part, and the complex product includes a third real part and a third imaginary part.

15. The programmable device of claim 6:
wherein the first DSP includes a first operand input port receiving a first real part and a second operand input port receiving a second real part, the first DSP slice multiplying the first and second real parts in response to a first set of the mode control signals to obtain a first real result;
wherein the second DSP slice further includes a first operand input port receiving a first imaginary part and a second operand input port receiving a second imaginary part, the second DSP slice multiplying the first and second imaginary parts in response to a second set of the mode control signals to obtain a second real result;
wherein the plurality of configurable DSP slices further comprises:
a third DSP slice having a first operand input port receiving the first real part and a second operand input port receiving the second imaginary part, the third DSP slice multiplying the first real part and the second imaginary part in response to a third set of the mode control signals to obtain a first imaginary result; and
a fourth DSP slice having a first operand input port receiving the first imaginary part and a second operand input port receiving the second real part, the fourth DSP slice multiplying the first imaginary part by the second real part in response to a fourth set of the mode control signals to obtain a second imaginary result.

16. The programmable device of claim 15, wherein the second DSP slice subtracts the second real result from first real result, and wherein the fourth DSP slice adds the first and second imaginary results.

* * * * *